US012777780B2

(12) United States Patent
Choi

(10) Patent No.: US 12,777,780 B2
(45) Date of Patent: Oct. 27, 2026

(54) ELECTRONIC DEVICE

(71) Applicant: Samsung Display Co., Ltd., Yongin-si (KR)

(72) Inventor: Kyung Hyun Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 546 days.

(21) Appl. No.: 18/456,799

(22) Filed: Aug. 28, 2023

(65) Prior Publication Data

US 2024/0074246 A1 Feb. 29, 2024

(30) Foreign Application Priority Data

Aug. 29, 2022 (KR) ........................ 10-2022-0108097

(51) Int. Cl.

| | |
|---|---|
| ***H10K 59/122*** | (2023.01) |
| ***G06F 1/16*** | (2006.01) |
| ***H04M 1/02*** | (2006.01) |
| ***H10K 59/121*** | (2023.01) |
| ***H10K 59/80*** | (2023.01) |
| ***H10K 102/00*** | (2023.01) |

(52) U.S. Cl.

CPC ......... *H10K 59/122* (2023.02); *G06F 1/1616* (2013.01); *H04M 1/0216* (2013.01); *H10K 59/1213* (2023.02); *H10K 59/873* (2023.02); *H10K 2102/311* (2023.02)

(58) Field of Classification Search

CPC ............. H10K 59/122; H10K 59/1213; H10K 59/873; H10K 2102/311; G06F 1/1616; H04M 1/0216

See application file for complete search history.

(56) References Cited

U.S. PATENT DOCUMENTS

| | | | | |
|---|---|---|---|---|
| 2010/0133993 A1* | 6/2010 | Pang | .................... | H10K 59/126 445/24 |
| 2021/0202626 A1* | 7/2021 | Jeon | ..................... | H10K 59/805 |
| 2021/0288119 A1 | 9/2021 | Hong et al. | | |

FOREIGN PATENT DOCUMENTS

| | | |
|---|---|---|
| CN | 111785741 | 10/2020 |
| KR | 10-2021-0114595 | 9/2021 |

* cited by examiner

*Primary Examiner* — Mary Ellen Bowman

(74) *Attorney, Agent, or Firm* — Harness, Dickey & Pierce, P.L.C.

(57) ABSTRACT

An electronic device includes a display panel including a first region including a transmissive region and an element region and a second region spaced apart from the first region. The display panel includes a base layer, a circuit layer that is disposed on the base layer and that includes a pixel circuit and a barrier wall disposed in the element region, an element layer that is disposed on the circuit layer and that includes a plurality of light emitting elements and a pixel defining film, and an encapsulation layer disposed on the element layer. The pixel defining film includes a pixel defining pattern disposed in the element region and a pixel defining layer disposed in the second region, and a side surface of the pixel defining pattern is in contact with a side surface of the barrier wall.

20 Claims, 25 Drawing Sheets

ELECTRONIC DEVICE

CROSS-REFERENCE TO RELATED APPLICATIONS

This application claims priority under 35 U.S.C. § 119 to Korean Patent Application No. 10-2022-0108097 filed on Aug. 29, 2022, in the Korean Intellectual Property Office, the disclosure of which is incorporated by reference herein in its entirety.

BACKGROUND

1. Technical Field

Embodiments of the disclosure described herein relate to an electronic device including a display panel having improved product reliability.

2. Description of the Related Art

An electronic device may be a device constituted by various electronic components such as a display panel, an electronic module, and the like. The electronic module may include a camera, an infrared sensor, a proximity sensor, or the like. The electronic module may be disposed under the display panel. One partial region of the display panel may have a higher transmittance than another partial region of the display panel. The electronic module may receive an external input through the one partial region of the display panel, or may provide an output through the one partial region of the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure provide an electronic device including a display panel having improved product reliability.

According to an embodiment, an electronic device includes a display panel including a first region and a second region spaced apart from the first region, the first region including a transmissive region and an element region. The display panel includes a base layer, a circuit layer that is disposed on the base layer and that includes a pixel circuit and a barrier wall disposed in the element region, an element layer that is disposed on the circuit layer and that includes a plurality of light emitting elements and a pixel defining film, and an encapsulation layer disposed on the element layer. The pixel defining film includes a pixel defining pattern disposed in the element region and a pixel defining layer disposed in the second region, and a side surface of the pixel defining pattern is in contact with a side surface of the barrier wall.

The circuit layer may further include a plurality of organic layers. The plurality of organic layers may include a first organic layer disposed in the transmissive region and the element region, and the barrier wall may be disposed on the first organic layer.

The plurality of organic layers may further include a second organic layer disposed on the first organic layer and a third organic layer disposed on the second organic layer, and the barrier wall may be in contact with the second organic layer and may be spaced apart from the third organic layer.

The pixel defining pattern may be disposed on the third organic layer and may extend toward the barrier wall.

The pixel defining pattern may be i7n contact with an upper surface of the third organic layer, a side surface of the third organic layer, an upper surface of the second organic layer, and the side surface of the barrier wall.

A height of the barrier wall may be greater than a thickness of the second organic layer.

A height of the barrier wall may be greater than a sum of a thickness of the second organic layer and a thickness of the third organic layer.

The barrier wall may completely surround the pixel defining pattern in a plan view.

In a plan view, the barrier wall may include a plurality of barrier wall portions spaced apart from each other, and the plurality of barrier wall portions may be arranged adjacent to the pixel defining pattern.

The plurality of barrier wall portions may include a first barrier wall portion, a second barrier wall portion, a third barrier wall portion, and a fourth barrier wall portion. The first barrier wall portion and the third barrier wall portion may face each other with the pixel defining pattern between the first barrier wall portion and the third barrier wall portion, and the second barrier wall portion and the fourth barrier wall portion may face each other with the pixel defining pattern between the second barrier wall portion and the fourth barrier wall portion.

The plurality of barrier wall portions may further include first bridge barrier wall portions, second bridge barrier wall portions, third bridge barrier wall portions, and fourth bridge barrier wall portions. The first bridge barrier wall portions may extend from the first barrier wall portion and the second barrier wall portion in a direction away from the element region. The second bridge barrier wall portions may extend from the second barrier wall portion and the third barrier wall portion in a direction away from the element region. The third bridge barrier wall portions may extend from the third barrier wall portion and the fourth barrier wall portion in a direction away from the element region. The fourth bridge barrier wall portions may extend from the fourth barrier wall portion and the first barrier wall portion in a direction away from the element region.

The plurality of barrier wall portions may include a first barrier wall portion, a second barrier wall portion, a third barrier wall portion, a fourth barrier wall portion, a fifth barrier wall portion, a sixth barrier wall portion, and a seventh barrier wall portion. The first and second barrier wall portions and the fifth and sixth barrier wall portions may face each other with the pixel defining pattern between the first and second barrier wall portions and the fifth and sixth barrier wall portions, and the third and fourth barrier wall portions and the seventh barrier wall portion may face each other with the pixel defining pattern between the third and fourth barrier wall portions and the seventh barrier wall portion.

A length of the seventh barrier wall portion may be longer than each of lengths of the first to sixth barrier wall portions.

A first opening, a second opening, and a third opening may be defined in the pixel defining pattern. The first opening may be adjacent to the second barrier wall portion and the third barrier wall portion, the second opening may be adjacent to the fourth barrier wall portion and the fifth barrier wall portion, and the third opening may face the first barrier wall portion, the sixth barrier wall portion, and the seventh barrier wall portion. A width of the third opening parallel to an extension direction of the seventh barrier wall portion may be greater than a width of the first opening parallel to the extension direction and a width of the second opening parallel to the extension direction.

The plurality of barrier wall portions may further include an eighth barrier wall portion, and the third and fourth barrier wall portions and the seventh and eighth barrier wall portions may face each other with the pixel defining pattern between the third and fourth barrier wall portions and the seventh and eighth barrier wall portions.

According to an embodiment, an electronic device includes a base layer, a first organic layer disposed on the base layer, a barrier wall disposed on the first organic layer, a second organic layer disposed on the first organic layer, a third organic layer disposed on the second organic layer, and a pixel defining pattern that is disposed on the third organic layer and extends toward the barrier wall and makes contact with the barrier wall.

The pixel defining pattern may be in contact with an upper surface of the third organic layer, a side surface of the third organic layer, an upper surface of the second organic layer, and a side surface of the barrier wall, and the side surface of the third organic layer may be spaced apart from the barrier wall.

A height of the barrier wall may be greater than a thickness of the second organic layer.

The barrier wall may completely surround the pixel defining pattern in a plan view.

In a plan view, the barrier wall may include a plurality of barrier wall portions spaced apart from each other, and the plurality of barrier wall portions may be arranged adjacent to the pixel defining pattern.

BRIEF DESCRIPTION OF THE DRAWINGS

The above and other aspects and features of the disclosure will become more apparent by describing in detail embodiments thereof with reference to the attached drawings in which.

DETAILED DESCRIPTION OF THE EMBODIMENTS

Figure 1A:
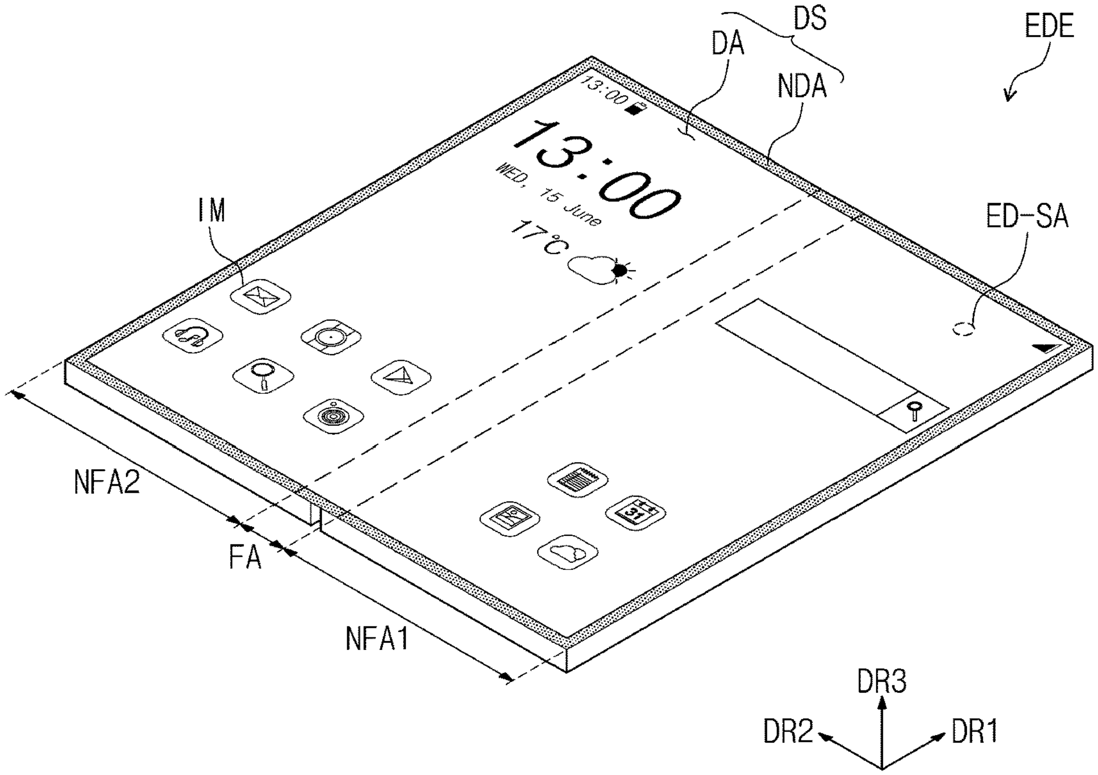
FIGS. 1A and 1B are perspective views of an electronic device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the drawings, sizes, thicknesses, ratios, and dimensions of the elements may be exaggerated for ease of description and for clarity. Like numbers and/or reference characters refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

As used herein, the singular forms, "a," "an," and "the" are intended to include the plural forms as well, unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In case that an element is referred to as being "in contact" or "contacted" or the like to another element, the element may be in "electrical contact" or in "physical contact" with another element; or in "indirect contact" or in "direct contact" with another element.

A description that a component is "configured to" perform a specified operation may be defined as a case where the component is constructed and arranged with structural features that can cause the component to perform the specified operation.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. The term "overlap" also may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments of the disclosure will be described with reference to the accompanying drawings.

Figure 1B:
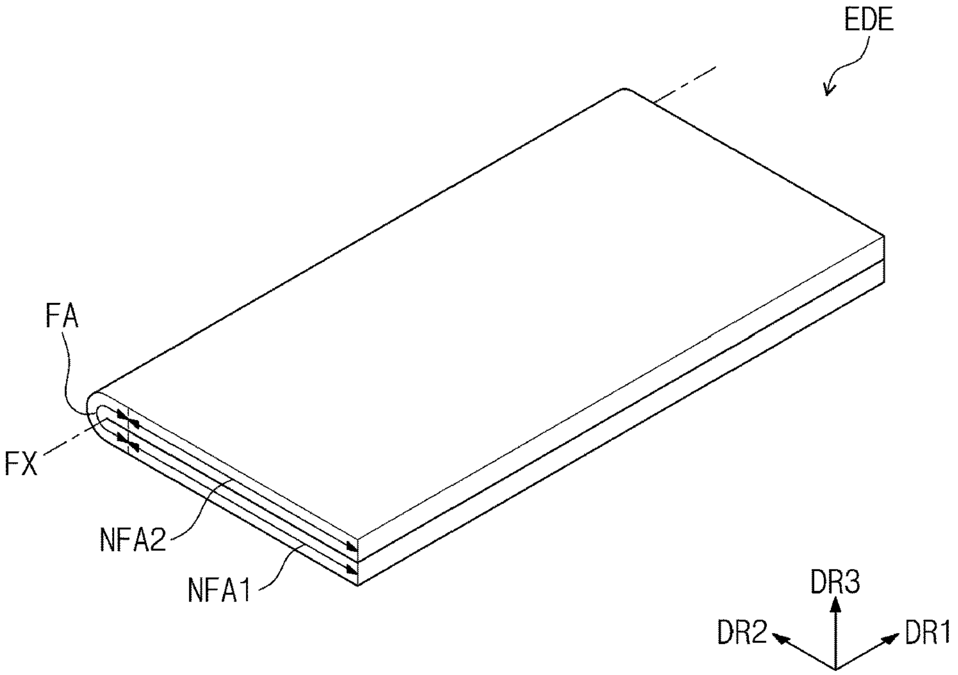

FIGS. 1A and 1B are perspective views of an electronic device EDE according to an embodiment of the disclosure. FIG. 1A illustrates a flat state (or, an unfolded state) of the electronic device EDE, and FIG. 1B illustrates a folded state of the electronic device EDE.

Referring to FIGS. 1A and 1B, the electronic device EDE according to an embodiment of the disclosure may include a display surface DS defined by a first direction DR1 and a second direction DR2 crossing the first direction DR1. The electronic device EDE may provide an image IM to a user through the display surface DS.

The display surface DS may include a display region DA and a non-display region NDA around the display region DA. The display region DA may display the image IM, and the non-display region NDA may not display the image IM. The non-display region NDA may surround the display region DA. However, without being limited thereto, the shape of the display region DA and the shape of the non-display region NDA may be modified.

Hereinafter, a direction substantially perpendicular to a plane defined by the first direction DR1 and the second direction DR2 is defined as a third direction DR3. Furthermore, the expression "in a plan view" used herein may mean that an object is viewed in the third direction DR3 from the top. The phrase "in a schematic cross-sectional view" means viewing a cross-section in the first direction DR1 of which the object is vertically cut from the side.

A sensor region ED-SA may be defined in the display region DA of the electronic device EDE. Although one sensor region ED-SA is illustrated in FIG. 1A as an example, the number of sensor regions ED-SA is not limited thereto. The sensor region ED-SA may be a portion of the display region DA. Accordingly, the electronic device EDE may display an image through the senor region ED-SA.

An electronic module may be disposed in a region overlapping the sensor region ED-SA. The electronic module may receive an external input transferred through the sensor region ED-SA, or may provide an output through the sensor region ED-SA. For example, the electronic module may be a camera module, a sensor that measures a distance, such as a proximity sensor, a sensor that recognizes a part of the user's body (e.g., a fingerprint, an iris, or a face), or a small lamp that outputs light. However, the disclosure is not limited thereto. Hereinafter, it will be exemplified that the electronic module overlapping the sensor region ED-SA may be a camera module.

The electronic device EDE may include a folding region FA and non-folding regions NFA1 and NFA2. The non-folding regions NFA1 and NFA2 may include the first non-folding region NFA1 and the second non-folding region NFA2. The folding region FA may be disposed between the first non-folding region NFA1 and the second non-folding region NFA 2. The folding region FA may be referred to as a foldable region, and the first and second non-folding regions NFA1 and NFA 2 may be referred to as first and second non-foldable regions.

As illustrated in FIG. 1B, the folding region FA may be folded about a folding axis FX parallel to the first direction DR1. The folding region FA has a predetermined or selectable curvature and a predetermined or selectable radius of curvature in the folded state of the electronic device EDE. The electronic device EDE may be folded inward such that the first non-folding region NFA1 and the second non-folding region NFA 2 face each other and the display surface DS is not exposed to the outside.

In an embodiment of the disclosure, the electronic device EDE may be folded outward such that the display surface DS may be exposed to the outside. In an embodiment of the disclosure, the electronic device EDE may be folded inward or outward in the flat state. However, the disclosure is not limited thereto. In an embodiment of the disclosure, the electronic device EDE may be configured to select one of an unfolding motion, an in-folding motion, and an out-folding motion. In an embodiment of the disclosure, folding axes may be defined in the electronic device EDE, and the electronic device EDE may be folded inward or outward about the folding axes in the flat state.

Although the foldable electronic device EDE has been described as an example with reference to FIGS. 1A and 1B, applications of the disclosure are not limited to the foldable electronic device EDE. For example, the disclosure may be applied to a rigid electronic device, for example, an electronic device not including the folding region FA.

Figure 2A:
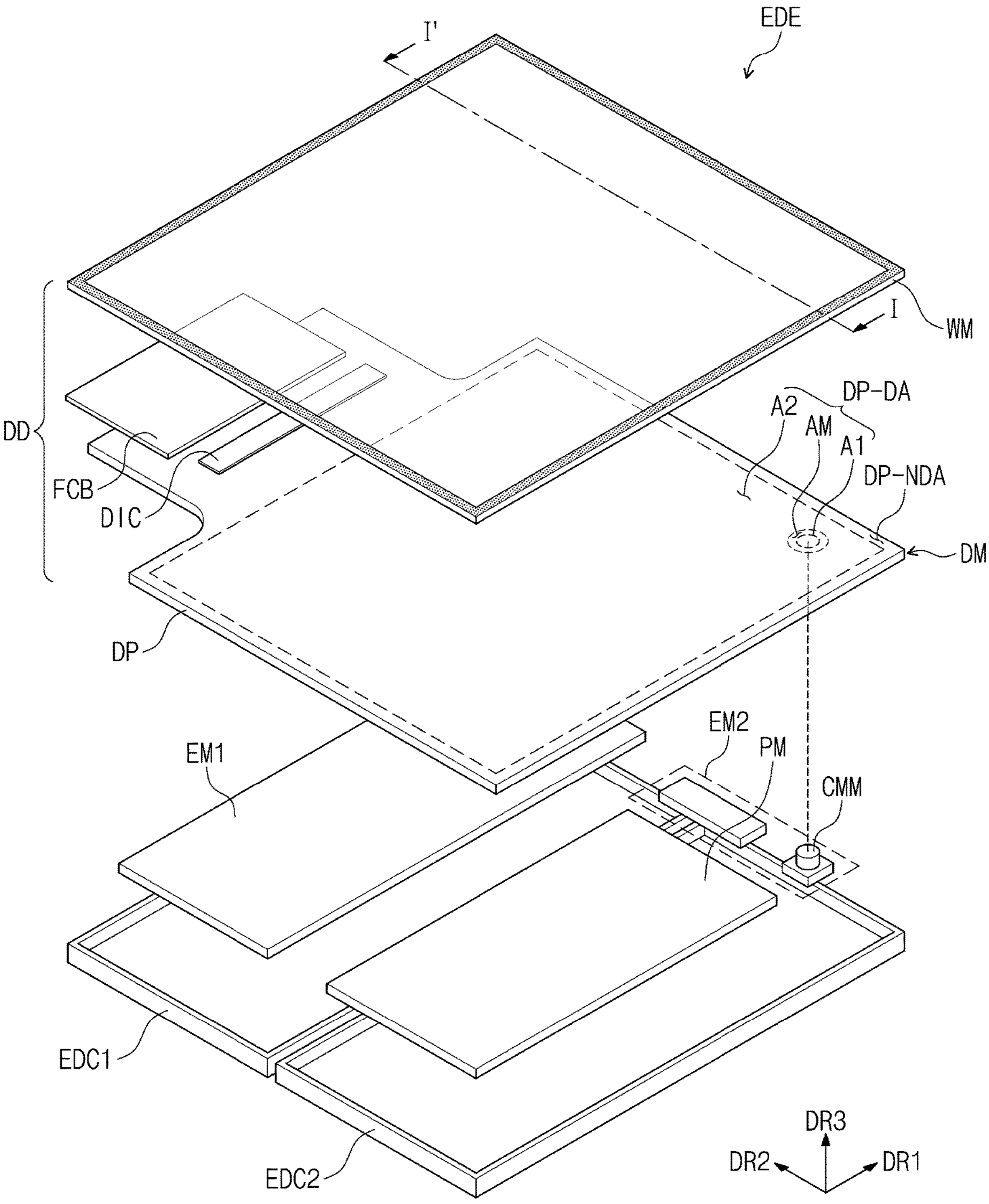
FIG. 2A is an exploded perspective view of the electronic device according to an embodiment of the disclosure.
Figure 2B:
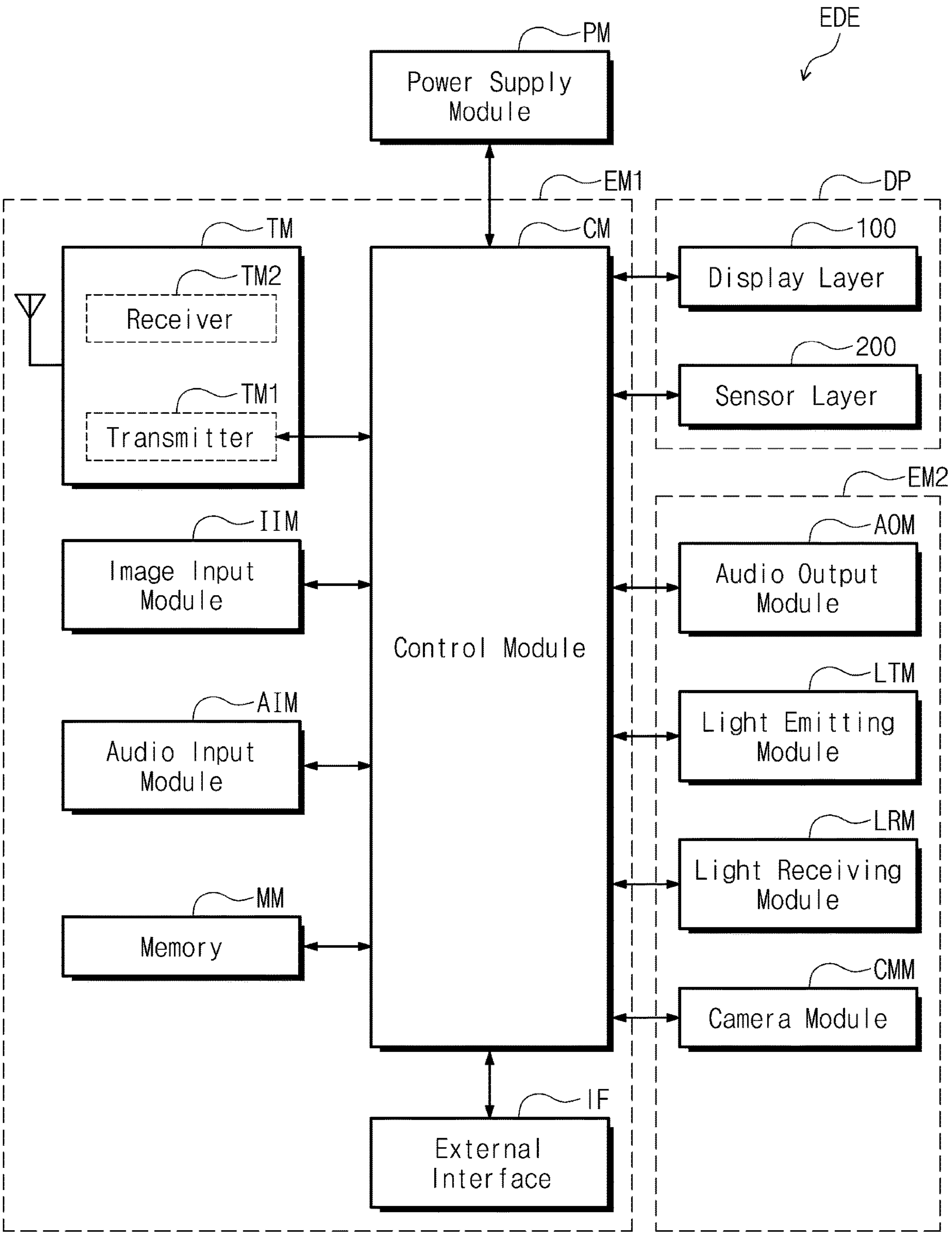
FIG. 2B is a block diagram of the electronic device according to an embodiment of the disclosure.

FIG. 2A is an exploded perspective view of the electronic device EDE according to an embodiment of the disclosure. FIG. 2B is a block diagram of the electronic device EDE according to an embodiment of the disclosure.

Referring to FIGS. 2A and 2B, the electronic device EDE may include a display device DD, a first electronic module EM1, a second electronic module EM2, a power supply module PM, and housings EDC1 and EDC2. The electronic device EDE may further include a mechanical structure for controlling a folding motion of the display device DD.

The display device DD includes a window module WM and a display module DM. The window module WM provides a front surface of the electronic device EDE. The display module DM may include at least a display panel DP. The display module DM generates an image and detects an external input.

In FIG. 2A, the display module DM is illustrated as being the same as the display panel DP. However, the display module DM may substantially be a stacked structure in which components including the display panel DP may be stacked each other. The stacked structure of the display module DM will be described below in detail.

The display panel DP includes a display region DP-DA and a non-display region DP-NDA that correspond to the display region DA (refer to FIG. 1A) and the non-display region NDA (refer to FIG. 1A) of the electronic device EDE. The expression "one region/portion corresponds to another region/portion" used herein means that the regions/portions overlap each other and is not limited to having the same area.

The display region DP-DA may include a first region A1, a second region A2, and an intermediate region AM. The second region A2 may be spaced apart from the first region A1, and the intermediate region AM may be defined between the first region A1 and the second region A2.

The first region A1 may overlap, or correspond to, the sensor region ED-SA (refer to FIG. 1A) of the electronic device EDE. Although the first region A1 is illustrated in a circular shape, the first region A1 may have various shapes, such as a polygonal shape, an oval shape, a shape having at least one curved side, or an irregular shape, and is not limited to any one embodiment.

The first region A1 may be referred to as a component region, and the second region A2 may be referred to as a main display region or a normal display region. The first region A1 may have a higher transmittance than the second region A2. In other embodiments, the first region A1 may have a lower resolution than the second region A2. However, the disclosure is not limited thereto. For example, the first region A1 may have a higher transmittance than the second region A2, but may have substantially the same resolution as the second region A2. The first region A1 may overlap a camera module CMM to be described below. The arrangement density of pixels disposed in the first region A1 may be lower than the arrangement density of pixels disposed in the second region A2.

One pixel disposed in the intermediate region AM may include emissive regions. A copy light emitting element not including a pixel circuit may be provided in the intermediate region AM in which due to space limitation, it may be difficult to place a pixel circuit, and thus the boundary between the first region A1 and the second region A2 may not appear dark. Accordingly, the visibility of the boundary between the first region A1 and the second region A2 having different pixel arrangement densities may be decreased by the intermediate region AM.

The display panel DP may include a display layer 100 and a sensor layer 200.

The display layer 100 may be a component that substantially generates an image. The display layer 100 may be an emissive display layer. For example, the display layer 100 may be an organic light emitting display layer, an inorganic light emitting display layer, an organic-inorganic light emitting display layer, a quantum-dot display layer, a micro-LED display layer, or a nano-LED display layer.

The sensor layer 200 may sense an external input applied from the outside. The external input may be an input of the user. The input of the user may include various types of external inputs such as a part of the user's body, light, heat, a pen, or pressure.

The display module DM may include a driver IC DIC disposed on the non-display region DP-NDA. The display module DM may further include a flexible circuit film FCB directly coupled to the non-display region DP-NDA.

The driver IC DIC may include drive elements (e.g., a data drive circuit) for driving the pixels of the display panel DP. Although FIG. 2A illustrates a structure in which the driver IC DIC is mounted on the display panel DP, the disclosure is not limited thereto. For example, the driver IC DIC may be mounted on the flexible circuit film FCB.

The power supply module PM supplies power required for overall operation of the electronic device EDE. The power supply module PM may include a conventional battery module.

The first electronic module EM1 and the second electronic module EM2 include various functional modules for operating the electronic device EDE. The first electronic module EM1 and the second electronic module EM2 may be directly mounted on a mother board electrically connected with the display panel DP, or may be mounted on separate substrates and may be electrically connected to the mother board through connectors (not illustrated).

The first electronic module EM1 may include a control module CM, a wireless communication module TM, an image input module IIM, an audio input module AIM, a memory MM, and an external interface IF.

The control module CM controls overall operation of the electronic device EDE. The control module CM may be a microprocessor. For example, the control module CM activates or deactivates the display panel DP. The control module CM may control other modules, such as the image input module IIM or the audio input module AIM, based on a touch signal received from the display panel DP.

The wireless communication module TM may communicate with an external electronic device through a first network (e.g., a short-range communication network such as Bluetooth, WiFi direct, or infrared data association (IrDA)) or a second network (e.g., a long-range communication network such as a cellular network, Internet, or a computer network (e.g., LAN or WAN)). Communication modules included in the wireless communication module TM may be integrated into one component (e.g., a single chip), or may be implemented as components (e.g., chips) separated from one another. The wireless communication module TM may transmit or receive audio signals using a general communication line. The wireless communication module TM may include a transmitter TM1 that modulates a signal to be transmitted and transmits the modulated signal and a receiver TM2 that demodulates a received signal.

The image input module IIM processes an image signal to covert the image signal into image data that can be displayed on the display panel DP. The audio input module AIM receives an external audio signal through a microphone in a voice recording mode or a voice recognition mode and converts the external audio signal into electrical voice data.

The external interface IF may include a connector capable of physically connecting the electronic device EDE and an external electronic device. For example, the external interface IF serves as an interface between the control module CM and external devices, such as an external charger, a wired or wireless data port, a card (e.g., a memory card and a SIM or UIM card), etc.

The second electronic module EM2 may include an audio output module AOM, a light emitting module LTM, a light receiving module LRM, and the camera module CMM. The audio output module AOM converts audio data received from the wireless communication module TM or audio data stored in the memory MM and outputs the converted data to the outside.

The light emitting module LTM generates and outputs light. The light emitting module LTM may output infrared light. The light emitting module LTM may include an LED element. The light receiving module LRM may sense infrared light. The light receiving module LRM may be activated in case that infrared light above a predetermined or selectable level is sensed. The light receiving module LRM may include a CMOS sensor. Infrared light generated by the light emitting module LTM may be reflected by an external object (e.g., the user's finger or face) after output, and the reflected infrared light may be incident on the light receiving module LRM.

The camera module CMM may take a still image and a video. Multiple camera modules CMM may be provided. A part of the camera modules CMM may overlap the first region A1. An external input (e.g., light) may be provided to the camera module CMM through the first region A1. For example, the camera module CMM may take an external image by receiving natural light through the first region A1.

The housings EDC1 and EDC2 accommodate the display module DM, the first and second electronic modules EM1 and EM2, and the power supply module PM. The housings EDC1 and EDC2 protect components, such as the display module DM, the first and second electronic modules EM1 and EM2, and the power supply module PM, which may be accommodated in the housings EDC1 and EDC2. Although the two housings EDC1 and EDC2 separated from each other are illustrated in FIG. 2A as an example, the disclosure is not limited thereto. Although not illustrated, the electronic device EDE may further include a hinge structure for connecting the two housings EDC1 and EDC2. The housings EDC1 and EDC2 may be coupled with the window module WM.

Figure 3:
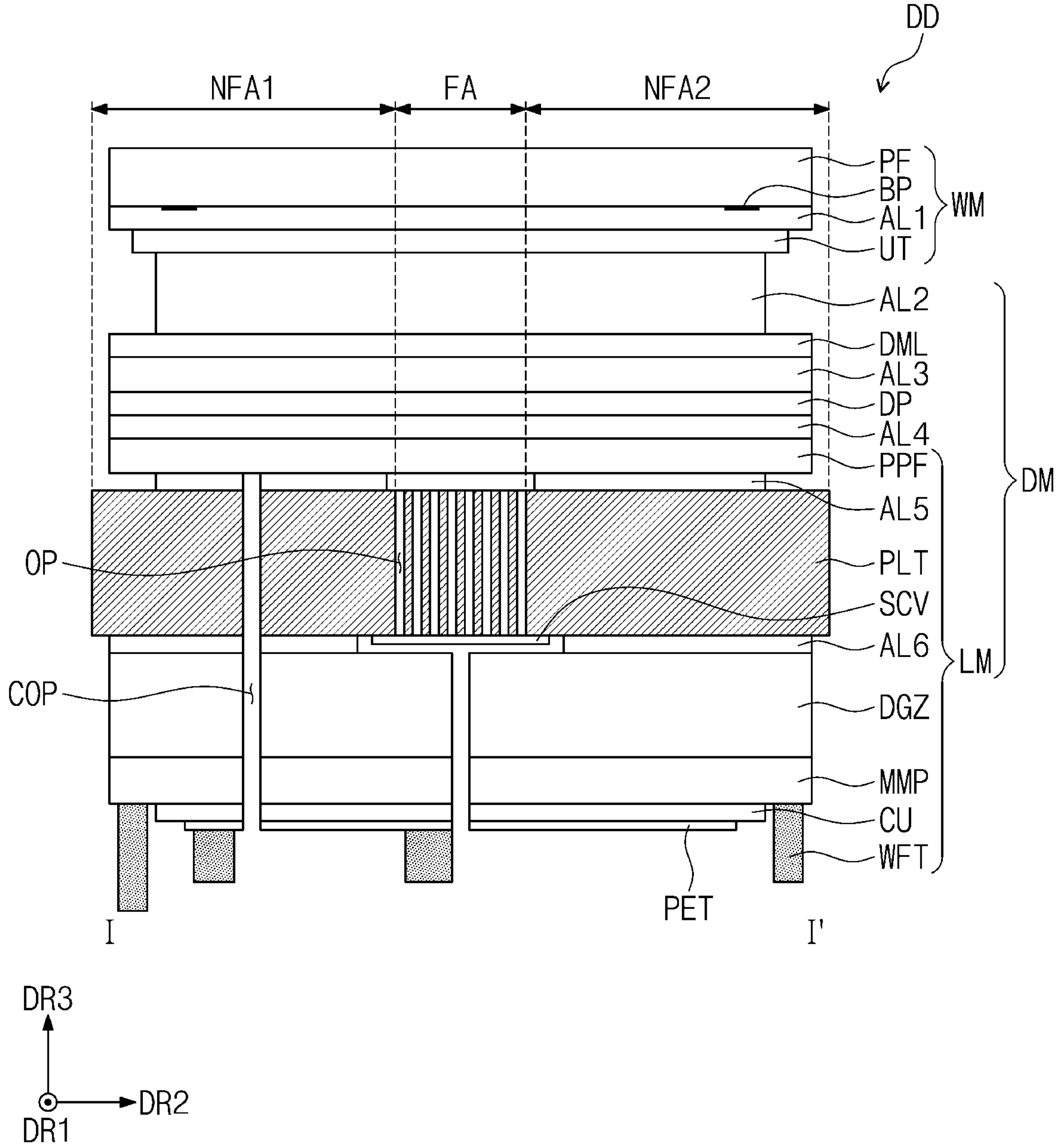
FIG. 3 is a schematic cross-sectional view of a display device according to an embodiment of the disclosure.

FIG. 3 is a schematic cross-sectional view of the display device DD according to an embodiment of the disclosure. FIG. 3 is a schematic cross-sectional view of the display device DD taken along line I-I' of FIG. 2A according to an embodiment of the disclosure.

Referring to FIG. 3, the display device DD may include the window module WM and the display module DM.

The window module WM may include a window UT, a protective film PF disposed on the window UT, and a bezel pattern BP.

The window UT may be chemically strengthened glass. As the window UT is applied to the display device DD, a crease may be minimized even though folding and unfolding are repeated.

The protective film PF may include polyimide, polycarbonate, polyamide, triacetylcellulose, polymethylmethacrylate, or polyethylene terephthalate. Although not separately illustrated, at least one of a hard coating layer, an anti-fingerprint layer, and an anti-reflection layer may be disposed on an upper surface of the protective film PF.

The bezel pattern BP overlaps the non-display region NDA (refer to FIG. 1A). The bezel pattern BP may be disposed on one surface of the window UT or one surface of the protective film PF. In FIG. 3, the bezel pattern BP disposed on a lower surface of the protective film PF is illustrated as an example. However, without being limited thereto, the bezel pattern BP may be disposed on the upper surface of the protective film PF, an upper surface of the window UT, or a lower surface of the window UT. The bezel pattern BP may be a colored light-blocking film and may be formed by, for example, a coating method. The bezel pattern BP may include a base material and a dye or pigment mixed in the base material. The bezel pattern BP may have a closed-line shape in a plan view.

A first adhesive layer AL1 may be disposed between the protective film PF and the window UT. The first adhesive layer AL1 may be a pressure sensitive adhesive (PSA) film or an optically clear adhesive (OCA) member. Adhesive layers to be described below may also be the same as the first adhesive layer AL1 and may include a conventional adhesive.

The first adhesive layer AL1 may have a thickness sufficient to cover the bezel pattern BP. For example, the bezel pattern BP may have a thickness of about 3 micrometers to about 8 micrometers, and the first adhesive layer AL1 may have a thickness at a level at which bubbles are not generated around the bezel pattern BP.

The first adhesive layer AL1 may be separated from the window UT. The protective film PF may be relatively readily scratched since the protective film PF has a lower strength than the window UT. After the first adhesive layer AL1 and the damaged protective film PF are separated from the window UT, a new protective film PF may be attached to the window UT.

The display module DM may include an impact absorbing layer DML, the display panel DP, and a lower member LM.

The impact absorbing layer DML may be disposed on the display panel DP. The impact absorbing layer DML may be a functional layer for protecting the display panel DP from an external impact. The impact absorbing layer DML may be coupled to the window UT through a second adhesive layer AL2 and may be coupled to the display panel DP through a third adhesive layer AL3.

The lower member LM may be disposed under the display panel DP. The lower member LM may include a panel protection layer PPF, a support layer PLT, a cover layer SCV, a digitizer DGZ, a shielding layer MMP, a heat radiating layer CU, a protective layer PET, and a waterproof tape WFT. In an embodiment of the disclosure, the lower member LM may not include some of the aforementioned components, or may further include other components. Furthermore, the stacking sequence illustrated in FIG. 3 is illustrative, and the sequence in which the components are stacked each other may be changed.

The panel protection layer PPF may be disposed under the display panel DP. The panel protection layer PPF may be attached to a rear surface of the display panel DP through a fourth adhesive layer AL4. The panel protection layer PPF may protect a lower portion of the display panel DP. The panel protection layer PPF may include a flexible plastic material. The panel protection layer PPF may prevent a scratch on the rear surface of the display panel DP during a manufacturing process of the display panel DP. The panel protection layer PPF may be a colored polyimide film. For example, the panel protection layer PPF may be an opaque yellow film, but is not limited thereto.

The support layer PLT may be disposed under the panel protection layer PPF. The support layer PLT supports components disposed on the upper side of the support layer PLT and maintains a flat state and a folded state of the display device DD. In an embodiment of the disclosure, the support layer PLT may include at least a first support portion corresponding to the first non-folding region NFA1, a second support portion corresponding to the second non-folding region NFA2, and a folding portion corresponding to the folding region FA. The first support portion and the second support portion may be spaced apart from each other in the second direction DR2. The folding portion may be disposed between the first support portion and the second support portion, and openings OP may be defined in the folding portion. The flexibility of a portion of the support layer PLT may be improved by the openings OP. The flexibility of the portion of the support layer PLT that overlaps the folding region FA may be improved by the openings OP.

The support layer PLT may include carbon fiber reinforced plastic (CFRP), but is not limited thereto. In other embodiments, the first support portion and the second support portion may include a non-metallic material, plastic, glass fiber reinforced plastic, or glass. The plastic may include polyimide, polyethylene, or polyethylene terephthalate, but is not limited thereto. The first support portion and the second support portion may include a same material. The folding portion may include a material that may be the same as or different from that of the first support portion and the second support portion. For example, the folding portion may include a material having an elastic modulus of 60 GPa or more and may include a metallic material such as stainless steel. For example, the folding portion may include SUS 304. However, without being limited thereto, the folding portion may include various metallic materials.

The support layer PLT may be attached to the panel protection layer PPF through a fifth adhesive layer AL5. Multiple fifth adhesive layers AL5 may be provided. The fifth adhesive layers AL5 may be spaced apart from each other with the folding region FA therebetween. The fifth adhesive layer AL5 may not overlap the openings OP. Furthermore, the fifth adhesive layer AL5 may be spaced apart from the openings OP in a plan view. The flexibility of the support layer PLT may be improved since the fifth adhesive layer AL5 is not disposed in a region corresponding to the folding region FA.

In a region overlapping the folding region FA, the panel protection layer PPF may be spaced apart from the support layer PLT. For example, in a portion overlapping the folding region FA, an empty space may be defined between the support layer PLT and the panel protection layer PPF. Since the empty space may be defined between the panel protection layer PPF and the support layer PLT, the shape of the openings OP defined in the support layer PLT may not be visible from outside the electronic device EDE (refer to FIG. 1A).

The fifth adhesive layer AL5 may have a smaller thickness than the fourth adhesive layer AL4. For example, the fourth adhesive layer AL4 may have a thickness of about 25 micrometers, and the fifth adhesive layer AL5 may have a thickness of about 16 micrometers. As the thickness of the fifth adhesive layer AL5 is decreased, a step caused by the fifth adhesive layer AL5 may be decreased. As the step is decreased, deformation of stacked structures due to folding and unfolding of the electronic device EDE (refer to FIG. 1A) may be reduced. However, the openings OP may be visible, or the fifth adhesive layer AL5 may be separated by repeated folding motions. As the thickness of the fifth adhesive layer AL5 is increased, the openings OP may not be visible, and the reliability of the adhesive force of the fifth adhesive layer AL5 may be raised in spite of the repeated folding motions. However, the step may be increased. Accordingly, the thickness of the fifth adhesive layer AL5 may be selected within an appropriate range in consideration of folding reliability, adhesion reliability, and visibility of the openings OP.

The cover layer SCV may be disposed under the support layer PLT. The cover layer SCV may be coupled to the support layer PLT by an adhesive member. The cover layer SCV may cover the openings OP defined in the support layer PLT. Accordingly, the cover layer SCV may prevent infiltration of foreign matter into the openings OP. The cover layer SCV may have a lower elastic modulus than the support layer PLT. For example, the cover layer SCV may include thermoplastic poly-urethane, rubber, or silicone, but is not limited thereto.

The digitizer DGZ may be disposed under the support layer PLT. The digitizer DGZ may be attached to the support layer PLT through a sixth adhesive layer AL6. Multiple digitizers DGZ may be provided. For example, the digitizers DGZ may be spaced apart from each other in the second direction DR2. One portion of each of the digitizers DGZ may overlap the first or second non-folding region NFA1 or NFA2, and the remaining portion may overlap the folding region FA. A portion of each of the digitizers DGZ may overlap some of the openings OP in a plan view.

Each of the digitizers DGZ may include loop coils that generate a magnetic field at a preset resonant frequency with an input device (hereinafter, referred to as the pen). The digitizers DGZ may be referred to as an EMR detection panel.

The magnetic field formed by the digitizers DGZ may be applied to an LC resonance circuit of the pen that may be constituted by an inductor (a coil) and a capacitor. The coil generates a current by the received magnetic field and transfers the generated current to the capacitor. The capacitor charges the current input from the coil and discharges the charged current to the coil. Accordingly, a magnetic field of a resonant frequency may be emitted by the coil. The magnetic field emitted by the pen may be absorbed by the loop coils of the digitizers DGZ again, and thus the position of the pen adjacent to the digitizers DGZ may be determined.

Shielding layers MMP may be provided. The shielding layers MMP may be disposed under the digitizers DGZ, respectively. The shielding layers MMP may include magnetic metal powder. The shielding layers MMP may be referred to as a magnetic metal powder layer, a magnetic layer, a magnetic circuit layer, or a magnetic path layer. The shielding layers MMP may shield a magnetic field.

Heat radiating layers CU may be provided. The heat radiating layers CU may be disposed under the shielding layers MMP, respectively. The heat radiating layers CU may be sheets having high thermal conductivity. For example, the heat radiating layers CU may include graphite, copper, or a copper alloy, but are not limited thereto.

Protective layers PET may be provided. The protective layers PET may be disposed under the heat radiating layers CU, respectively. The protective layers PET may be insulating layers. For example, the protective layers PET may be layers provided to prevent introduction of static electricity. Accordingly, the protective layers PET may prevent the flexible circuit film FCB (refer to FIG. 2A) from electrically interfering with members disposed on the protective layers PET.

Waterproof tapes WFT may be provided. The waterproof tapes WFT may be attached to the shielding layers MMP and the protective layers PET. The waterproof tapes WFT may be attached to a set bracket (not illustrated). The thickness of the waterproof tapes WFT attached to the shielding layers MMP and the thickness of the waterproof tapes WFT attached to the protective layers PET may differ from each other.

A through-hole COP may be defined in at least some components constituting the lower member LM. The through-hole COP may overlap, or correspond to, the sensor region ED-SA (refer to FIG. 1A) of the electronic device EDE. At least a portion of the camera module CMM (refer to FIG. 2A) may be inserted into the through-hole COP.

In FIG. 3, the through-hole COP is illustrated as being provided from a rear surface of one protective layer PET among the protective layers PET to the fifth adhesive layer AL5. However, the disclosure is not limited thereto. For example, the through-hole COP may be provided from the rear surface of the one protective layer PET to an upper surface of the panel protection layer PPF or from the rear surface of the one protective layer PET to an upper surface of the fourth adhesive layer AL4.

Figure 4:
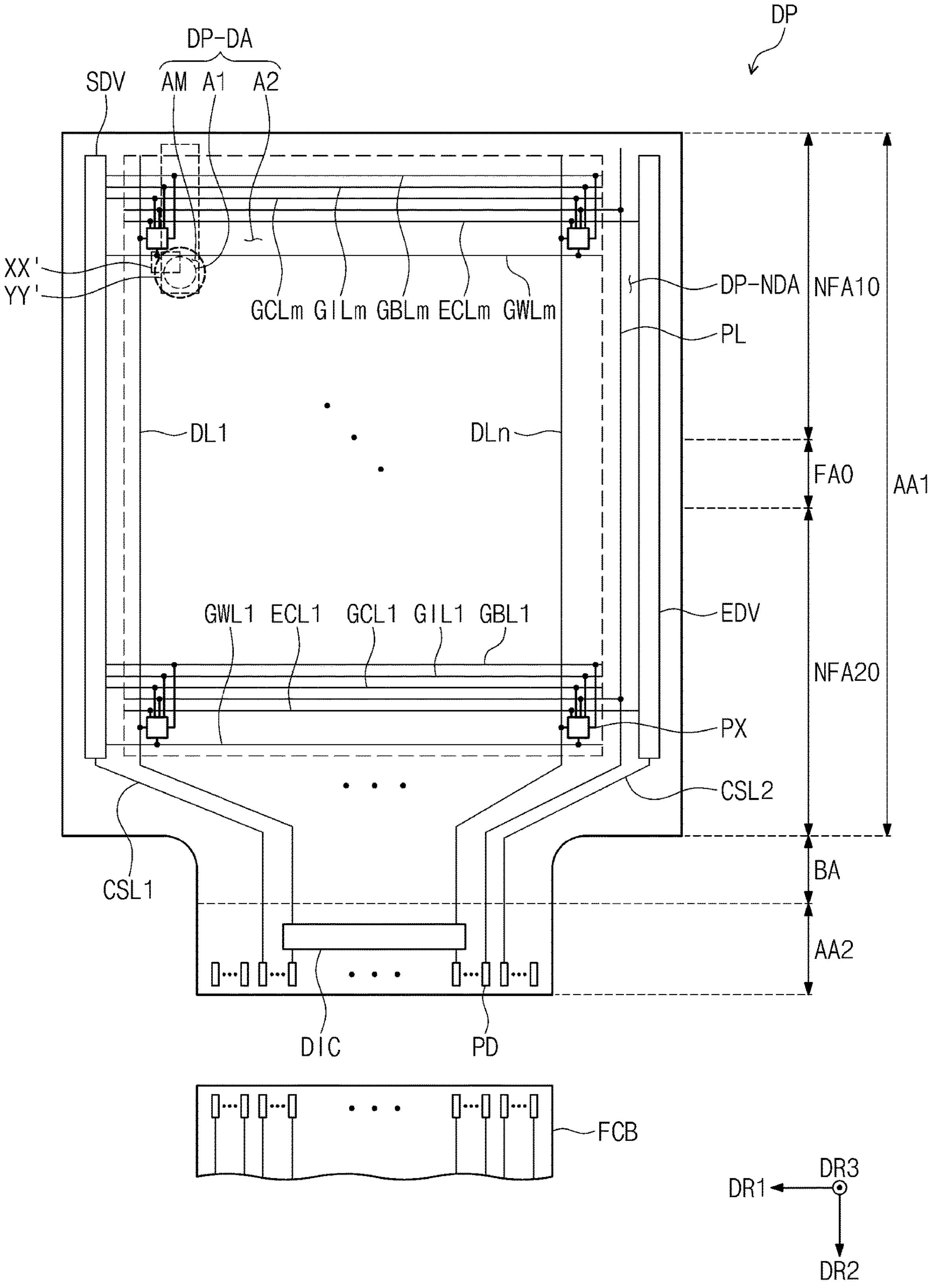
FIG. 4 is a plan view of a display panel according to an embodiment of the disclosure.

FIG. 4 is a plan view of the display panel DP according to an embodiment of the disclosure.

Referring to FIG. 4, the display region DP-DA and the non-display region DP-NDA around the display region DP-DA may be defined in the display panel DP. The display region DP-DA and the non-display region DP-NDA may be distinguished from each other depending on whether the pixels PX are disposed. The pixels PX are disposed in the display region DP-DA. A scan driver SDV, a data driver, and a light emission driver EDV may be disposed in the non-display region DP-NDA. The data driver may be a circuit configured in the driver IC DIC.

The display region DP-DA may include the first region A1, the second region A2, and the intermediate region AM (or, referred to as the third region). The first region A1 and the second region A2 may be distinguished from each other depending on the gaps between the pixels PX, the sizes of the pixels PX, the shapes of the pixels PX, or the presence or absence of a transmissive region TP (refer to FIG. 6).

The pixel PX disposed in the intermediate region AM may have a shape similar to that of the pixels PX disposed in the second region A2. The pixel PX disposed in the intermediate region AM may be distinguished from the pixels PX disposed in the second region A2 in that the pixel PX disposed in the intermediate region AM includes the emissive regions in which light emission is controlled by one pixel circuit. Detailed descriptions about the first region A1, the second region A2, and the intermediate region AM will be given below.

The display panel DP may include a first panel region AA1, a bending region BA, and a second panel region AA2 that are defined in the second direction DR2. The second panel region AA2 and the bending region BA may be partial regions of the non-display region DP-NDA. The bending region BA may be disposed between the first panel region AA1 and the second panel region AA2.

The first panel region AA1 is a region corresponding to the display surface DS of FIG. 1A. The first panel region AA1 may include a first non-folding region NFA10, a second non-folding region NFA20, and a folding region FAO. The first non-folding region NFA10, the second non-folding region NFA20, and the folding region FAO correspond to the first non-folding region NFA1, the second non-folding region NFA2, and the folding region FA of FIGS. 1A and 1B, respectively.

The width of the bending region BA and the width (or, length) of the second panel region AA2 that are parallel to the first direction DR1 may each be smaller than the width (or, length) of the first panel region AA1 that is parallel to the first direction DR1. A region having a smaller length in the direction of a bending axis may be more easily bent.

The display panel DP may include the pixels PX, initialization scan lines GIL1 to GILm, compensation scan lines GCL1 to GCLm, write scan lines GWL1 to GWLm, black scan lines GBL1 to GBLm, light emission control lines ECL1 to ECLm, data lines DL1 to DLn, first and second control lines CSL1 and CSL2, a drive voltage line PL, and pads PD. Here, “m” and “n” are natural numbers of 2 or larger.

The pixels PX may be electrically connected to the initialization scan lines GIL1 to GILm, the compensation scan lines GCL1 to GCLm, the write scan lines GWL1 to GWLm, the black scan lines GBL1 to GBLm, the light emission control lines ECL1 to ECLm, and the data lines DL1 to DLn.

The initialization scan lines GIL1 to GILm, the compensation scan lines GCL1 to GCLm, the write scan lines GWL1 to GWLm, and the black scan lines GBL1 to GBLm may extend in the first direction DR1 and may be electrically connected to the scan driver SDV. The data lines DL1 to DLn may extend in the second direction DR2 and may be electrically connected to the driver IC DIC via the bending region BA. The light emission control lines ECL1 to ECLm may extend in a direction opposite to the first direction DR1 and may be electrically connected to the light emission driver EDV.

The drive voltage line PL may include a portion extending in the first direction DR1 and a portion extending in the second portion DR2. The portion extending in the first direction DR1 and the portion extending in the second portion DR2 may be disposed on different layers. The portion of the drive voltage line PL that extends in the second direction DR2 may extend to the second panel region AA2 via the bending region BA. The drive voltage line PL may provide a drive voltage to the pixels PX.

The first control line CSL1 may be electrically connected to the scan driver SDV and may extend toward a lower end of the second panel region AA2 via the bending region BA. The second control line CSL2 may be electrically connected to the light emission driver EDV and may extend toward the lower end of the second panel region AA2 via the bending region BA.

The pads PD may be disposed adjacent to the lower end of the second panel region AA2 in a plan view. The driver IC DIC, the drive voltage line PL, the first control line CSL1, and the second control line CSL2 may be electrically connected to the pads PD. The flexible circuit film FCB may be electrically connected to the pads PD through an anisotropic conductive adhesive layer.

Figure 5:
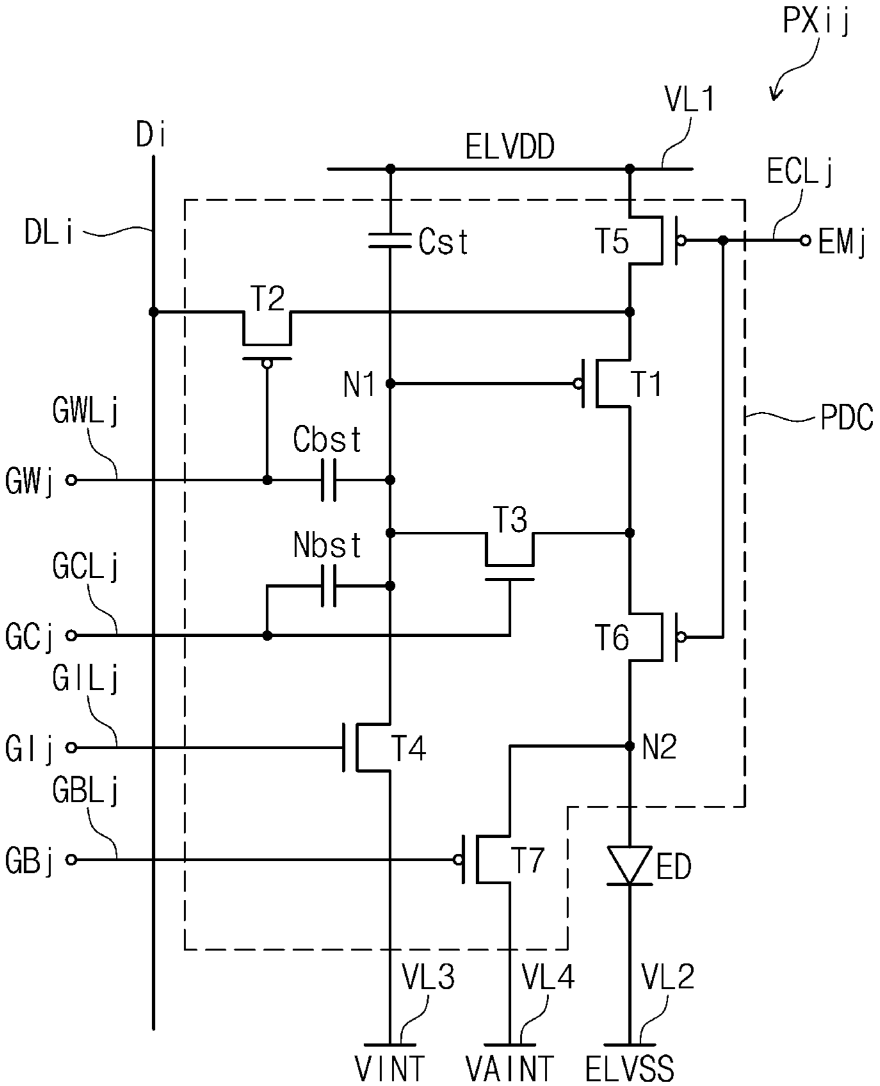
FIG. 5 is an equivalent circuit diagram of a pixel according to an embodiment of the disclosure.

FIG. 5 is an equivalent circuit diagram of a pixel PXij according to an embodiment of the disclosure.

FIG. 5 illustrates the equivalent circuit diagram of the pixel PXij among the pixels PX (refer to FIG. 4). Each of the pixels PX has the same circuit structure. Therefore, description of the circuit structure of the pixel PXij may be applied to the remaining pixels PX, and detailed description of the remaining pixels PX will be omitted.

Referring to FIGS. 4 and 5, the pixel PXij may be electrically connected to the $i^{th}$ data line DLi among the data lines DL1 to DLn, the $i^{th}$ initialization scan line GILj among the initialization scan lines GIL1 to GILm, the $i^{th}$ compensation scan line GCLj among the compensation scan lines GCL1 to GCLm, the $j^{th}$ write scan line GWLj among the write scan lines GWL1 to GWLm, the $j^{th}$ black scan line GBLj among the black scan lines GBL1 to GBLm, the $j^{th}$ light emission control line ECLj among the light emission control lines ECL1 to ECLm, first and second drive voltage lines VL1 and VL2, and first and second initialization voltage lines VL3 and VL4. “i” is an integer of 1 to n, and “j” is an integer of 1 to m.

The pixel PXij includes a light emitting element ED and a pixel circuit PDC. The light emitting element ED may be a light emitting diode. In an embodiment of the disclosure, the light emitting element ED may be an organic light emitting diode including an organic light emitting layer, but is not limited thereto. The pixel circuit PDC may control the amount of current flowing through the light emitting element ED in response to the $i^{th}$ data signal Di. The light emitting element ED may emit light having a predetermined or selectable luminance in response to the amount of current provided from the pixel circuit PDC. In this specification, the amount of current of the pixel PXij may mean the amount of current provided to the light emitting element ED.

The pixel circuit PDC may include first to seventh transistors T1, T2, T3, T4, T5, T6, and T7 and first to third capacitors Cst, Cbst, and Nbst. A configuration of the pixel circuit PDC according to the disclosure is not limited to the embodiment illustrated in FIG. 5. The pixel circuit PDC illustrated in FIG. 5 is merely illustrative, and various changes and modifications can be made to the configuration of the pixel circuit PDC.

At least one of the first to seventh transistors T1, T2, T3, T4, T5, T6, and T7 may be a transistor having a low-temperature polycrystalline silicon (LTPS) semiconductor layer. At least one of the first to seventh transistors T1, T2, T3, T4, T5, T6, and T7 may be a transistor having an oxide semiconductor layer. For example, the third and fourth transistors T3 and T4 may be oxide semiconductor transistors, and the first, second, fifth, sixth, and seventh transistors T1, T2, T5, T6, and T7 may be LTPS transistors.

Specifically, the first transistor T1 (or, referred to as the drive transistor) directly affecting the brightness of the light emitting element ED may include a semiconductor layer formed of polycrystalline silicon having high reliability, and thus the display device DD having a high resolution may be implemented. An oxide semiconductor has high carrier mobility and low leakage current, and therefore a voltage drop may not be great even though operating time may be long. For example, the color of an image may not greatly change depending on a voltage drop even during a low-frequency operation, and therefore the low-frequency operation is possible. Since the oxide semiconductor has an advantage of low leakage current as described above, at least one of the third transistor T3, which may be connected with a gate electrode of the first transistor T1, and the fourth transistor T4 may be employed as an oxide semiconductor to reduce power consumption while preventing leakage current that may be likely to flow to the gate electrode.

Some of the first to seventh transistors T1, T2, T3, T4, T5, T6, and T7 may be P-type transistors, and others of the first to seventh transistors T1, T2, T3, T4, T5, T6, and T7 may be N-type transistors. For example, the first, second, fifth, sixth, and seventh transistors T1, T2, T5, T6, and T7 may be P-type transistors, and the third and fourth transistors T3 and T4 may be N-type transistors.

A configuration of the pixel circuit PDC according to the disclosure is not limited to the embodiment illustrated in FIG. 5. The pixel circuit PDC illustrated in FIG. 5 is merely illustrative, and various changes and modifications can be made to the configuration of the pixel circuit PDC. For example, the first to seventh transistors T1, T2, T3, T4, T5, T6, and T7 may all be P-type transistors or N-type transistors. In other embodiments, the first, second, fifth, and sixth transistors T1, T2, T5, and T6 may be P-type transistors, and the third, fourth, and seventh transistors T3, T4, and T7 may be N-type transistors.

The $j^{th}$ initialization scan line GILj, the $j^{th}$ compensation scan line GCLj, the $j^{th}$ write scan line GWLj, the $j^{th}$ black scan line GBLj, and the $j^{th}$ light emission control line ECLj may transfer the $j^{th}$ initialization scan signal GIj, the $j^{th}$ compensation scan signal GCj, the $j^{th}$ write scan signal GWj, the $j^{th}$ black scan signal GBj, and the $j^{th}$ light emission control signal EMj to the pixel PXij, respectively. The $i^{th}$ data line DLi transfers the $i^{th}$ data signal Di to the pixel PXij. The it h data signal Di may have a voltage level corresponding to an image signal that is input to the display device DD (refer to FIG. 3).

The first and second drive voltage lines VL1 and VL2 may transfer a first drive voltage ELVDD and a second drive voltage ELVSS to the pixel PXij, respectively. Furthermore, the first and second initialization voltage lines VL3 and VL4 may transfer a first initialization voltage VINT and a second initialization voltage VAINT to the pixel PXij, respectively.

The first transistor T1 may be electrically connected between the first drive voltage line VL1 receiving the first drive voltage ELVDD and the light emitting element ED. The first transistor T1 includes a first electrode electrically connected with the first drive voltage line VL1 via the fifth transistor T5, a second electrode electrically connected with a pixel electrode (or, referred to as an anode) of the light emitting element ED via the sixth transistor T6, and a third electrode (e.g., a gate electrode) electrically connected with one end of the first capacitor Cst (e.g., a first node N1). The first transistor T1 may receive the $i^{th}$ data signal Di that the $i^{th}$ data line DLi transfers depending on a switching operation of the second transistor T2 and may supply a drive current to the light emitting element ED.

The second transistor T2 may be electrically connected between the $i^{th}$ data line DLi and the first electrode of the first transistor T1. The second transistor T2 includes a first electrode electrically connected with the $i^{th}$ data line DLi, a second electrode electrically connected with the first electrode of the first transistor T1, and a third electrode (e.g., a gate electrode) electrically connected with the $j^{th}$ write scan line GWLj. The second transistor T2 may be turned on in response to the $j^{th}$ write scan signal GWj transferred through the $i^{th}$ write scan line GWLj and may transfer, to the first electrode of the first transistor T1, the it h data signal Di transferred from the $i^{th}$ data line DLi. One end of the second capacitor Cbst may be electrically connected to the third electrode of the second transistor T2, and an opposite end of the second capacitor Cbst may be electrically connected to the first node N1.

The third transistor T3 may be electrically connected between the second electrode of the first transistor T1 and the first node N1. The third transistor T3 includes a first electrode electrically connected with the third electrode of the first transistor T1, a second electrode electrically connected with the second electrode of the first transistor T1, and a third electrode (e.g., a gate electrode) electrically connected with the $j^{th}$ compensation scan line GCLj. The third transistor T3 may be turned on in response to the $j^{th}$ compensation scan signal GCj transferred through the $j^{th}$ compensation scan line GCLj and may diode-connect the first transistor T1 by connecting the third electrode and the second electrode of the first transistor T1. One end of the third capacitor Nbst may be electrically connected to the third electrode of the third transistor T3, and an opposite end of the third capacitor Nbst may be electrically connected to the first node N1.

The fourth transistor T4 may be electrically connected between the first initialization voltage line VL3 through which the first initialization voltage VINT is applied and the first node N1. The fourth transistor T4 includes a first electrode electrically connected with the first initialization voltage line VL3 through which the first initialization voltage VINT is transferred, a second electrode electrically connected with the first node N1, and a third electrode (e.g., a gate electrode) electrically connected with the $j^{th}$ initialization scan line GILj. The fourth transistor T4 may be turned on in response to the $j^{th}$ initialization scan signal GIj transferred through the $j^{th}$ initialization scan line GILj. The turned-on fourth transistor T4 initializes the potential of the third electrode of the first transistor T1 (for example, the potential of the first node N1) by transferring the first initialization voltage VINT to the first node N1.

The fifth transistor T5 includes a first electrode electrically connected with the first drive voltage line VL1, a second electrode electrically connected with the first electrode of the first transistor T1, and a third electrode (e.g., a gate electrode) electrically connected to the $j^{th}$ light emission control line ECLj. The sixth transistor T6 includes a first electrode electrically connected with the second electrode of the first transistor T1, a second electrode electrically connected to the pixel electrode of the light emitting element ED, and a third electrode (e.g., a gate electrode) electrically connected to the $j^{th}$ light emission control line ECLj.

The fifth and sixth transistors T5 and T6 may be simultaneously turned on in response to the $j^{th}$ light emission control signal EMj transferred through the $j^{th}$ light emission control line ECLj. The first drive voltage ELVDD applied through the turned-on fifth transistor T5 may be compensated for through the diode-connected first transistor T1 and thereafter may be transferred to the light emitting element ED through the sixth transistor T6.

The seventh transistor T7 includes a first electrode electrically connected to the second initialization voltage line VL4 through which the second initialization voltage VAINT is transferred, a second electrode electrically connected with the second electrode of the sixth transistor T6 (e.g., a second node N2), and a third electrode (e.g., a gate electrode) electrically connected with the $j^{th}$ black scan line GBLj. The second initialization voltage VAINT may have a voltage level lower than or equal to the voltage level of the first initialization voltage VINT.

The one end of the first capacitor Cst may be electrically connected with the third electrode of the first transistor T1, and an opposite end of the first capacitor Cst may be electrically connected with the first drive voltage line VL1. A cathode of the light emitting element ED may be electrically connected with the second drive voltage line VL2 that transfers the second drive voltage ELVSS. The second drive voltage ELVSS may have a lower voltage level than the first drive voltage ELVDD.

Figure 6:
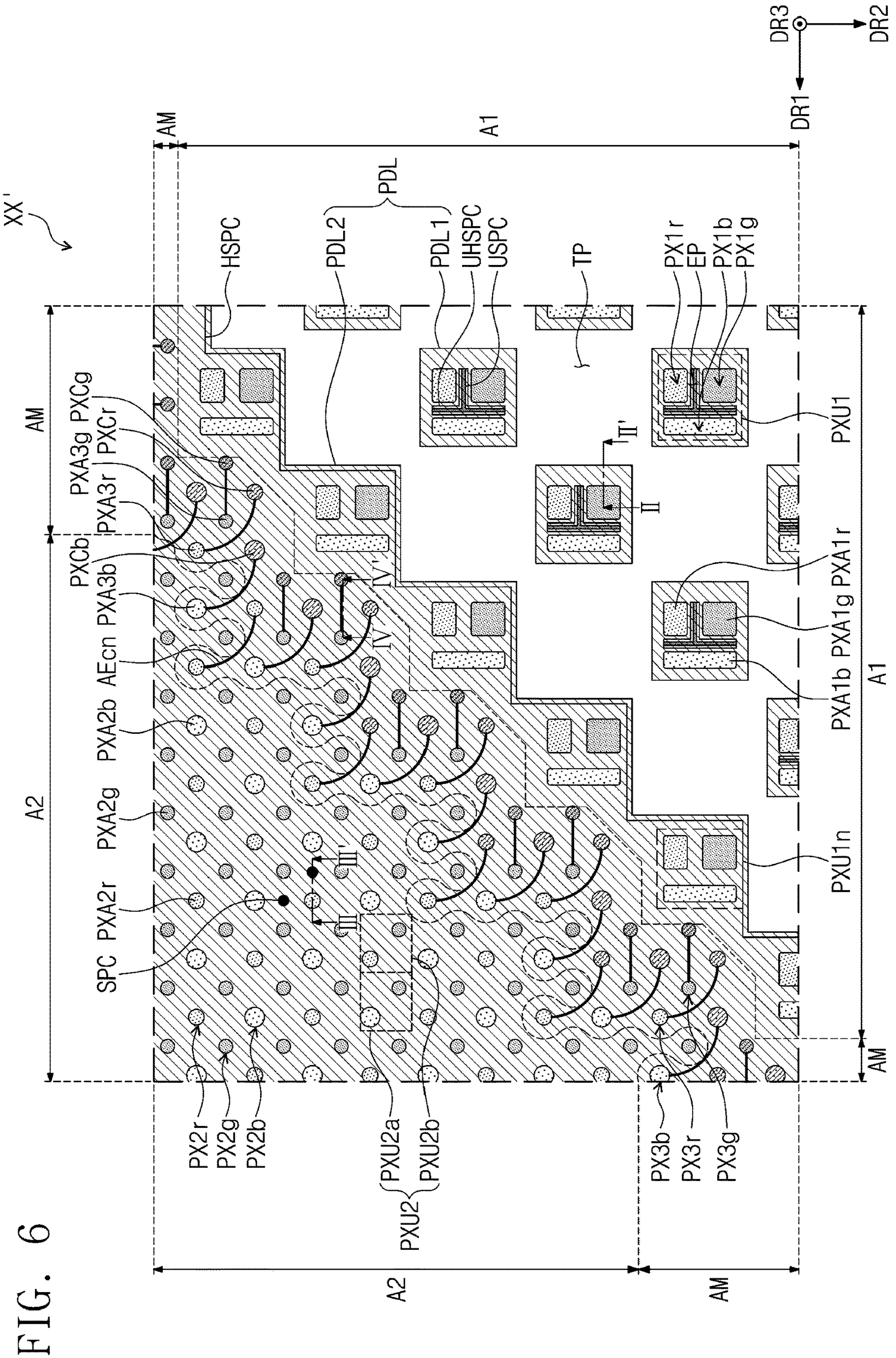
FIG. 6 is an enlarged plan view of a partial region of the display panel according to an embodiment of the disclosure.

FIG. 6 is an enlarged plan view of a partial region of the display panel DP according to an embodiment of the disclosure. FIG. 6 is an enlarged plan view illustrating region XX' illustrated in FIG. 4.

Referring to FIGS. 4 and 6, the display panel DP may include the first region A1, the second region A2, and the intermediate region AM between the first region A1 and the second region A2.

Pixels PX may be provided. The pixels PX may include first pixels PX1*r*, PX1*g*, and PX1*b* disposed in the first region A1, second pixels PX2*r*, PX2*g*, and PX2*b* disposed in the second region A2, and third pixels PX3*r*, PX3*g*, and PX3*b* disposed in the intermediate region AM.

The number of first pixels PX1*r*, PX1*g*, and PX1*b* disposed in a reference area in the first region A1 may be smaller than the number of second pixels PX2*r*, PX2*g*, and PX2*b* disposed in the reference area in the second region A2. Accordingly, the first region A1 may have a lower resolution than the second region A2.

The first pixels PX1*r*, PX1*g*, and PX1*b* may include the color pixel 1-1 PX1*r* (or, referred to as the first red pixel), the color pixel 1-2 PX1*g* (or, referred to as the first green pixel), and the color pixel 1-3 PX1*b* (or, referred to as the first blue pixel). The second pixels PX2*r*, PX2*g*, and PX2*b* may include the color pixel 2-1 PX2*r* (or, referred to as the second red pixel), the color pixel 2-2 PX2*g* (or, referred to as the green pixel 2-1 or the green pixel 2-2), and the color pixel 2-3 PX2*b* (or, referred to as the second blue pixel). The third pixels PX3*r*, PX3*g*, and PX3*b* may include the color pixel 3-1 PX3*r* (or, referred to as the third red pixel), the color pixel 3-2 PX3*g* (or, referred to as the third green pixel), and the color pixel 3-3 PX3*b* (or, referred to as the third blue pixel). The color pixel 1-1 PX1*r*, the color pixel 2-1 PX2*r*, and the color pixel 3-1 PX3*r* may be red light emitting pixels, the color pixel 1-2 PX1*g*, the color pixel 2-2 PX2*g*, and the color pixel 3-2 PX3*g* may be green light emitting pixels, and the color pixel 1-3 PX1*b*, the color pixel 2-3 PX2*b*, and the color pixel 3-3 PX3*b* may be blue light emitting pixels.

The planar shapes of the first pixels PX1*r*, PX1*g*, and PX1*b*, the second pixels PX2*r*, PX2*g*, and PX2*b*, and the third pixels PX3*r*, PX3*g*, and PX3*b* illustrated in FIG. 6 may correspond to the shapes of emissive regions defined in light emitting elements. The emissive regions may be regions defined by pixel defining openings defined in a pixel defining film PDL.

First emissive regions PXA1*r*, PXA1*g*, and PXA1*b* corresponding to the first pixels PX1*r*, PX1*g*, and PX1*b*, respectively, and second emissive regions PXA2*r*, PXA2*g*, and PXA2*b* corresponding to the second pixels PX2*r*, PX2*g*, and PX2*b*, respectively, are illustrated in FIG. 6. An emissive region 3-1 PXA3*r* and a copy emissive region 3-1 PXCr that correspond to the color pixel 3-1 PX3*r*, an emissive region 3-2 PXA3*g* and a copy emissive region 3-2 PXCg that correspond to the color pixel 3-2 PX3*g*, and an emissive region 3-3 PXA3*b* and a copy emissive region 3-3 PXCb that correspond to the color pixel 3-3 PX3*b* are illustrated in FIG. 6.

The area of the emissive region 1-1 PXA1*r* (which may refer to the first emissive region PXA1*r*) may be greater than the area of the emissive region 2-1 PXA2*r* (which may refer to the second emissive region PXA2*r*), the area of the emissive region 1-2 PXA1*g* (which may refer to the first emissive region PXA1*g*) may be greater than the area of the emissive region 2-2 PXA2*g* (which may refer to the second emissive region PXA2*g*), and the area of the emissive region 1-3 PXA1*b* (which may refer to the first emissive region PXA1*b*) may be greater than the area of the emissive region 2-3 PXA2*b* (which may refer to the second emissive region PXA2*b*). The sizes of the first pixels PX1*r*, PX1*g*, and PX1*b* that need to emit relatively bright light in case that the same luminance is implemented within the reference area may be larger than the sizes of the second pixels PX2*r*, PX2*g*, and PX2*b*, and thus the life spans of the first pixels PX1*r*, PX1*g*, and PX1*b* may be compensated for.

Light emission of the emissive region 3-1 PXA3*r* and light emission of the copy emissive region 3-1 PXCr may be controlled by an operation of the same pixel circuit. Accordingly, the emissive region 3-1 PXA3*r* and the copy emissive region 3-1 PXCr may or may not provide light at the same time. A connecting electrode AEcn is illustrated in FIG. 6 to clarify the relationship between the emissive region 3-1 PXA3*r* and the copy emissive region 3-1 PXCr. Light emission of the emissive region 3-2 PXA3*g* and light emission of the copy emissive region 3-2 PXCg may be controlled by an operation of the same pixel circuit, and light emission of the emissive region 3-3 PXA3*b* and light emission of the copy emissive region 3-3 PXCb may be controlled by an operation of the same pixel circuit.

One pixel disposed in the intermediate region AM may include emissive regions. For example, the color pixel 3-1 PX3*r* may include the emissive region 3-1 PXA3*r* and the copy emissive region 3-1 PXCr, the color pixel 3-2 PX3*g* may include the emissive region 3-2 PXA3*g* and the copy emissive region 3-2 PXCg, and the color pixel 3-3 PX3*b* may include the emissive region 3-3 PXA3*b* and the copy emissive region 3-3 PXCb.

Due to space limitation, a pixel circuit may be difficult to place at the boundary between the first region A1 and the second region A2. For example, the region in which the copy emissive region 3-1 PXCr, the copy emissive region 3-2 PXCg, and the copy emissive region 3-3 PXCb are disposed may be a boundary region in which due to space limitation, a pixel circuit may be difficult to place. Therefore, copy light emitting elements not including a pixel circuit may be disposed in the boundary region. Accordingly, the boundary between the first region A1 and the second region A2 may appear less dark as the emissive regions providing light also are provided in the boundary region. For example, the intermediate region AM may be a region for making the boundary between the first region A1 and the second region A2 appear less dark.

A pixel defining film PDL is illustrated in FIG. 6. The pixel defining film PDL may include pixel defining patterns PDL1 and a pixel defining layer PDL2.

The pixel defining patterns PDL1 may be disposed in the first region A1 and may be spaced apart from each other. For example, the first region A1 may include transmissive regions TP and an element region EP, and the pixel defining patterns PDL1 may not overlap the transmissive regions TP and may overlap the element region EP. The boundaries between the transmissive regions TP and the element region EP may be defined by a first lower light blocking layer BML1 (refer to FIG. 7A), and description thereabout will be given below with reference to FIG. 9A. At least three openings may be defined in each of the pixel defining patterns PDL1. For example, openings corresponding to the first emissive regions PXA1*r*, PXA1*g*, and PXA1*b* may be defined in each of the pixel defining patterns PDL1.

A first pixel unit PXU1 and an adjacent pixel unit PXU1*n* may be disposed in the first region A1. Each of the first pixel unit PXU1 and the adjacent pixel unit PXU1*n* may include the first pixels PX1*r*, PX1*g*, and PX1*b*. The shapes of the first emissive regions PXA1*r*, PXA1*g*, and PXA1*b* corresponding to the first pixel unit PXU1 may be the same as the shapes of the first emissive regions PXA1*r*, PXA1*g*, and PXA1*b* corresponding to the adjacent pixel unit PXU1*n*.

The first pixel unit PXU1 may be disposed between four transmissive regions TP. The adjacent pixel unit PXU1*n* may be disposed between the second region A2 and transmissive regions TP disposed at the outermost periphery of the first region A1 among the transmissive regions TP. Accordingly, the adjacent pixel unit PXU1*n* may be adjacent to two transmissive regions TP or three transmissive regions TP.

A second pixel unit PXU2 may be disposed in the second region A2. The second pixel unit PXU2 may include a first sub-pixel unit PXU2*a* and a second sub-pixel unit PXU2*b*.

The first sub-pixel unit PXU2*a* may include the color pixel 2-3 PX2*b* and the color pixel 2-2 PX2*g* (or, referred to as the green pixel 2-2). The second sub-pixel unit PXU2*b* may include the color pixel 2-1 PX2*r* and the color pixel 2-2 PX2*g* (or, referred to as the green pixel 2-1).

The pixel defining layer PDL2 may cover the second region A2, the intermediate region AM, and a portion of the first region A1. For example, the pixel defining layer PDL2 may cover the region in which the adjacent pixel unit PXU1*n* is disposed in the first region A1. Openings corresponding to the first emissive regions PXA1*r*, PXA1*g*, and PXA1*b* of the adjacent pixel unit PXU1*n*, openings corresponding to the second emissive regions PXA2*r*, PXA2*g*, and PXA2*b*, and openings that correspond to the emissive region 3-1 PXA3*r*, the copy emissive region 3-1 PXCr, the emissive region 3-2 PXA3*g*, the copy emissive region 3-2 PXCg, the emissive region 3-3 PXA3*b*, and the copy emissive region 3-3 PXCb may be defined in the pixel defining layer PDL2.

A first spacer HSPC, a first protruding spacer SPC, a second spacer UHSPC, and a second protruding spacer USPC are illustrated in FIG. 6.

The first spacer HSPC may be disposed on the pixel defining layer PDL2. Likewise to the pixel defining layer PDL2, the first spacer HSPC may cover the second region A2, the intermediate region AM, and a portion of the first region A1. For example, the first spacer HSPC may cover the region in which the adjacent pixel unit PXU1*n* is disposed in the first region A1. Furthermore, the first spacer HSPC may cover the region in which the copy emissive region 3-1 PXCr, the copy emissive region 3-2 PXCg, and the copy emissive region 3-3 PXCb exist in the intermediate region AM. Since the first spacer HSPC may be provided even in the intermediate region AM, adhesive characteristics between layers of the display panel DP may be strengthened (or, improved).

The first protruding spacer SPC may be disposed on the first spacer HSPC. The first protruding spacer SPC may have a circular shape in a plan view. The first protruding spacer SPC may be disposed in the second region A2. The first protruding spacer SPC may not be disposed in the intermediate region AM. The first protruding spacer SPC may be provided only between the second pixels PX2*r*, PX2*g*, and PX2*b* and may not be provided between the copy emissive region 3-1 PXCr, the copy emissive region 3-2 PXCg, and the copy emissive region 3-3 PXCb.

The height (or, thickness) of the first protruding spacer SPC may be greater than the height (or, thickness) of the first spacer HSPC. The height of the first spacer HSPC may range from 0.1 μm to 0.5 μm, and the total height of the first spacer HSPC and the first protruding spacer SPC may range from 1.1 μm to 2.0 μm. However, the height of the first spacer HSPC and the total height of the first spacer HSPC and the first protruding spacer SPC are not limited to the aforementioned examples.

First protruding spacers SPC may be provided. For example, two first protruding spacers SPC may be disposed adjacent to one color pixel 2-2 PX2*g*. Hence, a probability that a dent defect caused by a mask occurs during a manufacturing process may be further reduced.

Two first protruding spacers SPC may be repeatedly arranged with four color pixels 2-2 PX2*g* therebetween. For example, two first protruding spacers SPC may be spaced apart from two other first protruding spacers SPC with four color pixels 2-2 PX2*g* sequentially arranged in the first direction DR1 therebetween. Furthermore, two first protruding spacers SPC may be spaced apart from two other first protruding spacers SPC with four color pixels 2-2 PX2*g* sequentially arranged in the second direction DR2 therebetween. However, an arrangement of the first protruding spacers SPC is not limited thereto. For example, two first protruding spacers SPC may be repeatedly arranged with two color pixels 2-2 PX2*g* therebetween. In an embodiment of the disclosure, one of the two first protruding spacers SPC may be omitted.

The second spacer UHSPC may be disposed on the pixel defining pattern PDL1. The second protruding spacer USPC may be disposed on the second spacer UHSPC. The area of the second spacer UHSPC may be greater than the area of the second protruding spacer USPC in a plan view. Each of the second spacer UHSPC and the second protruding spacer USPC may be disposed in a region between the emissive region 1-1 PXA1*r* and the emissive region 1-2 PXA1*g*, a region between the emissive region 1-1 PXA1*r* and the emissive region 1-3 PXA1*b*, and a region between the emissive region 1-2 PXA1*g* and the emissive region 1-3 PXA1*b* in a plan view.

Figure 7A:
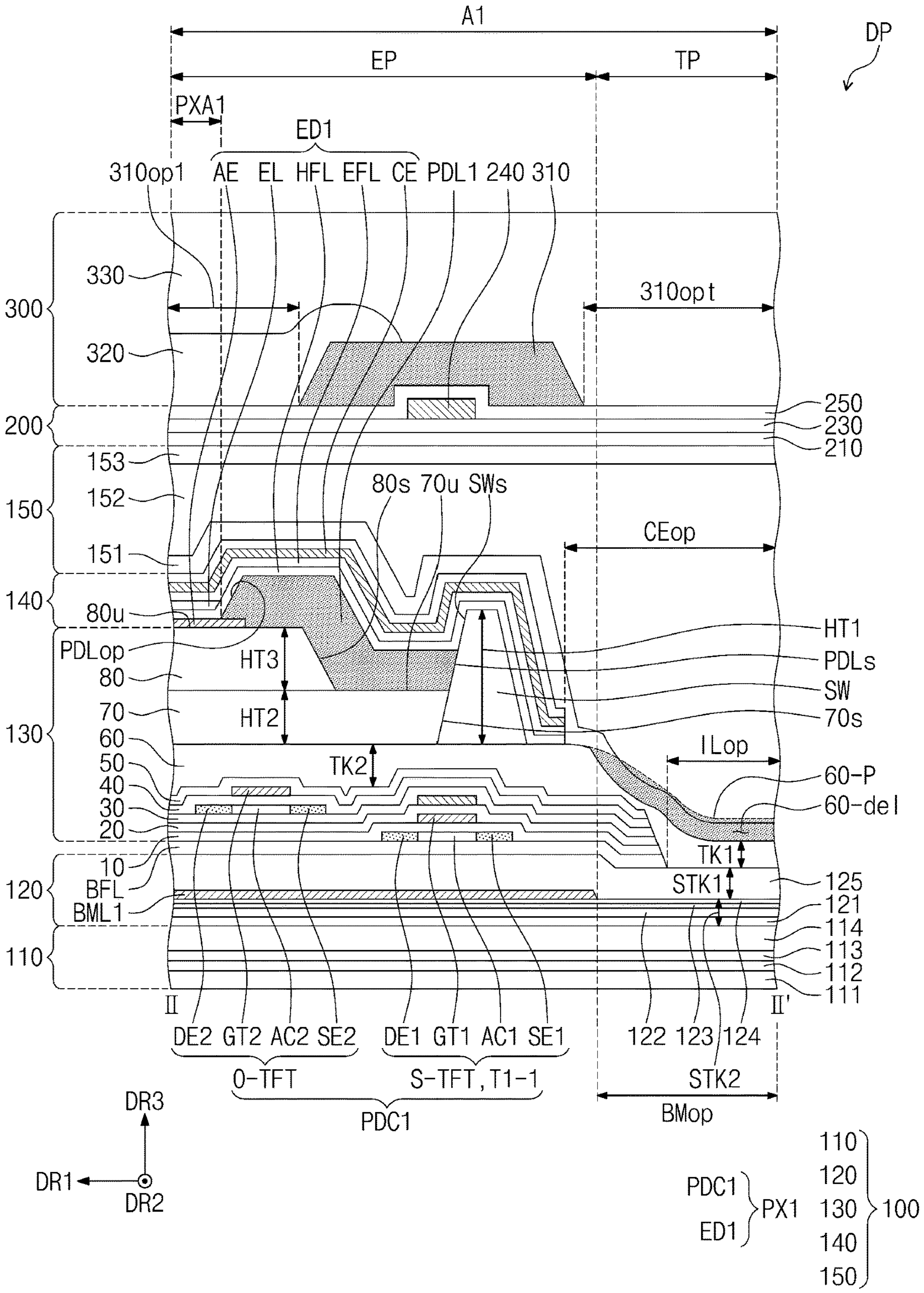
FIG. 7A is a schematic cross-sectional view illustrating a first region of the display panel according to an embodiment of the disclosure.
Figure 7B:
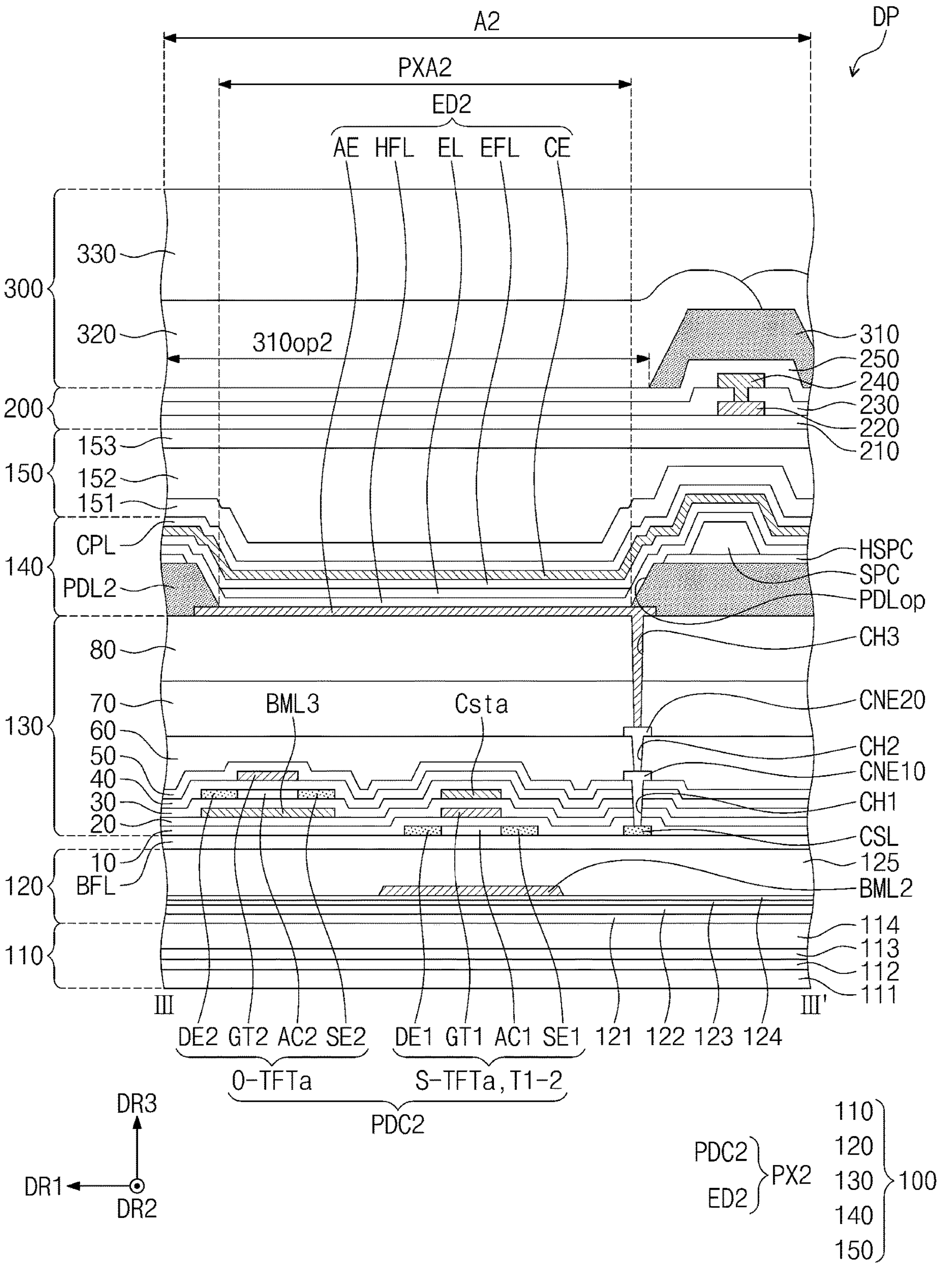
FIG. 7B is a schematic cross-sectional view illustrating a second region of the display panel according to an embodiment of the disclosure.
Figure 7C:
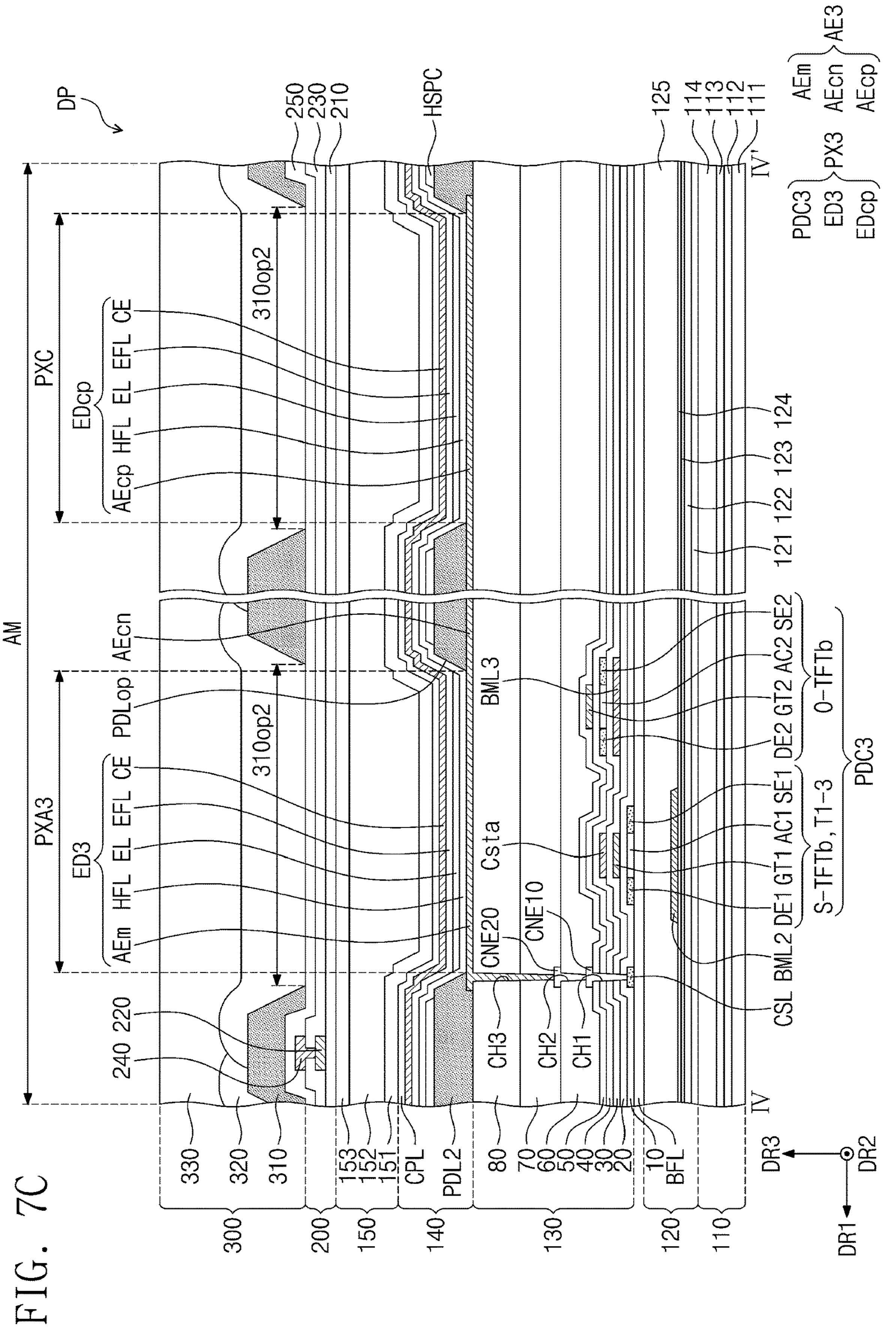
FIG. 7C is a schematic cross-sectional view illustrating an intermediate region of the display panel according to an embodiment of the disclosure.

FIG. 7A is a schematic cross-sectional view illustrating the first region A1 of the display panel DP according to an embodiment of the disclosure. FIG. 7B is a schematic cross-sectional view illustrating the second region A2 of the display panel DP according to an embodiment of the disclosure. FIG. 7C is a schematic cross-sectional view illustrating the intermediate region AM of the display panel DP according to an embodiment of the disclosure. FIG. 7A is a schematic cross-sectional view taken along line II-IF of FIG. 6, FIG. 7B is a schematic cross-sectional view taken along line III-III' of FIG. 6, and FIG. 7C is a schematic cross-sectional view taken along line IV-IV' of FIG. 6.

Referring to FIGS. 7A, 7B, and 7C, the display panel DP may include the display layer 100, the sensor layer 200, and an anti-reflection layer 300. The display layer 100 may include a base layer 110, a barrier layer 120, a circuit layer 130, an element layer 140, and an encapsulation layer 150.

The base layer 110 may include first to fourth sub-base layers 111, 112, 113, and 114.

Each of the first sub-base layer 111 and the fourth sub-base layer 114 may include at least one of a polyimide-based resin, an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. A "Z"-based resin used herein may refer to a resin including a "Z" functional group. For example, the first and fourth sub-base layers 111 and 114 may include polyimide.

Each of the second sub-base layer 112 and the third sub-base layer 113 may include an inorganic material. For example, each of the second sub-base layer 112 and the third sub-base layer 113 may include at least one of silicon oxide, silicon nitride, silicon oxy-nitride, and amorphous silicon. For example, the second sub-base layer 112 may include silicon oxy-nitride, and the third sub-base layer 113 may include silicon oxide.

The first sub-base layer 111 may be thicker than the fourth sub-base layer 114. For example, the first sub-base layer 111 may have a thickness of about 100,000 angstroms, and the fourth sub-base layer 114 may have a thickness of about 56,000 angstroms. The second sub-base layer 112 may be thinner than the third sub-base layer 113. For example, the second sub-base layer 112 may have a thickness of about 1,000 angstroms, and the third sub-base layer 113 may have a thickness of about 5,000 angstroms. However, the thicknesses of the first to fourth sub-base layers 111, 112, 113, and 114 are not limited to the aforementioned numerical values.

The barrier layer 120 may be disposed on the base layer 110. The barrier layer 120 may include sub-barrier layers 121, 122, 123, 124, and 125, the first lower light blocking layer BML1, and a second lower light blocking layer BML2.

The first and second lower light blocking layers BML1 and BML2 may be referred to as first and second lower layers, first and second lower metal layers, first and second lower electrode layers, first and second lower shielding layers, first and second light blocking layers, first and second metal layers, first and second electrode layers, first and second shielding layers, or first and second overlap layers.

The sub-barrier layers 121, 122, 123, 124, and 125 may include the first sub-barrier layer 121, the second sub-barrier layer 122, the third sub-barrier layer 123, the fourth sub-barrier layer 124, and the fifth sub-barrier layer 125 that may be sequentially stacked each other in a direction away from the base layer 110. Each of the first to fifth sub-barrier layers 121, 122, 123, 124, and 125 may include an inorganic material. For example, each of the first to fifth sub-barrier layers 121, 122, 123, 124, and 125 may include at least one of silicon oxide, silicon nitride, silicon oxy-nitride, and amorphous silicon. For example, the first sub-barrier layer 121 may include silicon oxy-nitride, the second sub-barrier layer 122 may include silicon oxide, the third sub-barrier layer 123 may include amorphous silicon, the fourth sub-barrier layer 124 may include silicon oxide, and the fifth sub-barrier layer 125 may include silicon oxide.

Among the first to fifth sub-barrier layers 121, 122, 123, 124, and 125, the fifth sub-barrier layer 125 may be closest to the circuit layer 130. The fifth sub-barrier layer 125 may be referred to as a top sub-barrier layer. The thickness STK1 of the fifth sub-barrier layer 125 may be greater than each of the thicknesses of the first to fourth sub-barrier layers 121, 122, 123, and 124. For example, the thickness STK1 of the fifth sub-barrier layer 125 may be greater than a sum of the thicknesses STK2 of the first to fourth sub-barrier layers 121, 122, 123, and 124. For example, the first sub-barrier layer 121 may have a thickness of about 1,000 angstroms, the second sub-barrier layer 122 may have a thickness of about 1,500 angstroms, the third sub-barrier layer 123 may have a thickness of about 100 angstroms, the fourth sub-barrier layer 124 may have a thickness of about 130 angstroms, and the fifth sub-barrier layer 125 may have a thickness of about 4,200 angstroms. In particular, the thickness STK1 of the fifth sub-barrier layer 125 may be greater than the aforementioned thickness.

The first lower light blocking layer BML1 may be disposed in the first region A1, and the second lower light blocking layer BML2 may be disposed in the second region A2. The first lower light blocking layer BML1 and the second lower light blocking layer BML2 may be electrically insulated from each other, and different signals may be applied to the first lower light blocking layer BML1 and the second lower light blocking layer BML2. For example, a constant voltage having a predetermined or selectable voltage level may be applied to the first lower light blocking layer BML1, and the first drive voltage ELVDD (refer to FIG. 5) provided to the pixel circuit PDC (refer to FIG. 5) may be provided to the second lower light blocking layer BML2.

The first lower light blocking layer BML1 and the second lower light blocking layer BML2 may be disposed on (or in) a same layer and may include a same material. For example, the first lower light blocking layer BML1 and the second lower light blocking layer BML2 may be disposed between the fourth sub-barrier layer 124 and the fifth sub-barrier layer 125. The first lower light blocking layer BML1 and the second lower light blocking layer BML2 may be covered by the fifth sub-barrier layer 125. Since the fifth sub-barrier layer 125 has the largest thickness among the first to fifth sub-barrier layers 121, 122, 123, 124, and 125, the degree to which characteristics of transistors are changed by the voltages provided to the first and second lower light blocking layers BML1 and BML2 may be decreased.

The first lower light blocking layer BML1 may have a first opening BMop that defines the transmissive region TP. The first lower light blocking layer BML1 may be a pattern that functions as a mask in case that an electrode opening CEop is formed in a common electrode CE. For example, light applied from a rear surface of the base layer 110 toward the common electrode CE may pass through the first opening BMop of the first lower light blocking layer BML1 and may reach a portion of the common electrode CE and a portion of a capping layer CPL. For example, the portion of the common electrode CE and the portion of the capping layer CPL may be removed by the light passing through the first opening BMop of the first lower light blocking layer BML1. The light may be a laser beam.

A region overlapping the first opening BMop of the first lower light blocking layer BML1 in the first region A1 may be defined as the transmissive region TP, and the remaining region may be defined as the element region EP. The first pixels PX1*r*, PX1*g*, and PX1*b* (refer to FIG. 6) may be disposed in the element region EP. The first pixels PX1*r*, PX1*g*, and PX1*b* may be spaced apart from the transmissive region TP.

A buffer layer BFL may be disposed on the barrier layer 120. The buffer layer BFL may be provided in all of the first region A1, the second region A2, and the intermediate region AM. The buffer layer BFL may prevent diffusion of metal atoms or impurities from the base layer 110 to a first semiconductor pattern. Furthermore, the buffer layer BFL may allow the first semiconductor pattern to be uniformly formed, by adjusting the speed at which heat is provided during a crystallization process for forming the first semiconductor pattern.

The buffer layer BFL may include inorganic layers. For example, the buffer layer BFL may include a first sub-buffer layer including silicon nitride and a second sub-buffer layer disposed on the first sub-buffer layer and including silicon oxide. The buffer layer BFL may not overlap the transmissive region TP (or the buffer layer BFL may not overlap the transmissive region TP in portion). For example, an opening corresponding to the transmissive region TP may be defined in the buffer layer BFL. Since the buffer layer BFL may not be provided in the transmissive region TP (or the buffer layer BFL may not be provided in the transmissive region TP in portion), the transmittance of the transmissive region TP may be further improved.

A first pixel PX1 disposed in the first region A1, a second pixel PX2 disposed in the second region A2, and a third pixel PX3 (or, referred to as an intermediate pixel) disposed in the intermediate region AM are illustrated in FIGS. 7A, 7B, and 7C, respectively. The first pixel PX1 may be one of the first pixels PX1*r*, PX1*g*, and PX1*b* (refer to FIG. 6), the second pixel PX2 may be one of the second pixels PX2*r*, PX2*g*, and PX2*b* (refer to FIG. 6), and the third pixel PX3 may be one of the third pixels PX3*r*, PX3*g*, and PX3*b* (refer to FIG. 6).

The first pixel PX1 may include a first light emitting element ED1 and a first pixel circuit PDC1. The second pixel PX2 may include a second light emitting element ED2 and a second pixel circuit PDC2. The third pixel PX3 may include a third light emitting element ED3, a copy light emitting element EDcp, and a third pixel circuit PDC3.

The circuit layer 130 may be disposed on the buffer layer BFL, and the element layer 140 may be disposed on the circuit layer 130.

Referring to FIG. 7A, a silicon thin film transistor S-TFT and an oxide thin film transistor O-TFT of the first pixel circuit PDC1 are illustrated as an example. The silicon thin film transistor S-TFT may be one of the first, second, fifth, sixth, and seventh transistors T1, T2, T5, T6, and T7 described with reference to FIG. 5, and the oxide thin film transistor O-TFT may be one of the third and fourth transistors T3 and T4. For example, the silicon thin film transistor S-TFT may be a first drive transistor T1-1 included in the first pixel circuit PDC1.

First to seventh transistors T1, T2, T3, T4, T5, T6, and T7 included in the first pixel circuit PDC1 may be referred to as first type transistors. In the first region A1, the first lower light blocking layer BML1 may overlap all of the first type transistors. For example, the first lower light blocking layer BML1 may completely overlap the region in which the first pixel circuit PDC1 is disposed. Accordingly, a voltage provided to the first lower light blocking layer BML1 may be provided irrespective of an operation of the first pixel circuit PDC1.

Referring to FIG. 7B, a silicon thin film transistor S-TFTa and an oxide thin film transistor O-TFTa of the second pixel circuit PDC2 are illustrated as an example. The silicon thin film transistor S-TFTa may be the first transistor T1 described with reference to FIG. 5, and the oxide thin film transistor O-TFTa may be one of the third and fourth transistors T3 and T4. For example, the silicon thin film transistor S-TFTa may be a second drive transistor T1-2 included in the second pixel circuit PDC2.

First to seventh transistors T1, T2, T3, T4, T5, T6, and T7 included in the second pixel circuit PDC2 may be referred to as second type transistors. In the second region A2, the second lower light blocking layer BML2 may overlap some of the second type transistors and may not overlap others of the second type transistors. For example, the second lower light blocking layer BML2 may overlap a portion of the region in which the second pixel circuit PDC2 is disposed. In particular, the second lower light blocking layer BML2 may overlap the second drive transistor T1-2. Accordingly, a voltage provided to the second lower light blocking layer BML2 may be provided in synchronization with an operation of the second pixel circuit PDC2.

Referring to FIG. 7C, a silicon thin film transistor S-TFTb and an oxide thin film transistor O-TFTb of the third pixel circuit PDC3 are illustrated as an example. The silicon thin film transistor S-TFTb may be the first transistor T1 described with reference to FIG. 5, and the oxide thin film transistor O-TFTb may be one of the third and fourth transistors T3 and T4. For example, the silicon thin film transistor S-TFTb may be a third drive transistor T1-3 included in the third pixel circuit PDC3.

The third pixel circuit PDC3 may have substantially the same structure as the second pixel circuit PDC2. In the intermediate region AM, the second lower light blocking layer BML2 may overlap a portion of the third pixel circuit PDC3 and may not overlap the remaining portion. In particular, the second lower light blocking layer BML2 may overlap the third drive transistor T1-3. The copy light emitting element EDcp may be electrically connected with the third pixel circuit PDC3 via a main pixel electrode AEm of the third light emitting element ED3. Accordingly, a pixel circuit may not be disposed under the copy light emitting element EDcp. Thus, the copy light emitting element EDcp may not overlap the first lower light blocking layer BML1 and the second lower light blocking layer BML2.

Referring to FIGS. 7A, 7B, and 7C, the first semiconductor pattern may be disposed on the buffer layer BFL. The first semiconductor pattern may include a silicon semiconductor. For example, the silicon semiconductor may include amorphous silicon or polycrystalline silicon. For example, the first semiconductor pattern may include low-temperature poly silicon.

FIGS. 7A, 7B, and 7C illustrate only a portion of the first semiconductor pattern disposed on the buffer layer BFL, and the first semiconductor pattern also may be disposed in another region. The first semiconductor pattern may be arranged across pixels according to a specific rule. The first semiconductor pattern may have different electrical properties depending on whether the first semiconductor pattern is doped or not. The first semiconductor pattern may include a first region having a high conductivity and a second region having a low conductivity. The first region may be doped with an N-type dopant or a P-type dopant. A P-type transistor may include a doped region that is doped with a P-type dopant, and an N-type transistor may include a doped region that is doped with an N-type dopant. The second region may be an undoped region, or may be a region more lightly doped than the first region.

The first region may have a higher conductivity than the second region and may substantially serve as an electrode or a signal line. The second region may substantially correspond to an active region (or, a channel) of a transistor. In other words, one portion of the first semiconductor pattern may be an active region of the transistor, another portion may be a source or drain of the transistor, and another portion may be a connecting electrode or a connecting signal line.

Source regions SE1, active regions AC1, and drain regions DE1 of the silicon thin film transistors S-TFT, S-TFTa, and S-TFTb may be formed from the first semiconductor pattern. The source regions SE1 and the drain regions DE1 may extend from the active regions AC1 in opposite directions on the sections.

A portion of a connecting signal line CSL formed from the first semiconductor pattern is illustrated in FIGS. 7B and 7C. The connecting signal line CSL may be electrically connected to the second electrode of the sixth transistor T6 (refer to FIG. 5) and the second electrode the seventh transistor T7 (refer to FIG. 5).

The circuit layer 130 may include inorganic layers and organic layers. In an embodiment, first to fifth insulating layers 10, 20, 30, 40, and 50 sequentially stacked on the buffer layer BFL may be inorganic layers, and sixth to eighth insulating layers 60, 70, and 80 may be organic layers.

The first insulating layer 10 may be disposed on the buffer layer BFL. The first insulating layer 10 may cover the first semiconductor pattern. The first insulating layer 10 may be an inorganic layer and/or an organic layer and may have a single-layer structure or a multi-layer structure. The first insulating layer 10 may include at least one of aluminum oxide, titanium oxide, silicon oxide, silicon nitride, silicon oxy-nitride, zirconium oxide, and hafnium oxide. In an embodiment, the first insulating layer 10 may be a single silicon oxide layer. The insulating layers of the circuit layer 130 to be described below also may have a single-layer structure or a multi-layer structure.

A gate electrode GT1 of the silicon thin film transistor S-TFT, S-TFTa, or S-TFTb may be disposed on the first insulating layer 10. The gate electrode GT1 may be a portion of a metal pattern. The gate electrode GT1 overlaps the active region AC1. The gate electrode GT1 may function as a mask in a process of doping the first semiconductor pattern. The gate electrode GT1 may include titanium, silver, an alloy containing silver, molybdenum, an alloy containing molybdenum, aluminum, an alloy containing aluminum, aluminum nitride, tungsten, tungsten nitride, copper, indium tin oxide, or indium zinc oxide, but is not limited thereto.

The second insulating layer 20 may be disposed on the first insulating layer 10 and may cover the gate electrode GT1. The second insulating layer 20 may be an inorganic layer and may have a single-layer structure or a multi-layer structure. The second insulating layer 20 may include at least one of silicon oxide, silicon nitride, and silicon oxy-nitride. In an embodiment, the second insulating layer 20 may have a single-layer structure including a silicon nitride layer.

The third insulating layer 30 may be disposed on the second insulating layer 20. The third insulating layer 30 may be an inorganic layer and may have a single-layer structure or a multi-layer structure. For example, the third insulating layer 30 may have a multi-layer structure including a silicon oxide layer and a silicon nitride layer. One electrode Csta of the first capacitor Cst (refer to FIG. 5) may be disposed between the second insulating layer 20 and the third insulating layer 30. Furthermore, another electrode of the first capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include regions distinguished depending on whether metal oxide is reduced or not. A region where metal oxide is reduced (hereinafter, referred to as the reduced region) has a higher conductivity than a region where metal oxide is not reduced (hereinafter, referred to as the non-reduced region). The reduced region substantially serves as a source or drain of a transistor or a signal line. The non-reduced region substantially corresponds to an active region (or, a semiconductor region or a channel) of the transistor. In other words, one portion of the second semiconductor pattern may be an active region of the transistor, another portion may be a source or drain region of the transistor, and another portion may be a signal transmission region.

Source regions SE2, active regions AC2, and drain regions DE2 of the oxide thin film transistors O-TFT, O-TFTa, and O-TFTb may be formed from the second semiconductor pattern. The source regions SE2 and the drain regions DE2 may extend from the active regions AC2 in opposite directions on the section.

The oxide thin film transistor O-TFT disposed in the first region A1 may overlap the first lower light blocking layer BML1. Accordingly, light incident from below the display panel DP may be blocked by the first lower light blocking layer BML1 and may not be provided to the active region AC2 of the oxide thin film transistor O-TFT.

The oxide thin film transistor O-TFTa disposed in the second region A2 and the oxide thin film transistor O-TFTb disposed in the intermediate region AM may not overlap the second lower light blocking layer BML2. Accordingly, an additional layer for blocking light toward lower portions of the oxide thin film transistors O-TFTa and O-TFTb may be provided. For example, a third lower light blocking layer BML3 may be disposed on the lower portions of the oxide thin film transistors O-TFTa and O-TFTb that are disposed in the second region A2 and the intermediate region AM. The third lower light blocking layer BML3 may be disposed between the second insulating layer 20 and the third insulating layer 30. The third lower light blocking layer BML3 may include a same material as that of the one electrode Csta of the first capacitor Cst (refer to FIG. 5) and may be formed through the same process as that of the one electrode Csta of the first capacitor Cst (refer to FIG. 5).

The fourth insulating layer 40 may be disposed on the third insulating layer 30. The fourth insulating layer 40 may cover the second semiconductor pattern. The fourth insulating layer 40 may be an inorganic layer and may have a single-layer structure or a multi-layer structure. The fourth insulating layer 40 may include at least one of aluminum oxide, titanium oxide, silicon oxide, silicon nitride, silicon oxy-nitride, zirconium oxide, and hafnium oxide. In an embodiment, the fourth insulating layer 40 may have a single-layer structure including silicon oxide.

A gate electrode GT2 of the oxide thin film transistor O-TFT, O-TFTa, or O-TFTb may be disposed on the fourth insulating layer 40. The gate electrode GT2 may be a portion of a metal pattern. The gate electrode GT2 overlaps the active region AC2. The gate electrode GT2 may function as a mask in a process of reducing the second semiconductor pattern.

The fifth insulating layer 50 may be disposed on the fourth insulating layer 40 and may cover the gate electrode GT2. The fifth insulating layer 50 may be an inorganic layer and/or an organic layer and may have a single-layer structure or a multi-layer structure. For example, the fifth insulating layer 50 may have a multi-layer structure including a silicon oxide layer and a silicon nitride layer.

A first connecting electrode CNE10 may be disposed on the fifth insulating layer 50. The first connecting electrode CNE10 may be electrically connected to the connecting signal line CSL through a first contact hole CH1 penetrating the first to fifth insulating layers 10, 20, 30, 40, and 50.

A second opening ILop may be defined in the buffer layer BFL and at least some of the first to eighth insulating layers 10, 20, 30, 40, 50, 60, 70, and 80 included in the circuit layer 130. For example, the second opening ILop may be defined in the buffer layer BFL and the first to fifth insulating layers 10, 20, 30, 40, and 50. The second opening ILop may be defined in a region overlapping the transmissive region TP. For example, the transmittance of the transmissive region TP may be improved by removing portions of the buffer layer BFL and the first to fifth insulating layers 10, 20, 30, 40, and 50 that overlap the transmissive region TP.

The second opening ILop may have a smaller minimum width than the first opening BMop. Sidewalls of the buffer layer BFL and the first to fifth insulating layers 10, 20, 30, 40, and 50 that define the second opening ILop may further protrude toward the transmissive region TP than a sidewall of the first lower light blocking layer BML1.

The sixth insulating layer 60 may be disposed on the fifth insulating layer 50. The sixth insulting layer 60 may include an organic material. The sixth insulating layer 60 may include a polyimide-based resin. For example, the sixth insulating layer 60 may include photosensitive polyimide. A second connecting electrode CNE20 may be disposed on the sixth insulating layer 60. The second connecting electrode CNE20 may be electrically connected to the first connecting electrode CNE10 through a second contact hole CH2 penetrating the sixth insulating layer 60.

The sixth insulating layer 60 may be disposed in both the element region EP and the transmissive region TP. The sixth insulating layer 60 may be referred to as the first organic layer. The sixth insulating layer 60 may fill the portion in which the second opening ILop is defined. For example, the sixth insulating layer 60 may overlap the transmissive region TP. Since the sixth insulating layer 60 may be provided in the transmissive region TP, a step of an upper surface of the sixth insulating layer 60 may be decreased. In a case in which steps of layers overlapping the transmissive region TP are reduced, diffraction of light incident on the transmissive region TP may be alleviated (or, reduced). Accordingly, deformation of an image due to diffraction may be reduced, and thus the quality of an image obtained by the camera module CMM (refer to FIG. 2A) may be improved.

The sixth insulating layer 60 may be formed (or, provided) by removing a portion of a preliminary organic layer 60-P in the thickness direction in the transmissive region TP. In FIG. 7A, the preliminary organic layer 60-P is illustrated by a dotted line, and a removed portion 60-del is represented by dark hatching. A half-tone mask may be used to form the sixth insulating layer 60 from the preliminary organic layer 60-P.

The first thickness TK1 of the sixth insulating layer 60 in the transmissive region TP may be smaller than the second thickness TK2 of the sixth insulating layer 60 in the element region EP. For example, the first thickness TK1 may be a minimum thickness or an average thickness of the sixth insulating layer 60 in the transmissive region TP, and the second thickness TK2 may be a maximum thickness or an average thickness of the sixth insulating layer 60 in the element region EP. The first thickness TK1 may be about 40% or more of the second thickness TK2 and less than about 100% of the second thickness TK2. As the difference between the first thickness TK1 and the second thickness TK2 is increased, the step of the upper surface of the sixth insulating layer 60 may be increased. Hence, in a process of patterning a conductive layer closest to the transmissive region TP, the conductive layer may be patterned (or, removed) by more than a designed value. For example, a probability that a line (or, wiring) becomes thin may be increased, and therefore a probability of a defect may also be increased. In the case in which the first thickness TK1 is about 40% or more of the second thickness TK2 as in the embodiment of the disclosure, the probability of the defect may be decreased. Accordingly, the first thickness TK1 may be about 40% or more of the second thickness TK2. Thus, the transmittance of the transmissive region TP may be improved, and a side effect thereof may be minimized.

For example, in case that the second thickness TK2 is about 15,000 angstroms, the first thickness TK1 may be about 6,000 angstroms or more and about 10,000 angstroms or less. In case that the first thickness TK1 exceeds about 10,000 angstroms, an effect of transmittance improvement may be reduced. Accordingly, the first thickness TK1 may be determined within the range from about 40% of the second thickness TK2 to about 10,000 angstroms.

A barrier wall SW may be disposed on the sixth insulating layer 60. The barrier wall SW may be simultaneously formed through the same process as that of the sixth insulating layer 60 and may be formed on the upper surface of the sixth insulating layer 60 after the sixth insulating layer 60 is formed.

The barrier wall SW may be disposed in the element region EP. For example, in the element region EP, the barrier wall SW may be disposed in a region adjacent to the transmissive region TP. Furthermore, the barrier wall SW may be disposed in a region overlapping the first lower light blocking layer BML1.

The seventh insulating layer 70 may be disposed on the sixth insulating layer 60 and may cover the second connecting electrode CNE20. The seventh insulating layer 70 may be referred to as the second organic layer. The seventh insulating layer 70 may be in direct contact with the barrier wall SW. A side surface 70*s* of the seventh insulating layer 70 may be in direct contact with a side surface SWs of the barrier wall SW. Accordingly, due to the barrier wall SW, a material for forming the seventh insulating layer 70 may not flow down into the transmissive region TP. Thus, the flatness of an upper surface 70*u* of the seventh insulating layer 70 may be improved.

The eighth insulating layer 80 may be disposed on the seventh insulating layer 70. The eighth insulating layer 80 may be referred to as the third organic layer. The eighth insulating layer 80 may be spaced apart from the barrier wall SW. A side surface 80*s* of the eighth insulating layer 80 and the side surface SWs of the barrier wall SW may be spaced apart from each other while facing each other. Accordingly, a portion of the seventh insulating layer 70 may be exposed between the side surface 80*s* of the eighth insulating layer 80 and the side surface SWs of the barrier wall SW. Furthermore, as the flatness of the seventh insulating layer 70 is improved, the flatness of the eighth insulating layer 80 disposed on the seventh insulating layer 70 may also be improved.

The height HT1 of the barrier wall SW may be greater than the thickness HT2 of the seventh insulating layer 70. Furthermore, the height HT1 of the barrier wall SW may be greater than a sum of the thickness HT2 of the seventh insulating layer 70 and the thickness HT3 of the eighth insulating layer 80. As the height HT1 of the barrier wall SW is increased, an effect of blocking the material for forming the seventh insulating layer 70 and a material for forming the eighth insulating layer 80 flowing toward the transmissive region TP in a process of forming the seventh insulating layer 70 and the eighth insulating layer 80 may be further improved.

Each of the barrier wall SW, the sixth insulating layer 60, the seventh insulating layer 70, and the eighth insulating layer 80 may be an organic layer. For example, each of the sixth insulating layer 60, the seventh insulating layer 70, and the eighth insulating layer 80 may include a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vynyl alcohol-based polymer, or a blend thereof.

Referring to FIGS. 7A, 7B, and 7C, the element layer 140 that includes the first to third light emitting elements ED1, ED2, and ED3 and the copy light emitting element EDcp may be disposed on the circuit layer 130. Each of the first and second light emitting elements ED1 and ED2 may include a pixel electrode AE (or, an anode), a first functional layer HFL, an emissive layer EL, a second functional layer EFL, and the common electrode CE (or, the cathode). Each of the third light emitting element ED3 and the copy light emitting element EDcp may include a third pixel electrode AE3, the first functional layer HFL, an emissive layer EL, the second functional layer EFL, and the common electrode CE (or, the cathode). The first functional layer HFL, the second functional layer EFL, and the common electrode CE may be commonly provided for the pixels PX (refer to FIG. 4).

The pixel electrode AE and the third pixel electrode AE3 may be disposed on the eighth insulating layer 80. The pixel electrode AE and the third pixel electrode AE3 may be electrically connected to the second connecting electrode CNE20 through a third contact hole CH3 penetrating the seventh insulating layer 70 and the eighth insulating layer 80. The pixel electrode AE and the third pixel electrode AE3 may be semi-transmissive electrodes, transmissive electrodes, or reflective electrodes. In an embodiment, the pixel electrode AE and the third pixel electrode AE3 may include a reflective layer formed of silver, magnesium, aluminum, platinum, palladium, gold, nickel, neodymium, iridium, chromium, or a compound thereof and a transparent or translucent electrode layer formed on the reflective layer. The transparent or translucent electrode layer may include at least one selected from the group consisting of indium tin oxide, indium zinc oxide, indium gallium zinc oxide, zinc oxide, indium oxide and aluminum-doped zinc oxide. For example, the pixel electrode AE and the third pixel electrode AE3 may include a multi-layer structure in which indium tin oxide, silver, and indium tin oxide may be sequentially stacked each other.

The third pixel electrode AE3 may include the main pixel electrode AEm, the connecting electrode AEcn, and a copy pixel electrode AEcp. The main pixel electrode AEm may be included in the third light emitting element ED3, and the copy pixel electrode AEcp may be included in the copy light emitting element EDcp. The connecting electrode AEcn may electrically connect the third light emitting element ED3 and the copy light emitting element EDcp.

The pixel defining pattern PDL1 and the pixel defining layer PDL2 may be disposed on the eighth insulating layer 80. The pixel defining pattern PDL1 and the pixel defining layer PDL2 may have a property of absorbing light. For example, the pixel defining pattern PDL1 and the pixel defining layer PDL2 may be black. The pixel defining pattern PDL1 and the pixel defining layer PDL2 may include a black coloring agent. The black coloring agent may include a black dye or a black pigment. The black coloring agent may include carbon black, metal such as chromium, or oxide thereof.

Each of the pixel defining pattern PDL1 and the pixel defining layer PDL2 may have an opening PDLop defined therein for exposing a portion of the pixel electrode AE or the third pixel electrode AE3. For example, each of the pixel defining pattern PDL1 and the pixel defining layer PDL2 may cover the periphery of a corresponding pixel electrode AE or the third pixel electrode AE3.

Emissive regions may be defined by the openings PDLop defined in the pixel defining pattern PDL1 and the pixel defining layer PDL2. For example, a first emissive region PXA1 may be defined in the first light emitting element ED1, a second emissive region PXA2 may be defined in the second light emitting element ED2, a third emissive region PXA3 may be defined in the third light emitting element ED3, and a copy emissive region PXC may be defined in the copy light emitting element EDcp. Since the third emissive region PXA3 and the copy emissive region PXC share the third pixel electrode AE3, the third emissive region PXA3 and the copy emissive region PXC may simultaneously emit light.

Referring to FIG. 7A, the pixel defining pattern PDL1 may be disposed on the eighth insulating layer 80 and may extend toward the barrier wall SW. The pixel defining pattern PDL1 may be in (or brought into) direct contact with an upper surface 80*u* of the eighth insulating layer 80, the side surface 80*s* of the eighth insulating layer 80, the upper surface 70*u* of the seventh insulating layer 70, and the side surface SWs of the barrier wall SW. For example, a side surface PDLs of the pixel defining pattern PDL1 may be in direct contact with the side surface SWs of the barrier wall SW. Accordingly, the pixel defining pattern PDL1 may be stably fixed to the seventh insulating layer 70, the eighth insulating layer 80, and the barrier wall SW, and separation of the pixel defining pattern PDL1 from the seventh insulating layer 70 and the eighth insulating layer 80 may be reduced or eliminated.

As the flatness of the seventh insulating layer 70 and the flatness of the eighth insulating layer 80 are improved, the flatness of the pixel defining pattern PDL1 disposed on the seventh insulating layer 70 and the eighth insulating layer 80 may also be improved. Accordingly, separation of the pixel defining pattern PDL1 caused by a decrease in flatness may be reduced or eliminated. Thus, the product reliability of the display panel DP (refer to FIG. 4) may be improved.

Referring to FIGS. 7B and 7C, the first spacer HSPC may be disposed on the pixel defining layer PDL2. The first protruding spacer SPC may be disposed on the first spacer HSPC. The first spacer HSPC and the first protruding spacer SPC may be integral with each other and may be formed of a same material. For example, the first spacer HSPC and the first protruding spacer SPC may be formed through the same process by a half-tone mask. However, this is illustrative, and the disclosure is not limited thereto. For example, the first spacer HSPC and the first protruding spacer SPC may include different materials and may be formed by separate processes.

The second spacer UHSPC described with reference to FIG. 6 may have substantially the same thickness as the first spacer HSPC, and the second protruding spacer USPC described with reference to FIG. 6 may have substantially the same thickness as the first protruding spacer SPC. Furthermore, the schematic cross-sectional shapes of the second spacer UHSPC and the second protruding spacer USPC may be similar to the schematic cross-sectional shapes of the first spacer HSPC and the first protruding spacer SPC illustrated in FIG. 7B.

The first functional layer HFL may be disposed on the pixel electrode AE, the pixel defining film PDL (e.g., refer to FIG. 6), the first spacer HSPC, and the first protruding spacer SPC. The first functional layer HFL may include a hole transport layer (HTL), may include a hole injection layer (HIL), or may include both the hole transport layer and the hole injection layer. The first functional layer HFL may be provided in all of the first region A1, the second region A2, and the intermediate region AM.

The emissive layer EL may be disposed on the first functional layer HFL and may be disposed in a region corresponding to the opening PDLop of the pixel defining film PDL. The emissive layer EL may include an organic material, an inorganic material, or an organic-inorganic material that emits light having a predetermined or selectable color. The emissive layer EL may be disposed in the first region A1, the second region A2, and the intermediate region AM. The emissive layer EL disposed in the first region A1 may be disposed in a region spaced apart from the transmissive region TP, for example, the element region EP.

The second functional layer EFL may be disposed on the first functional layer HFL and may cover the emissive layer EL. The second functional layer EFL may include an electron transport layer (ETL), may include an electron injection layer (EIL), or may include both the electron transport layer and the electron injection layer. The second functional layer EFL may be disposed in all of the first region A1, the second region A2, and the intermediate region AM.

The common electrode CE may be disposed on the second functional layer EFL. The common electrode CE may be disposed in the first region A1, the second region A2, and the intermediate region AM. The electrode opening CEop overlapping the first opening BMop may be defined in the common electrode CE. The electrode opening CEop may have a larger minimum width than the first opening BMop of the first lower light blocking layer BML1.

The element layer 140 may further include the capping layer CPL disposed on the common electrode CE. The capping layer CPL may serve to improve light emission efficiency by the principle of constructive interference. The capping layer CPL may include, for example, a material having a refractive index of 1.6 or more for light having a wavelength of 589 nm. The capping layer CPL may be an organic capping layer including an organic material, an inorganic capping layer including an inorganic material, or a composite capping layer including an organic material and an inorganic material. For example, the capping layer CPL may include a carbocyclic compound, a heterocyclic compound, an amine group-containing compound, a porphine derivative, a phthalocyanine derivative, a naphthalocyanine derivative, an alkali metal complex, an alkaline earth metal complex, or a combination thereof. A substituent including O, N, S, Se, Si, F, Cl, Br, I, or a combination thereof may be selectively substituted for the carbocyclic compound, the heterocyclic compound, and the amine group-containing compound.

A portion of the capping layer CPL that overlaps the electrode opening CEop of the common electrode CE may be removed. As a portion of the capping layer CPL that includes a portion overlapping the transmissive region TP and a portion of the common electrode CE are removed, the light transmittance of the transmissive region TP may be further improved.

The encapsulation layer 150 may be disposed on the element layer 140. The encapsulation layer 150 may include an inorganic layer 151, an organic layer 152, and an inorganic layer 153 sequentially stacked each other. However, layers constituting the encapsulation layer 150 are not limited thereto.

The inorganic layers 151 and 153 may protect the element layer 140 from moisture and oxygen, and the organic layer 152 may protect the element layer 140 from foreign matter such as dust particles. The inorganic layers 151 and 153 may include a silicon nitride layer, a silicon oxy-nitride layer, a silicon oxide layer, a titanium oxide layer, or an aluminum oxide layer. The organic layer 152 may include, but is not limited to, an acrylate-based organic layer.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be directly disposed on the display layer 100. The sensor base layer 210 may be an inorganic layer including at least one of silicon nitride, silicon oxy-nitride, and silicon oxide. In other embodiments, the sensor base layer 210 may be an organic layer including an epoxy resin, an acrylic resin, or an imide-based resin. The sensor base layer 210 may have a single-layer structure, or may have a multi-layer structure stacked in the third direction DR3.

Each of the first sensor conductive layer 220 and the second sensor conductive layer 240 may have a single-layer structure, or may have a multi-layer structure stacked in the third direction DR3.

The conductive layer having the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide, indium zinc oxide, zinc oxide, or indium zinc tin oxide. The transparent conductive layer may include a conductive polymer such as PEDOT, a metal nano wire, or graphene.

The conductive layer having the multi-layer structure may include metal layers. The metal layers may have, for example, a three-layer structure of titanium/aluminum/titanium. The conductive layer having the multi-layer structure may include at least one metal layer and at least one transparent conductive layer.

The sensor insulating layer 230 may be disposed between the first sensor conductive layer 220 and the second sensor conductive layer 240. The sensor insulating layer 230 may include an inorganic film. The inorganic film may include at least one of aluminum oxide, titanium oxide, silicon oxide, silicon nitride, silicon oxy-nitride, zirconium oxide, and hafnium oxide.

In other embodiments, the sensor insulating layer 230 may include an organic film. The organic film may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The sensor cover layer 250 may be disposed on the sensor insulating layer 230 and may cover the second sensor conductive layer 240. The second sensor conductive layer 240 may include a conductive pattern 240P (refer to FIG. 13A). The sensor cover layer 250 may cover the conductive pattern 240P and may reduce or eliminate a probability of damage to the conductive pattern 240P in a subsequent process.

The sensor cover layer 250 may include an inorganic material. For example, the sensor cover layer 250 may include silicon nitride, but is not limited thereto.

The anti-reflection layer 300 may be disposed on the sensor layer 200. The anti-reflection layer 300 may include a dividing layer 310, color filters 320, and a planarization layer 330. The dividing layer 310 and the color filters 320 may not be disposed in the transmissive region TP of the first region A1.

The dividing layer 310 may be disposed to overlap the conductive pattern 240P (refer to FIG. 13A) of the second sensor conductive layer 240. The sensor cover layer 250 may be disposed between the dividing layer 310 and the second sensor conductive layer 240. The dividing layer 310 may prevent reflection of external light by the second sensor conductive layer 240. The material of the dividing layer 310 is not limited as long as it is a material capable of absorbing light. The dividing layer 310 may be a layer having a black color. In an embodiment, the dividing layer 310 may include a black coloring agent. The black coloring agent may include a black dye or a black pigment. The black coloring agent may include carbon black, metal such as chromium, or oxide thereof.

Figure 12:
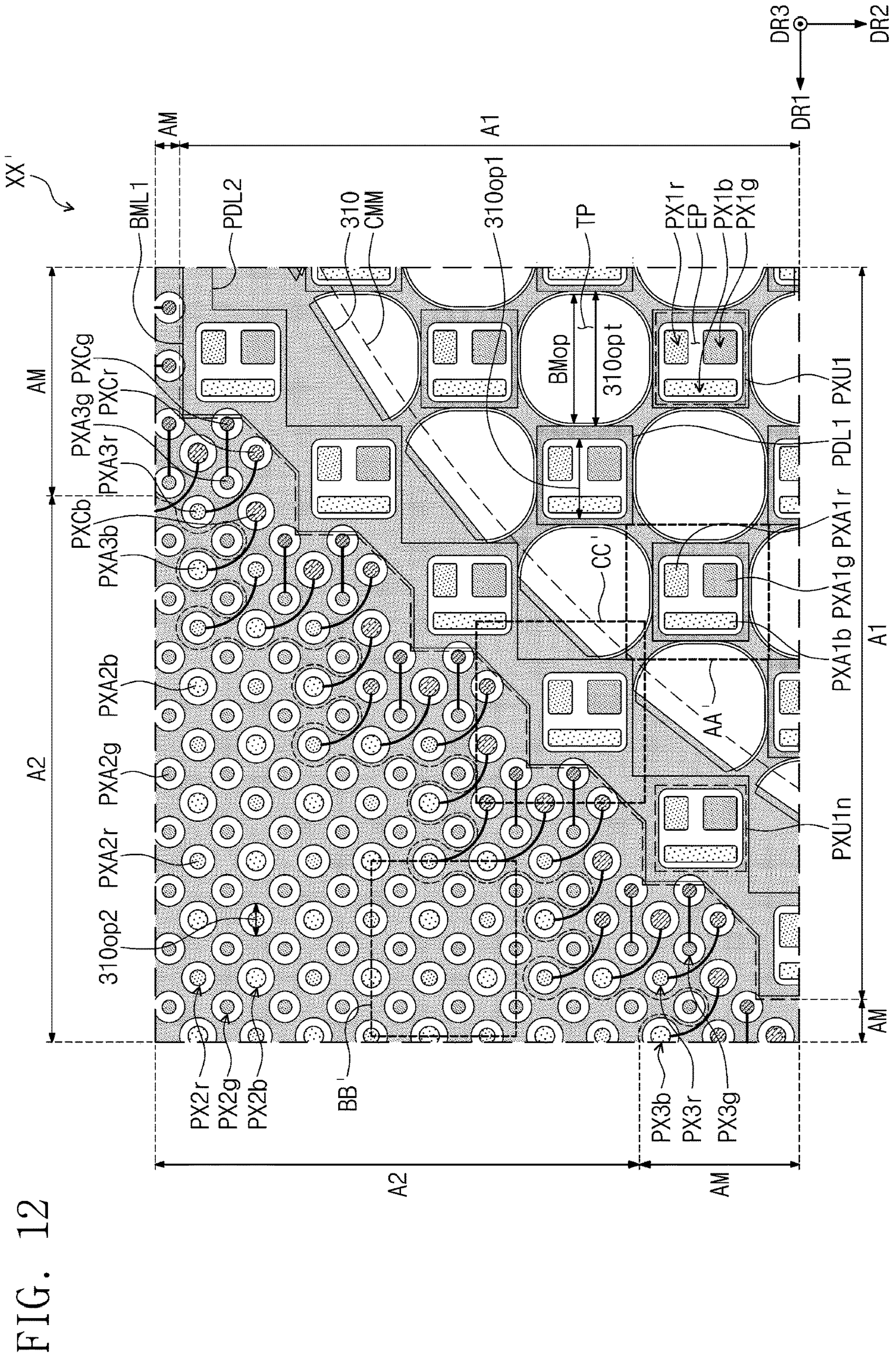
FIG. 12 is an enlarged plan view of a partial region of the display panel according to an embodiment of the disclosure.

The dividing layer 310 may have dividing openings 310*op*1 and 310*op*2 and a transmission opening 310*opt* defined therein. The dividing openings 310*op*1 and 310*op*2 may overlap the emissive layers EL, respectively. For reference, the shape of the dividing layer 310 in a plan view is illustrated in FIG. 12. The color filters 320 may be disposed to correspond to the dividing openings 310*op*1 and 310*op*2.

The color filters 320 may transmit light provided from the emissive layers EL overlapping the color filters 320.

The transmission opening 310*opt* of the dividing layer 310 may overlap the first opening BMop of the first lower light blocking layer BML1. A minimum width of the transmission opening 310*opt* of the dividing layer 310 may be substantially the same as a minimum width of the first opening BMop of the first lower light blocking layer BML1. For example, in a region adjacent to the transmissive region TP, an end of the dividing layer 310 may be substantially aligned with an end of the first lower light blocking layer BML1. The expression "components are substantially aligned with each other or have substantially the same width" used herein means not only that the components are completely aligned with each other or the widths of the components are physically equal to each other, but also that despite the same design, the components may be identical within an error range occurring in a process.

In a region adjacent to the transmissive region TP, an end of the dividing layer 310 may protrude further toward the transmissive region TP than an end of the pixel defining film PDL and an end of the common electrode CE.

The planarization layer 330 may cover the dividing layer 310 and the color filters 320. The planarization layer 330 may include an organic material and may provide a flat surface on an upper surface of the planarization layer 330. In an embodiment, the planarization layer 330 may be omitted.

In an embodiment of the disclosure, the anti-reflection layer 300 may include a reflection control layer instead of the color filters 320. For example, in FIGS. 7A, 7B, and 7C, the color filters 320 may be omitted, and the reflection control layer may be added to the places where the color filters 320 are omitted. The reflection control layer may selectively absorb light in a partial band of light reflected inside the display panel and/or the electronic device or light in a partial band of light incident from outside the display panel and/or the electronic device.

For example, the reflection control layer may absorb light in a first wavelength region of about 490 nm to about 505 nm and a second wavelength region of about 585 nm to about 600 nm, so that the light transmittance in the first wavelength region and the second wavelength region may be about 40% or less. The reflection control layer may absorb light outside the wavelength ranges of red light, green light, and blue light emitted from the emissive layers EL. Since the reflection control layer absorbs light outside the wavelength ranges of the red light, the green light, and the blue light emitted from the emissive layers EL as described above, a decrease in the luminance of the display panel and/or the electronic device may be prevented or minimized. Deterioration in the light emission efficiency of the display panel and/or the electronic device also may be prevented or minimized, and visibility may be improved.

The reflection control layer may be implemented with an organic layer including a dye, a pigment, or a combination thereof. The reflection control layer may include a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diammonium-based compound, a dipyrromethene-based compound, a cyanine-based compound, and a combination thereof.

In an embodiment, the reflection control layer may have a transmittance of about 64% to about 72%. The transmittance of the reflection control layer may be adjusted depending on the content of the pigment and/or dye included in the reflection control layer. The reflection control layer may overlap the emissive regions in a plan view, but may not overlap the transmissive region TP in a plan view.

Figure 8A:
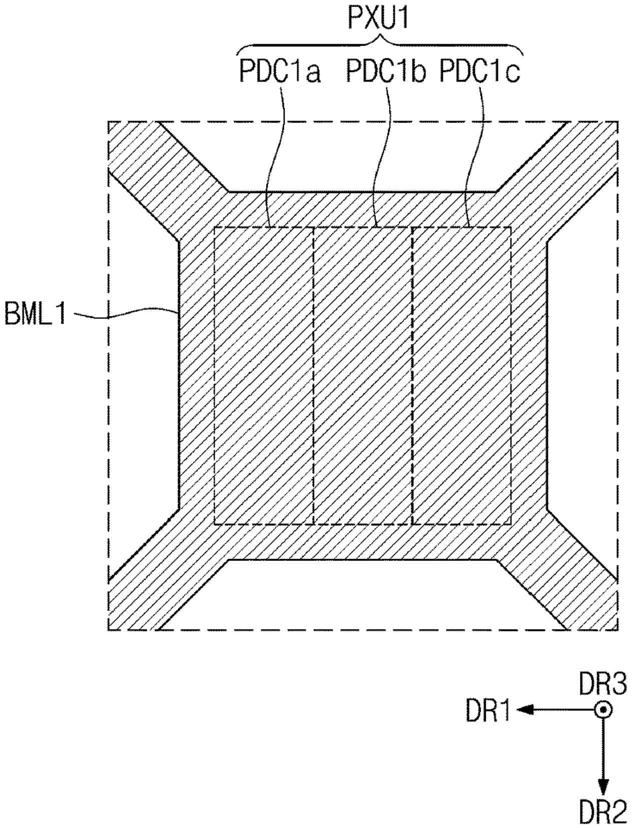
FIG. 8A is a plan view illustrating a portion of a first lower light blocking layer according to an embodiment of the disclosure.
Figure 8B:
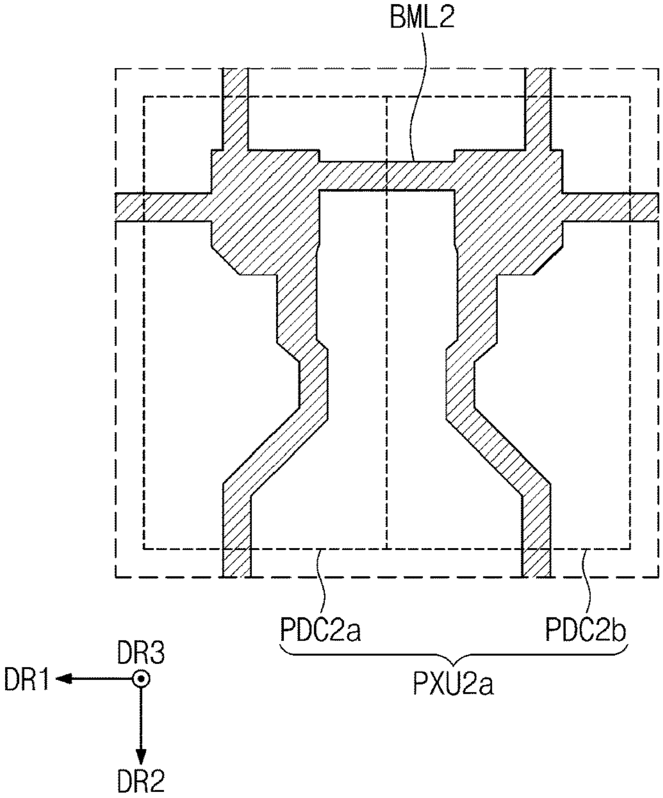
FIG. 8B is a plan view illustrating a portion of a second lower light blocking layer according to an embodiment of the disclosure.

FIG. 8A is a plan view illustrating a portion of the first lower light blocking layer BML1 according to an embodiment of the disclosure. FIG. 8B is a plan view illustrating a portion of the second lower light blocking layer BML2 according to an embodiment of the disclosure.

The first pixel unit PXU1 overlapping the first lower light blocking layer BML1 is illustrated by a dotted line in FIG. 8A, and the first sub-pixel unit PXU2*a* overlapping the second lower light blocking layer BML2 is illustrated by a dotted line in FIG. 8B. An arrangement relationship between the second sub-pixel unit PXU2*b* (refer to FIG. 6) and the second lower light blocking layer BML2 has substantially the same structure as an arrangement relationship between the first sub-pixel unit PXU2*a* and the second lower light blocking layer BML2, and therefore description thereabout will be omitted.

The first pixel unit PXU1 may include three first pixel circuits PDC1*a*, PDC1*b*, and PDC1*c*. The first sub-pixel unit PXU2*a* may include two second pixel circuits PDC2*a* and PDC2*b*. Dotted regions illustrated in FIGS. 8A and 8B may correspond to regions in which the three first pixel circuits PDC1*a*, PDC1*b*, and PDC1*c* and the two second pixel circuits PDC2*a* and PDC2*b* are disposed.

Referring to FIGS. 8A and 8B, the first lower light blocking layer BML1 and the second lower light blocking layer BML2 may be disposed on (or in) a same layer and may be simultaneously formed through the same process. As a result, in comparison to a process of forming first and second lower light blocking layers on (or in) different layers, a process of forming the first and second lower light blocking layers BML1 and BML2 according to an embodiment may omit a mask process once. Accordingly, a manufacturing process of the display panel DP (refer to FIG. 7A) may be simplified, and thus manufacturing costs of the display panel DP may be reduced.

The first lower light blocking layer BML1 and the second lower light blocking layer BML2 may be disposed between the fourth sub-barrier layer 124 and the fifth sub-barrier layer 125 illustrated in FIGS. 7A, 7B, and 7C.

The first lower light blocking layer BML1 and the second lower light blocking layer BML2 may be electrically insulated from each other. A constant voltage having a predetermined or selectable voltage level may be provided to the first lower light blocking layer BML1, and a power voltage provided to the second pixel circuit PDC2*a* or PDC2*b* may be provided to the second lower light blocking layer BML2. For example, the first drive voltage ELVDD (refer to FIG. 5) may be provided to the second lower light blocking layer BML2.

The first lower light blocking layer BML1 may overlap the entire region in which the first pixel unit PXU1 is disposed. Accordingly, the first lower light blocking layer BML1 may overlap the first pixels PX1*r*, PX1*g*, and PX1*b* (refer to FIG. 6) included in the first pixel unit PXU1. In the first region A1, the first lower light blocking layer BML1 may overlap all of the first type transistors that are included in the first pixels PX1*r*, PX1*g*, and PX1*b*, respectively. Thus, the voltage provided to the first lower light blocking layer BML1 may be provided irrespective of operations of the first pixels PX1*r*, PX1*g*, and PX1*b*.

The second lower light blocking layer BML2 may overlap a portion of the region in which the first sub-pixel unit PXU2*a* is disposed. For example, the first sub-pixel unit PXU2*a* may include the color pixel 2-2 PX2*g* (refer to FIG. 6) and the color pixel 2-3 PX2*b* (refer to FIG. 6). In the second region A2, the second lower light blocking layer BML2 may overlap a part of the second type transistors that are included in the color pixel 2-2 PX2*g* and the color pixel 2-3 PX2*b*, respectively. For example, the second lower light blocking layer BML2 may overlap the first transistor T1 (refer to FIG. 5). Accordingly, the voltage provided to the second lower light blocking layer BML2 may be provided in synchronization with operations of the color pixel 2-2 PX2*g* and the color pixel 2-3 PX2*b*.

Each of the first lower light blocking layer BML1 and the second lower light blocking layer BML2 may have a single-layer structure or a multi-layer structure including multiple layers. For example, each of the first lower light blocking layer BML1 and the second lower light blocking layer BML2 may have a multi-layer structure in which titanium and molybdenum may be sequentially stacked each other. A passage may be provided by cracks in the first to fourth sub-barrier layers 121, 122, 123, and 124 (refer to FIG. 7A) and particles between the first to fourth sub-barrier layers 121, 122, 123, and 124 (refer to FIG. 7A). Hence, hydrogen may be introduced through the passage, and the lower layers including titanium may serve to adsorb the hydrogen. Accordingly, a probability of a defect in a transistor caused by hydrogen may be reduced. In an embodiment of the disclosure, copper may be substituted for molybdenum. In other embodiments, each of the first lower light blocking layer BML1 and the second lower light blocking layer BML2 may include molybdenum or copper, but is not limited thereto.

Figure 9A:
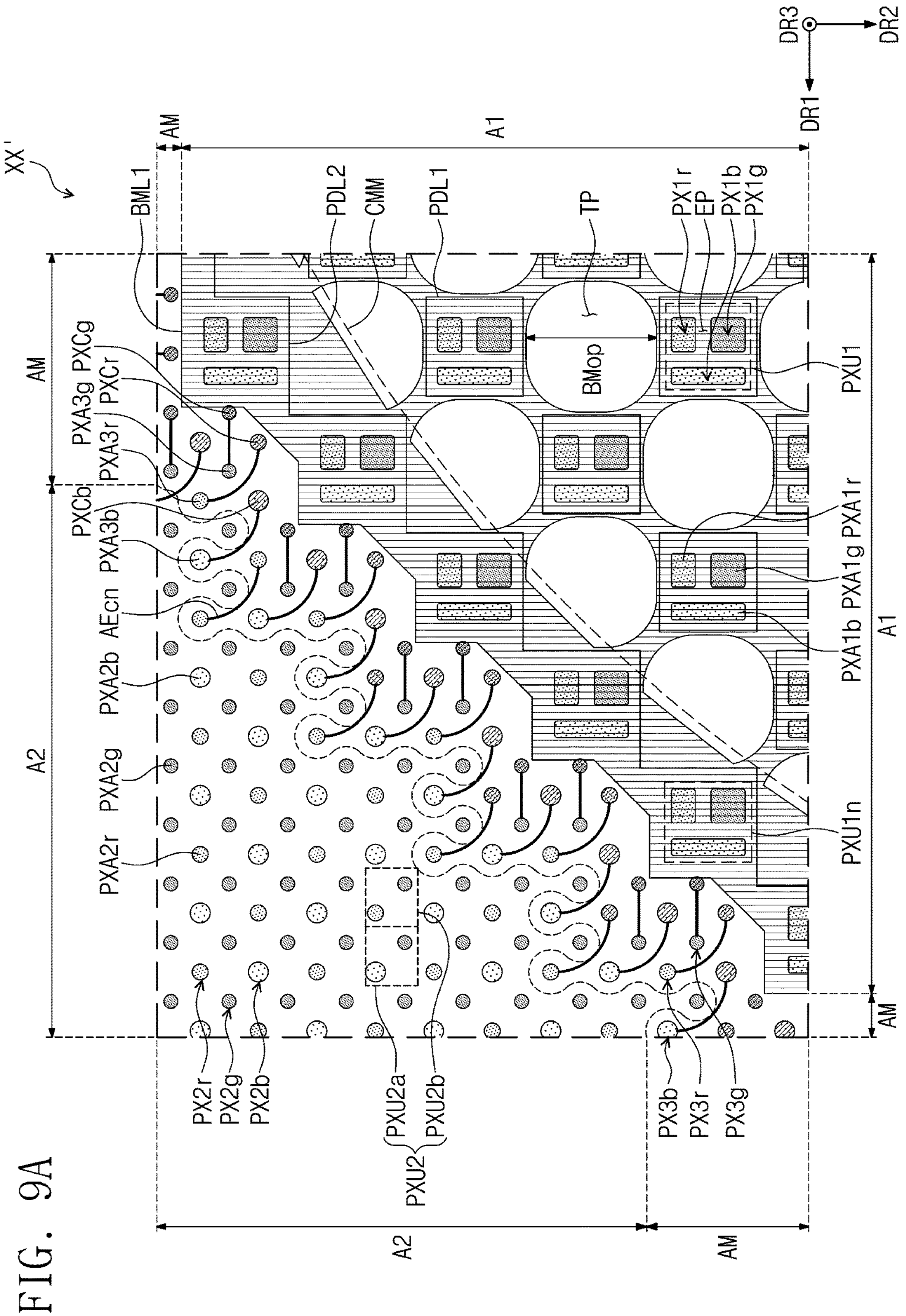
FIG. 9A is an enlarged plan view of a partial region of the display panel according to an embodiment of the disclosure.
Figure 9B:
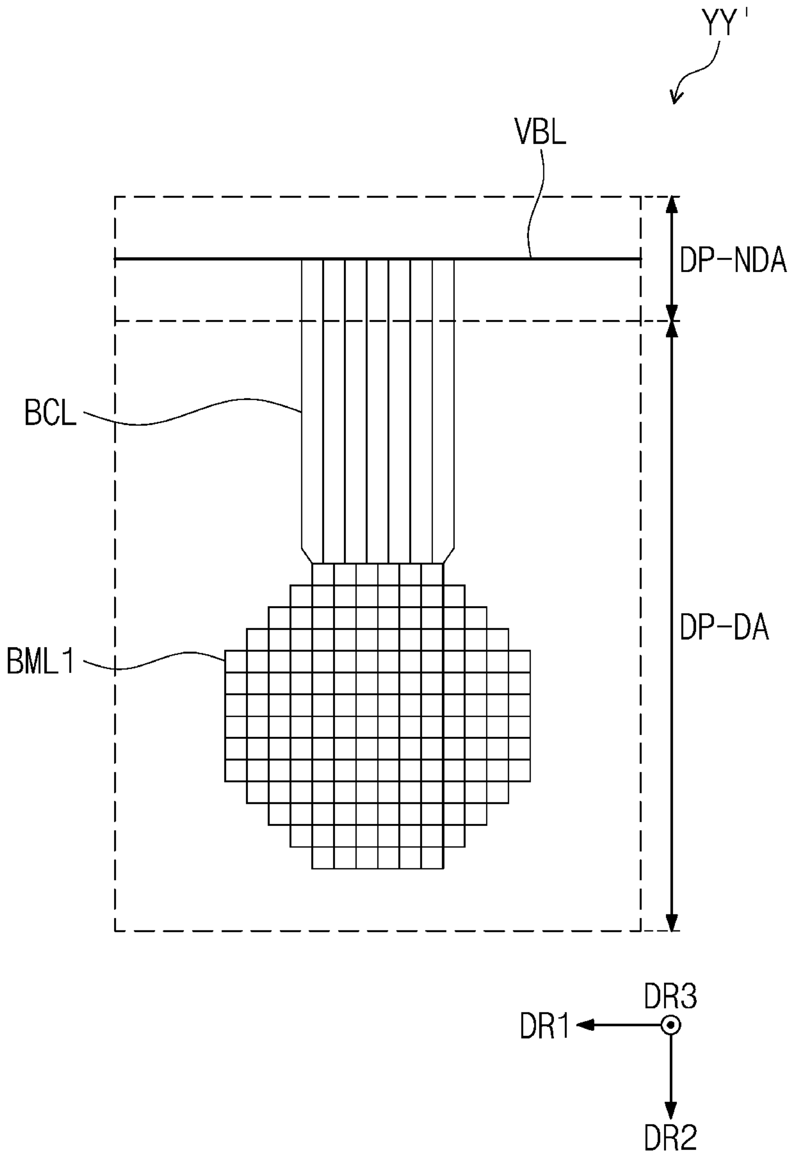
FIG. 9B is an enlarged plan view of a partial region of the display panel according to an embodiment of the disclosure.

FIG. 9A is an enlarged plan view of a partial region of the display panel according to an embodiment of the disclosure. FIG. 9B is an enlarged plan view of a partial region of the display panel according to an embodiment of the disclosure. FIG. 9A is an enlarged plan view illustrating region XX' illustrated in FIG. 4. FIG. 9B is an enlarged plan view illustrating region YY' illustrated in FIG. 4.

Referring to FIGS. 9A and 9B, the first lower light blocking layer BML1 may be disposed in the first region A1. The display panel DP (refer to FIG. 4) may further include a first light blocking voltage line VBL and a second light blocking voltage line BCL. The first light blocking voltage line VBL and the second light blocking voltage line BCL may be electrically connected with the first lower light blocking layer BML1 and may transfer a constant voltage having a predetermined or selectable voltage level to the first lower light blocking layer BML1.

For example, the first light blocking voltage line VBL may be disposed in the non-display region DP-NDA and may surround at least a portion of the display region DP-DA. Pads may be electrically connected to one end and an opposite end of the first light blocking voltage line VBL, and a constant voltage may be provided through the pads.

The second light blocking voltage line BCL may extend from the first light blocking voltage line VBL and may be electrically connected to the first lower light blocking layer BML1 via the display region DP-DA. Multiple second light blocking voltage lines BCL may be provided. Although FIG. 9B illustrates one example that eight second light blocking voltage lines BCL are provided, the number of second light blocking voltage lines BCL may be less than eight (8) or may exceed eight (8).

The camera module CMM overlapping the first region A1 is illustrated in FIG. 9A. A dotted line indicated as the camera module CMM may correspond to a light receiving portion or a lens of the camera module CMM that receives a light.

The camera modules CMM may overlap a portion of the first region A1. For example, the camera module CMM may overlap the transmissive regions TP and the element regions EP in which the first pixel unit PXU1 is disposed. The camera module CMM may not overlap the adjacent pixel unit PXU1*n*. Furthermore, the camera module CMM may not overlap the intermediate region AM and the second region A2. Accordingly, the camera module CMM may not overlap the second pixels PX2*r*, PX2*g*, and PX2*b* and the third pixels PX3*r*, PX3*g*, and PX3*b*.

Figure 10A:
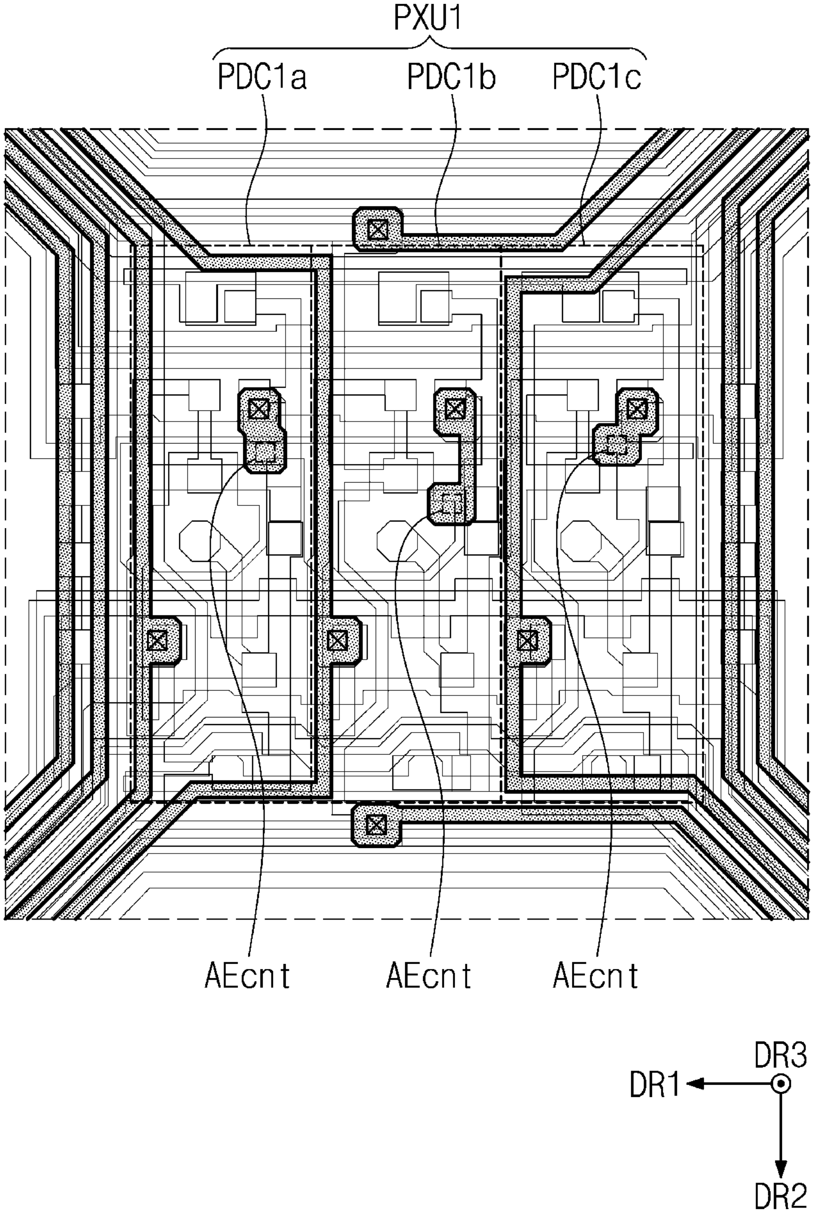
FIG. 10A is a plan view illustrating pixel circuits disposed in the first region according to an embodiment of the disclosure.
Figure 10B:
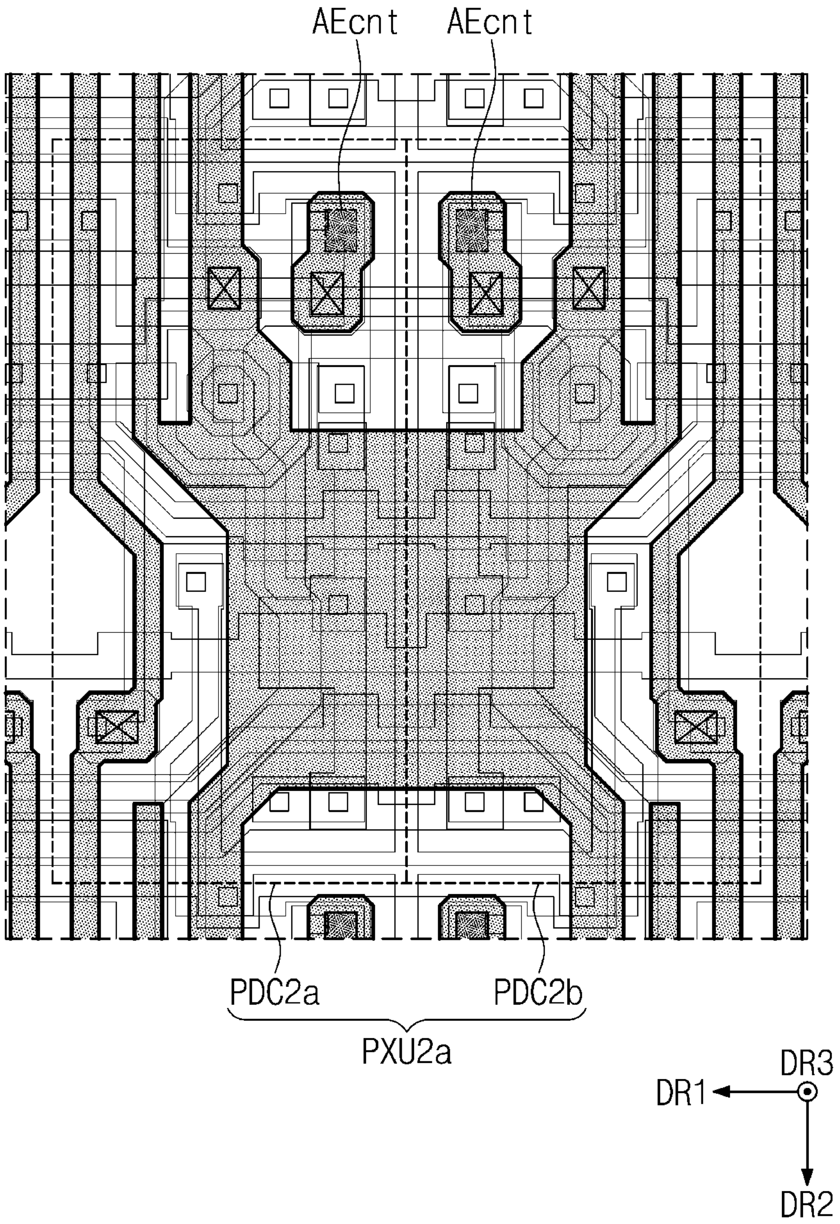
FIG. 10B is a plan view illustrating pixel circuits disposed in the second region according to an embodiment of the disclosure.

FIG. 10A is a plan view illustrating pixel circuits disposed in the first region according to an embodiment of the disclosure. FIG. 10B is a plan view illustrating pixel circuits disposed in the second region according to an embodiment of the disclosure.

Referring to FIGS. 10A and 10B, each of the first pixel circuits PDC1*a*, PDC1*b*, and PDC1*c* and the second pixel circuits PDC2*a* and PDC2*b* may be implemented by conductive layers and semiconductor layers. Patterns included in a conductive layer disposed between the sixth insulating layer 60 (refer to FIG. 7B) and the seventh insulating layer 70 (refer to FIG. 7B) are shaded in FIGS. 10A and 10B. Pixel electrode contacts AEcnt may be portions with which first to third pixel electrodes AE1, AE2, and AE3 (refer to FIG. 11) to be described below are electrically in contact.

The third pixel circuit PDC3 (refer to FIG. 7C) having substantially the same layout as the second pixel circuit PDC2*a* or PDC2*b* may be disposed under the third light emitting element ED3 (refer to FIG. 7C). Due to space limitation, a structure such as the second pixel circuit PDC2*a* or PDC2*b* or the third pixel circuit PDC3 may not be not able to be disposed in the region in which the copy light emitting element EDcp (refer to FIG. 7C) is disposed. Accordingly, the copy light emitting element EDcp may be driven together with the third light emitting element ED3 while sharing the third pixel circuit PDC3 (refer to FIG. 7C).

Figure 11:
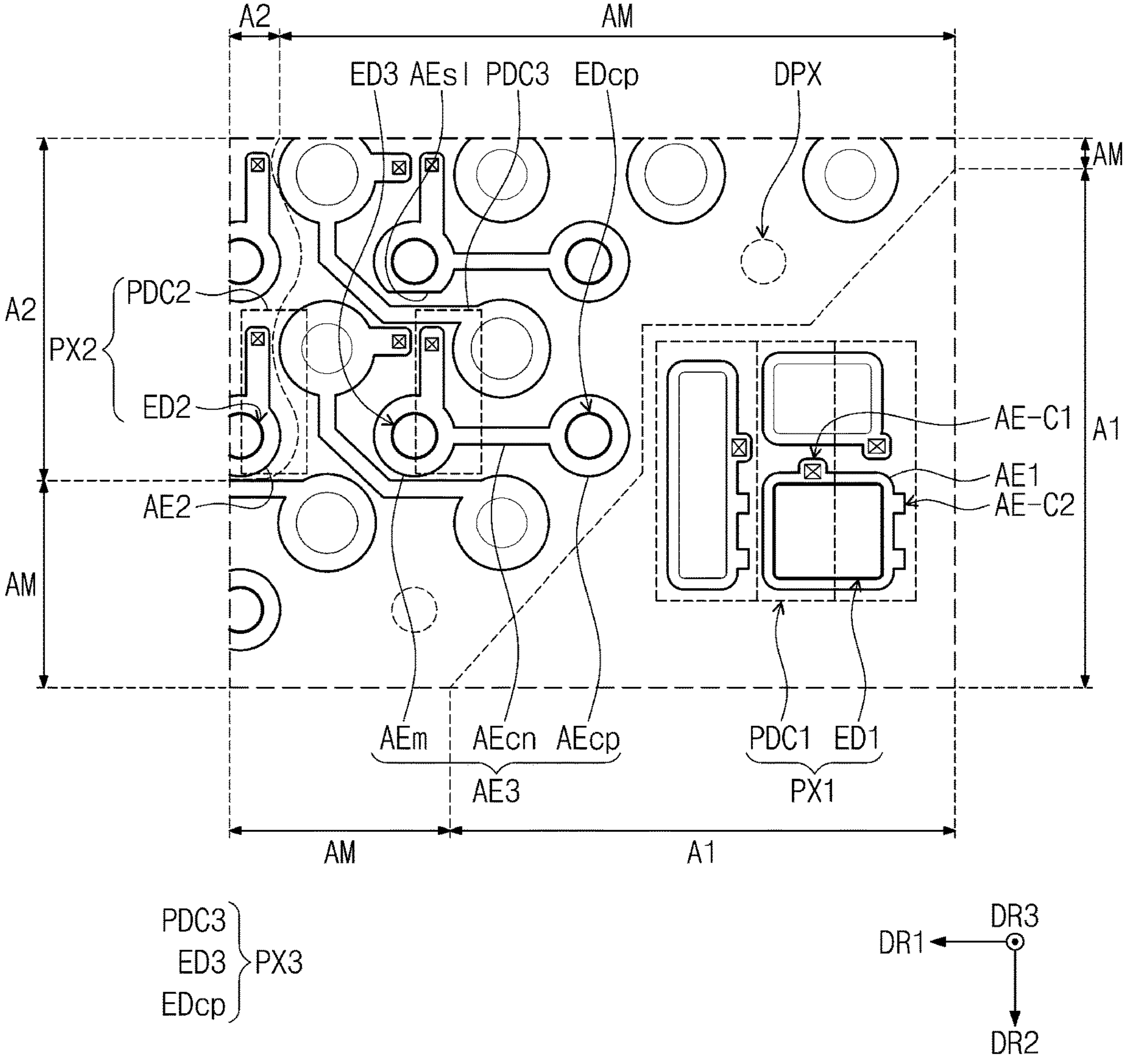
FIG. 11 is an enlarged plan view of a partial region of the display panel according to an embodiment of the disclosure.

FIG. 11 is an enlarged plan view of a partial region of the display panel according to an embodiment of the disclosure.

Referring to FIG. 11, the first pixel electrode AE1 may be disposed in the first region A1, the second pixel electrode AE2 may be disposed in the second region A2, and the third pixel electrode AE3 may be disposed in the intermediate region AM. The first pixel electrode AE1, the second pixel electrode AE2, and the third pixel electrode AE3 may include metal, alloy, conductive metal oxide, or a transparent conductive material. The first pixel electrode AE1, the second pixel electrode AE2, and the third pixel electrode AE3 may have a multi-layer structure in which indium tin oxide, silver, and indium tin oxide may be sequentially stacked each other, but is not limited thereto.

The first pixel PX1 disposed in the first region A1 may include the first pixel circuit PDC1 and the first light emitting element ED1. The first pixel electrode AE1 may be included in the first light emitting element ED1. The first pixel electrode AE1 may be electrically connected to the first pixel circuit PDC1. For example, the first pixel electrode AE1 may be electrically connected to the pixel electrode contact AEcnt illustrated in FIG. 10A.

The second pixel PX2 disposed in the second region A2 may include the second pixel circuit PDC2 and the second light emitting element ED2. The second pixel electrode AE2 may be included in the second light emitting element ED2.

The second pixel electrode AE2 may be electrically connected to the second pixel circuit PDC2. For example, the second pixel electrode AE2 may be electrically connected to the pixel electrode contact AEcnt illustrated in FIG. 10B. The third pixel electrode AE3 may be electrically connected to the third pixel circuit PDC3. The third pixel circuit PDC3 may have substantially the same layout as one of the second pixel circuits PDC2*a* and PDC2*b* illustrated in FIG. 10B.

The third pixel PX3 disposed in the intermediate region AM may include the third pixel circuit PDC3, the third light emitting element ED3, and the copy light emitting element EDcp. The copy light emitting element EDcp may be closer to the first light emitting element ED1 than to the third light emitting element ED3. Due to space limitation, the third pixel circuit PDC3 may not be disposed under the copy light emitting element EDcp. Accordingly, the copy light emitting element EDcp may not overlap the first lower light blocking layer BML1 (refer to FIG. 8A) and the second lower light blocking layer BML2 (refer to FIG. 8B).

The third pixel electrode AE3 may be included in the third light emitting element ED3 and the copy light emitting element EDcp. The third pixel electrode AE3 may include the main pixel electrode AEm, the connecting electrode AEcn, and the copy pixel electrode AEcp. The main pixel electrode AEm may be included in the third light emitting element ED3, and the copy pixel electrode AEcp may be included in the copy light emitting element EDcp. The connecting electrode AEcn may electrically connect the third light emitting element ED3 and the copy light emitting element EDcp.

The main pixel electrode AEm, the connecting electrode AEcn, and the copy pixel electrode AEcp may be disposed on (or in) a same layer and may include a same material. Furthermore, the main pixel electrode AEm, the connecting electrode AEcn, and the copy pixel electrode AEcp may be simultaneously formed by the same process. The main pixel electrode AEm may be directly electrically connected with the third pixel circuit PDC3, and the copy pixel electrode AEcp may be electrically connected with the third pixel circuit PDC3 through the connecting electrode AEcn and the main pixel electrode AEm.

A part of the main pixel electrodes AEm may include a straight edge AEs1 to secure a region through which the connecting electrode AEcn passes. The straight edge AEs1 may be provided at a portion facing the connecting electrode AEcn.

The first pixel electrode AE1 may include a first protrusion AE-C1 and a second protrusion AE-C2. The first protrusion AE-C1 may be a portion electrically connected with the pixel electrode contact AEcnt illustrated in FIG. 10A and may overlap a contact hole. The second protrusion AE-C2 may be a portion that extends to overlap the second semiconductor pattern including the active region AC2 (refer to FIG. 7A) of the oxide thin film transistor O-TFT (refer to FIG. 7A). Accordingly, light toward a lower surface of the second semiconductor pattern may be blocked by the first lower light blocking layer BML1 (refer to FIG. 8A), and light toward an upper surface of the second semiconductor pattern may be blocked by the first pixel electrode AE1.

A dummy pixel DPX may be disposed in the intermediate region AM. The dummy pixel DPX may be a pixel that does not emit light and may be referred to as a defective pixel or a missing pixel. For example, the dummy pixel DPX may not include the pixel circuit PDC (refer to FIG. 5) and the pixel electrode AE (refer to FIG. 7B) and may include the emissive layer EL (refer to FIG. 7B). In an embodiment, the dummy pixel DPX may further include the first functional layer HFL (refer to FIG. 7B), the second functional layer EFL (refer to FIG. 7B), and the common electrode CE (refer to FIG. 7B). The dummy pixel DPX may overlap a dummy dividing opening defined in the dividing layer 310 (refer to FIG. 7B). However, this is merely illustrative, and the dummy dividing opening may not be defined in the region in which the dummy pixel DPX is disposed. In other embodiments, a dummy pixel defining opening may be defined in the pixel defining layer PDL2 (refer to FIG. 6) to correspond to the region in which the dummy pixel DPX is disposed.

FIG. 12 is an enlarged plan view of a partial region of the display panel according to an embodiment of the disclosure. FIG. 12 is an enlarged plan view illustrating region XX' illustrated in FIG. 4.

Referring to FIGS. 7A, 7B, and 12, the dividing openings 310*op* 1 and 310*op*2 and the transmission opening 310*opt* may be defined in the dividing layer 310. The dividing openings 310*op*1 and 310*op*2 may include the first dividing opening 310*op*1 defined in the first region A1 and the second dividing opening 310*op*2 defined in the second region A2 and the intermediate region AM. The transmission opening 310*opt* may be defined in the first region A1.

In the first region A1, one first dividing opening 310*op*1 may overlap one first pixel unit PXU1. Accordingly, the one first dividing opening 310*op*1 may overlap the first emissive regions PXA1*r*, PXA1*g*, and PXA1*b*.

The dividing layer 310 does not exist between the first emissive regions PXA1*r*, PXA1*g*, and PXA1*b* adjacent to each other in the first region A1. Accordingly, a portion of the relatively thin and long dividing layer 310 does not need to be formed in a narrow region between the first emissive regions PXA1*r*, PXA1*g*, and PXA1*b*. Thus, the difficulty level of a process of forming the dividing layer 310 may be lowered. Furthermore, since a portion of the dividing layer 310 may not be disposed between the first emissive regions PXA1*r*, PXA1*g*, and PXA1*b*, the degree to which a luminance ratio or white angular dependency (WAD) characteristics are changed may be reduced even though a viewing angle is increased. For example, the luminance ratio or the WAD characteristics may be improved in the first region A1.

In the second region A2 and the intermediate region AM, one second dividing opening 310*op*2 may overlap one emissive region among the second emissive regions PXA2*r*, PXA2*g*, and PXA2*b*, the third emissive regions PXA3*r*, PXA3*g*, and PXA3*b* (which may refer to the emissive region 3-1 PXA3*r*, the emissive region 3-2 PXA3*g*, and the emissive region 3-3 PXA3*b* herein), and the copy emissive regions PXCr, PXCg, and PXCb (which may refer to the copy emissive region 3-1 PXCr, the copy emissive region 3-2 PXCg, and the copy emissive region 3-3 PXCb herein). In the second region A2 and the intermediate region AM, a portion of the dividing layer 310 exists between the second emissive regions PXA2*r*, PXA2*g*, and PXA2*b*, the third emissive regions PXA3*r*, PXA3*g*, and PXA3*b*, and the copy emissive regions PXCr, PXCg, and PXCb.

The transmission opening 310*opt* may overlap the first opening BMop of the first lower light blocking layer BML1. The transmission opening 310*opt* may have substantially the same size as the first opening BMop of the first lower light blocking layer BML1.

Figure 13A:
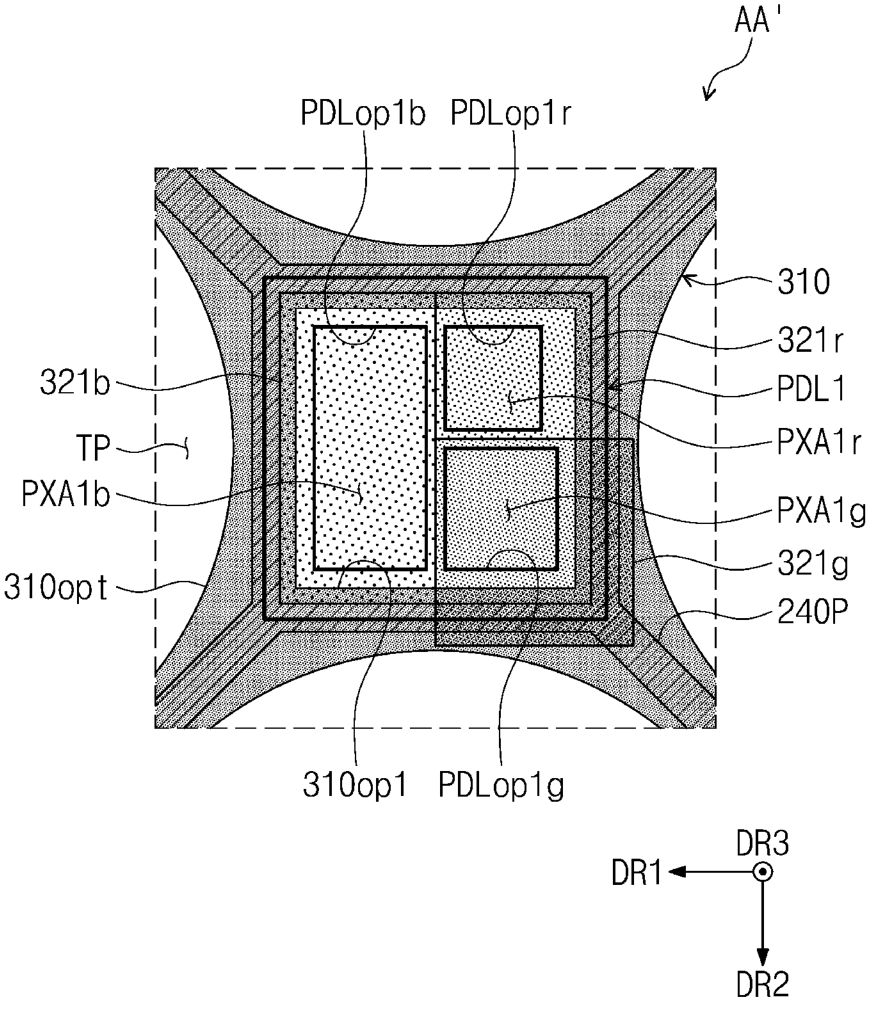
FIG. 13A is an enlarged plan view of a partial region of the display panel according to an embodiment of the disclosure.

FIG. 13A is an enlarged plan view of a partial region of the display panel according to an embodiment of the disclosure. FIG. 13A is an enlarged plan view illustrating region AA' illustrated in FIG. 12.

Referring to FIGS. 7A and 13A, the color filters 320 may include a first color filter 321*r*, a second color filter 321*g*, and a third color filter 321*b* that may be disposed in the first region A1. The first, second, and third color filters 321*r*, 321*g*, and 321*b* may overlap the first dividing opening 310*op*1 of the dividing layer 310.

A first opening PDLop1*r*, a second opening PDLop1*g*, and a third opening PDLop1*b* may be defined in the pixel defining pattern PDL1. The first opening PDLop1*r*, the second opening PDLop1*g*, and the third opening PDLop1*b* may overlap the first dividing openings 310*op*1 of the dividing layer 310. The first color filter 321*r* may overlap the first opening PDLop1*r*, the second color filter 321*g* may overlap the second opening PDLop1*g*, and the third color filter 321*b* may overlap the third opening PDLop1*b*.

Among the first, second, and third color filters 321*r*, 321*g*, and 321*b*, the second color filter 321*g* may have the largest area, and the first color filter 321*r* may have the smallest area. Accordingly, the second color filter 321*g* may further protrude in a direction away from the third color filter 321*b* than the first color filter 321*r*.

The conductive pattern 240P may be covered by the dividing layer 310. Accordingly, the entire conductive pattern 240P may overlap the dividing layer 310. The dividing layer 310 may prevent reflection of external light by the conductive pattern 240P.

Figure 13B:
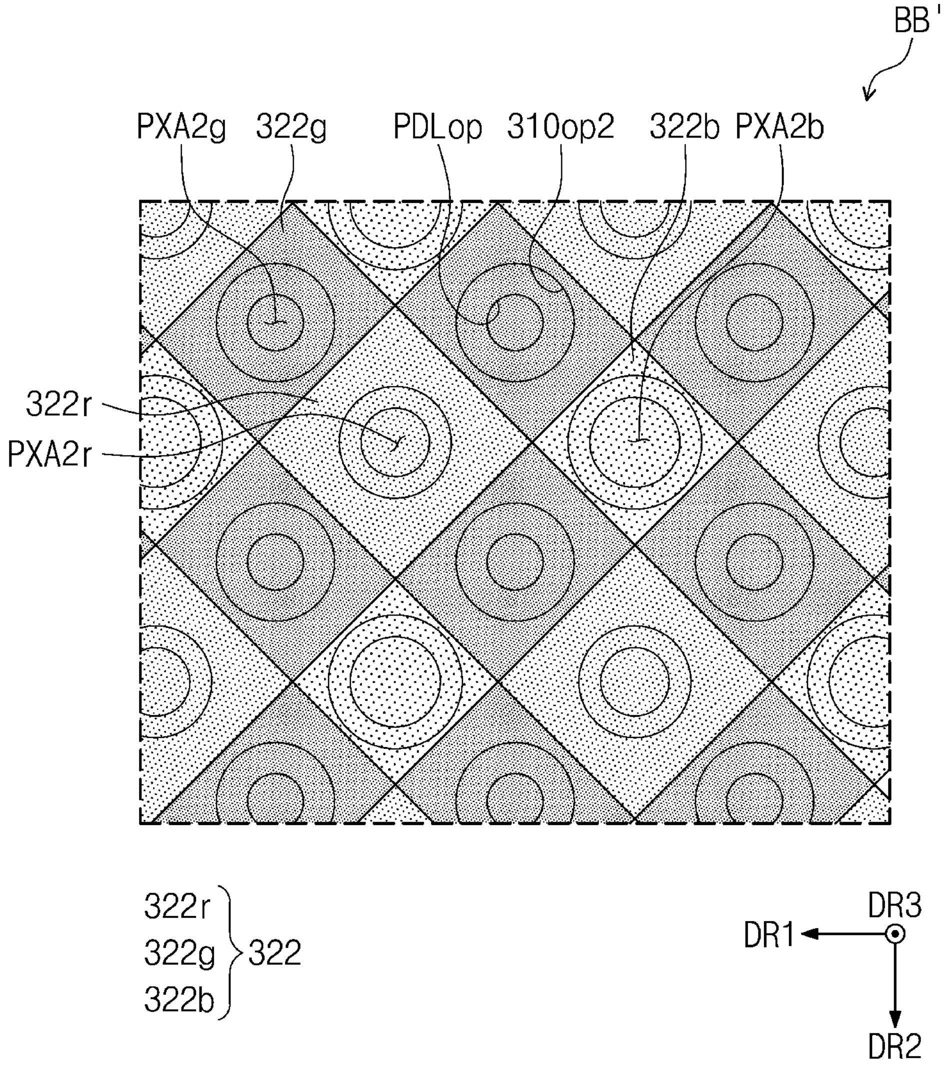
FIG. 13B is an enlarged plan view of a partial region of the display panel according to an embodiment of the disclosure.

FIG. 13B is an enlarged plan view of a partial region of the display panel according to an embodiment of the disclosure. FIG. 13B is an enlarged plan view illustrating region BB' illustrated in FIG. 12.

Referring to FIGS. 7B and 13B, the color filters 322 may include a first color filter 322*r*, a second color filter 322*g*, and a third color filter 322*b* that may be disposed in the second region A2. The first, second, and third color filters 322*r*, 322*g*, and 322*b* may overlap the second dividing opening 310*op*2 of the dividing layer 310 in a one-to-one correspondence.

The shapes of the second dividing openings 310*op*2 may differ from the shapes of the first, second, and third color filters 322*r*, 322*g*, and 322*b*. Furthermore, the shape of the opening PDLop of the pixel defining layer PDL2 may differ from the shapes of the first, second, and third color filters 322*r*, 322*g*, and 322*b*. For example, the opening PDLop may have a circular shape, and the second dividing openings 310*op*2 may have a circular shape in a plan view. One second dividing opening 310*op*2 may have a shape to surround the opening PDLop. The first, second, and third color filters 322*r*, 322*g*, and 322*b* may have a quadrangular shape.

The second emissive regions PXA2*r*, PXA2*g*, and PXA2*b* may include the emissive region 2-1 PXA2*r*, the emissive region 2-2 PXA2*g*, and the emissive region 2-3 PXA2*b*. Among the second emissive regions PXA2*r*, PXA2*g*, and PXA2*b*, the emissive region 2-2 PXA2*g* may have the smallest area, and the emissive region 2-3 PXA2*b* may have the largest area. Among the first, second, and third color filters 322*r*, 322*g*, and 322*b*, the first color filter 322*r* may have the largest area, and the third color filter 322*b* may have the smallest area.

One emissive region 2-1 PXA2*r*, two emissive regions 2-2 PXA2*g*, and one emissive region 2-3 PXA2*b* may constitute one repeat unit. Within the one repeat unit, the area occupied by two second color filters 322*g* may be the largest, the area occupied by one first color filter 322*r* may be the next largest, and the area occupied by one third color filter 322*b* may be the smallest. For example, the ratio of areas occupied by the first color filter 322*r*, the second color filters 322*g*, and the third color filter 322*b* within the repeat unit may be 29:54:17. The areas of the first, second, and third color filters 322*r*, 322*g*, and 322*b* may be determined in consideration of the reflection color of the electronic device EDE (refer to FIG. 1A). Accordingly, the area of an emissive region may not be proportional to the area of a color filter corresponding thereto.

Figure 13C:
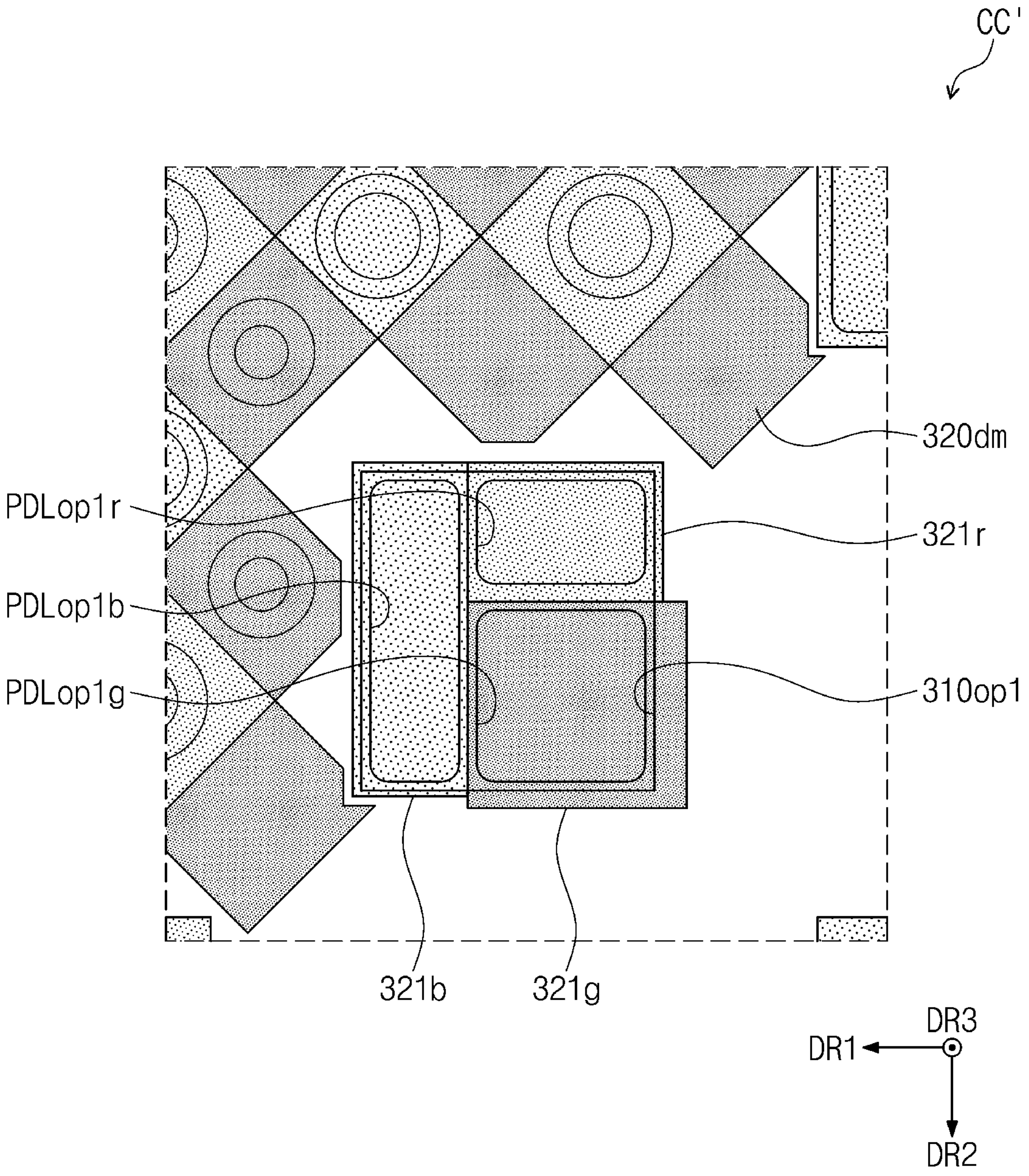
FIG. 13C is an enlarged plan view of a partial region of the display panel according to an embodiment of the disclosure.

FIG. 13C is an enlarged plan view of a partial region of the display panel according to an embodiment of the disclosure. FIG. 13C is an enlarged plan view illustrating region CC' illustrated in FIG. 12.

Referring to FIGS. 12 and 13C, the color filters 320 (refer to FIG. 7A) may further include dummy color filters 320*dm* that may be disposed at the boundary between the first region A1 and the intermediate region AM or disposed adjacent to the boundary. The dummy color filters 320*dm* may have the same color as the second color filter 321*g*. The dummy color filters 320*dm* may be provided to optimize the reflection color of the electronic device EDE (refer to FIG. 1A). The dummy color filters 320*dm* may be omitted.

Figure 14:
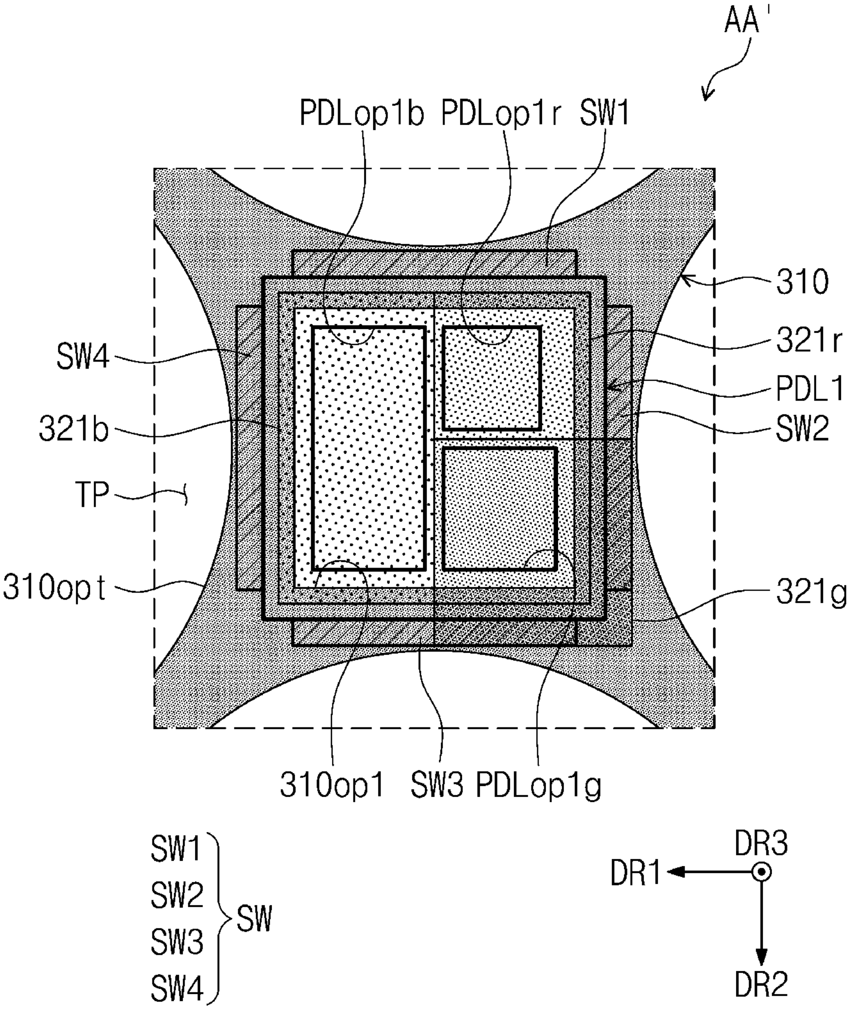
FIG. 14 is an enlarged plan view of a partial region of the display panel according to an embodiment of the disclosure.

FIG. 14 is an enlarged plan view of a partial region of the display panel according to an embodiment of the disclosure.

Referring to FIGS. 7A and 14, the barrier wall SW may include barrier wall portions SW1, SW2, SW3, and SW4 spaced apart from each other as shown in the plan view of FIG. 14. The barrier wall portions SW1, SW2, SW3, and SW4 may be arranged adjacent to the pixel defining pattern PDL1 in the plan view of FIG. 14. The barrier wall portions SW1, SW2, SW3, and SW4 may make direct contact with the pixel defining pattern PDL1.

The barrier wall portions SW1, SW2, SW3, and SW4 may include the first barrier wall portion SW1, the second barrier wall portion SW2, the third barrier wall portion SW3, and the fourth barrier wall portion SW4. The first barrier wall portion SW1 and the third barrier wall portion SW3 may extend in the first direction DR1. The first barrier wall portion SW1 and the third barrier wall portion SW3 may face each other with the pixel defining pattern PDL1 therebetween and may be spaced apart from each other in the second direction DR2. The second barrier wall portion SW2 and the fourth barrier wall portion SW4 may extend in the second direction DR2. The second barrier wall portion SW2 and the fourth barrier wall portion SW4 may face each other with the pixel defining pattern PDL1 therebetween and may be spaced apart from each other in the first direction DR1.

According to an embodiment of the disclosure, a gap exists between the first barrier wall portion SW1 and the second barrier wall portion SW2, between the second barrier wall portion SW2 and the third barrier wall portion SW3, between the third barrier wall portion SW3 and the fourth barrier wall portion SW4, and between the first barrier wall portion SW1 and the fourth barrier wall portion SW4. Accordingly, in case that a planarization process is performed by using reflow characteristics of an organic material forming the organic layer 152, for example, a monomer, reflow of the monomer may be smoothly performed through the gaps.

The side surface PDLs of the pixel defining pattern PDL1 may be in direct contact with the first barrier wall portion SW1, the second barrier wall portion SW2, the third barrier wall portion SW3, and the fourth barrier wall portion SW4. The pixel defining pattern PDL1 may be stably fixed to the seventh insulating layer 70, the eighth insulating layer 80, and the barrier wall SW, and separation of the pixel defining pattern PDL1 from the seventh insulating layer 70 and the eighth insulating layer 80 may be reduced or eliminated.

Due to the first barrier wall portion SW1, the second barrier wall portion SW2, the third barrier wall portion SW3, and the fourth barrier wall portion SW4, the seventh insulating layer 70 may not flow toward the transmissive region TP. Accordingly, the flatness of the seventh insulating layer 70 may be improved. The flatness of the eighth insulating layer 80 may also be improved. As the flatness of the seventh insulating layer 70 and the flatness of the eighth insulating layer 80 are improved, the flatness of the pixel defining pattern PDL1 disposed on the seventh insulating layer 70 and the eighth insulating layer 80 may also be improved. Accordingly, separation of the pixel defining pattern PDL1 caused by a decrease in flatness may be reduced or eliminated. Thus, the product reliability of the display panel DP (refer to FIG. 4) may be improved.

Figure 15:
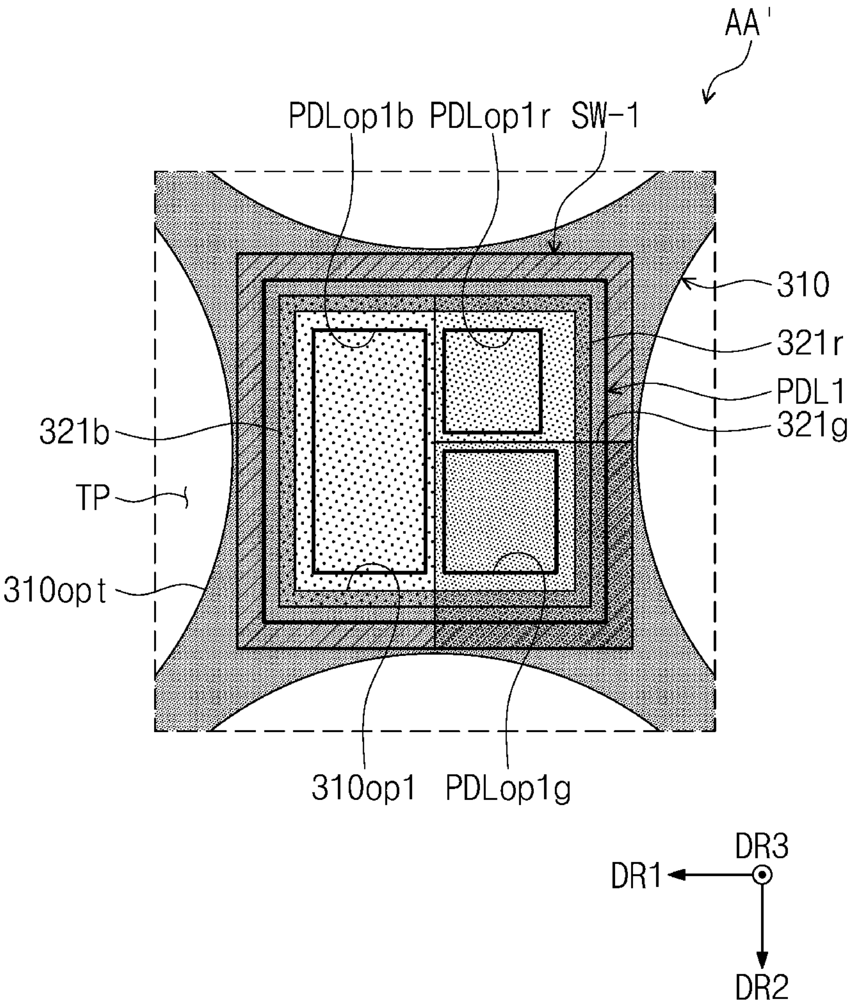
FIG. 15 is an enlarged plan view of a partial region of the display panel according to an embodiment of the disclosure.

FIG. 15 is an enlarged plan view of a partial region of the display panel according to an embodiment of the disclosure.

Referring to FIG. 15, a barrier wall SW-1 may completely surround the pixel defining pattern PDL1. The barrier wall SW-1 may have a ring shape. The entire side surface of the pixel defining pattern PDL1 may make direct contact with the barrier wall SW-1. The pixel defining pattern PDL1 may be stably fixed to the seventh insulating layer 70 (refer to FIG. 7A), the eighth insulating layer 80 (refer to FIG. 7A), and the barrier wall SW-1.

Figure 16:
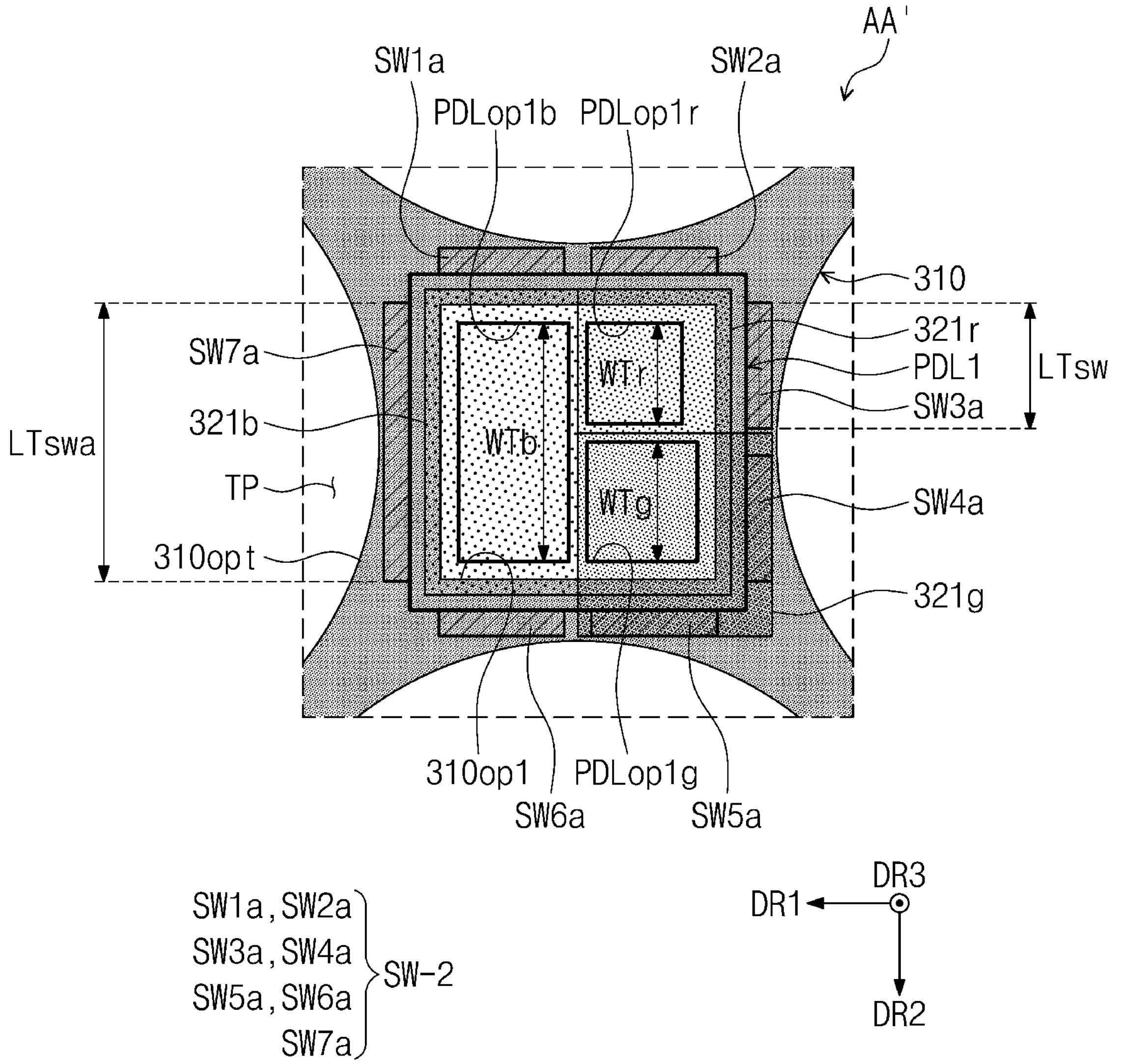
FIG. 16 is an enlarged plan view of a partial region of the display panel according to an embodiment of the disclosure.

FIG. 16 is an enlarged plan view of a partial region of the display panel according to an embodiment of the disclosure.

Referring to FIG. 16, a barrier wall SW-2 may include barrier wall portions SW1*a*, SW2*a*, SW3*a*, SW4*a*, SW5*a*, SW6*a*, and SW7*a* spaced apart from each other. The barrier wall portions SW1*a*, SW2*a*, SW3*a*, SW4*a*, SW5*a*, SW6*a*, and SW7*a* may be arranged adjacent to the pixel defining pattern PDL1. The barrier wall portions SW1*a*, SW2*a*, SW3*a*, SW4*a*, SW5*a*, SW6*a*, and SW7*a* may make direct contact with the pixel defining pattern PDL1.

A gap exists between the barrier wall portions SW1*a*, SW2*a*, SW3*a*, SW4*a*, SW5*a*, SW6*a*, and SW7*a*. The number of gaps between the barrier wall portions SW1*a*, SW2*a*, SW3*a*, SW4*a*, SW5*a*, SW6*a*, and SW7*a* in the embodiment illustrated in FIG. 16 may be larger than that in the embodiment illustrated in FIG. 14. Accordingly, in case that a planarization process is performed by using reflow characteristics of an organic material forming the organic layer 152, for example, a monomer, reflow of the monomer may be smoothly performed through the gaps.

The barrier wall portions SW1*a*, SW2*a*, SW3*a*, SW4*a*, SW5*a*, SW6*a*, and SW7*a* may include the first barrier wall portion SW1*a*, the second barrier wall portion SW2*a*, the third barrier wall portion SW3*a*, the fourth barrier wall portion SW4*a*, the fifth barrier wall portion SW5*a*, the sixth barrier wall portion SW6*a*, and the seventh barrier wall portion SW7*a*.

The first barrier wall portion SW1*a*, the second barrier wall portion SW2*a*, the fifth barrier wall portion SW5*a*, and the sixth barrier wall portion SW6*a* may extend in the first direction DR1. The first barrier wall portion SW1*a* and the second barrier wall portion SW2*a* may be spaced apart from each other in the first direction DR1. The fifth barrier wall portion SW5*a* and the sixth barrier wall portion SW6*a* may be spaced apart from each other in the first direction DR1. The first and second barrier wall portions SW1*a* and SW2*a* and the fifth and sixth barrier wall portions SW5*a* and SW6*a* may be spaced apart from each other in the second direction DR2, and may face each other, with the pixel defining pattern PDL1 therebetween.

The third barrier wall portion SW3*a*, the fourth barrier wall portion SW4*a*, and the seventh barrier wall portion SW7*a* may extend in the second direction DR2. The third barrier wall portion SW3*a* and the fourth barrier wall portion SW4*a* may be spaced apart from each other in the second direction DR2. The third and fourth barrier wall portions SW3*a* and SW4*a* and the seventh barrier wall portion SW7*a* may be spaced apart from each other in the first direction DR1, and may face each other, with the pixel defining pattern PDL1 therebetween.

The length LTswa of the seventh barrier wall portion SW7*a* may be greater than each of the lengths LTsw of the first to sixth barrier wall portions SW1*a*, SW2*a*, SW3*a*, SW4*a*, SW5*a*, and SW6*a*. The first opening PDLop1*r*, the second opening PDLop1*g*, and the third opening PDLop1*b* are defined in the pixel defining pattern PDL1. The first opening PDLop1*r* may be adjacent to the second barrier wall portion SW2*a* and the third barrier wall portion SW3*a*, or may face the second barrier wall portion SW2*a* and the third barrier wall portion SW3*a*. The second opening PDLop1*g* may be adjacent to the fourth barrier wall portion SW4*a* and the fifth barrier wall portion SW5*a*, or may face the fourth barrier wall portion SW4*a* and the fifth barrier wall portion SW5*a*. The third opening PDLop1*b* may be adjacent to the first barrier wall portion SW1*a*, the sixth barrier wall portion SW6*a*, and the seventh barrier wall portion SW7*a*, or may face the first barrier wall portion SW1*a*, the sixth barrier wall portion SW6*a*, and the seventh barrier wall portion SW7*a*.

The width WTb of the third opening PDLop1*b* parallel to the extension direction of the seventh barrier wall portion SW7*a* (e.g., the second direction DR2) may be greater than the width WTr of the first opening PDLop1*r* parallel to the second direction DR2 and the width WTg of the second opening PDLop1*g* parallel to the second direction DR2. For example, the width WTb of the third opening PDLop1*b* parallel to the second direction DR2 may be greater than each of the width WTr of the first opening PDLop1*r* parallel to the second direction DR2 and the width WTg of the second opening PDLop1*g* parallel to the second direction DR2, and/or the width WTb of the third opening PDLop1*b* parallel to the second direction DR2 may be greater than a sum of the width WTr of the first opening PDLop1*r* parallel to the second direction DR2 and the width WTg of the second opening PDLop1*g* parallel to the second direction DR2.

Figure 17:
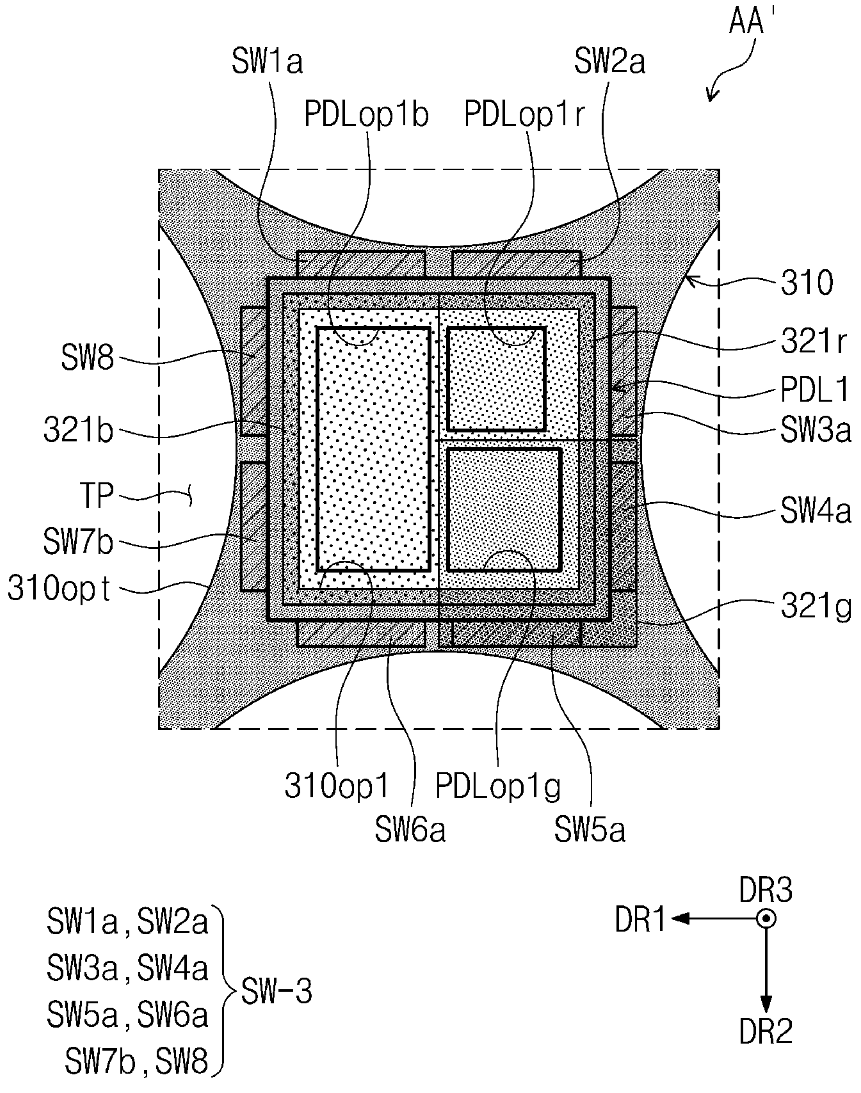
FIG. 17 is an enlarged plan view of a partial region of the display panel according to an embodiment of the disclosure.

FIG. 17 is an enlarged plan view of a partial region of the display panel according to an embodiment of the disclosure. In describing FIG. 17, components identical to the components illustrated in FIG. 16 will be assigned with identical reference numerals, and descriptions thereabout will be omitted.

Referring to FIG. 17, a barrier wall SW-3 may include barrier wall portions SW1*a*, SW2*a*, SW3*a*, SW4*a*, SW5*a*, SW6*a*, SW7*b*, and SW8 spaced apart from each other. A gap exists between the barrier wall portions SW1*a*, SW2*a*, SW3*a*, SW4*a*, SW5*a*, SW6*a*, SW7*b*, and SW8. The number of gaps between the barrier wall portions SW1*a*, SW2*a*, SW3*a*, SW4*a*, SW5*a*, SW6*a*, SW7*b*, and SW8 in the embodiment illustrated in FIG. 17 may be larger than each of those in the embodiments illustrated in FIGS. 14 and 16. Accordingly, in case that a planarization process is performed by using reflow characteristics of an organic material forming the organic layer 152, for example, a monomer, reflow of the monomer may be smoothly performed through the gaps.

The seventh barrier wall portion SW7*b* and the eighth barrier wall portion SW8 may extend in the second direction DR2. The seventh barrier wall portion SW7*b* and the eighth barrier wall portion SW8 may be spaced apart from each other in the second direction DR2. The third and fourth barrier wall portions SW3*a* and SW4*a* and the seventh and eighth barrier wall portions SW7*b* and SW8 may be spaced apart from each other in the first direction DR1, and may face each other, with the pixel defining pattern PDL1 therebetween.

Figure 18:
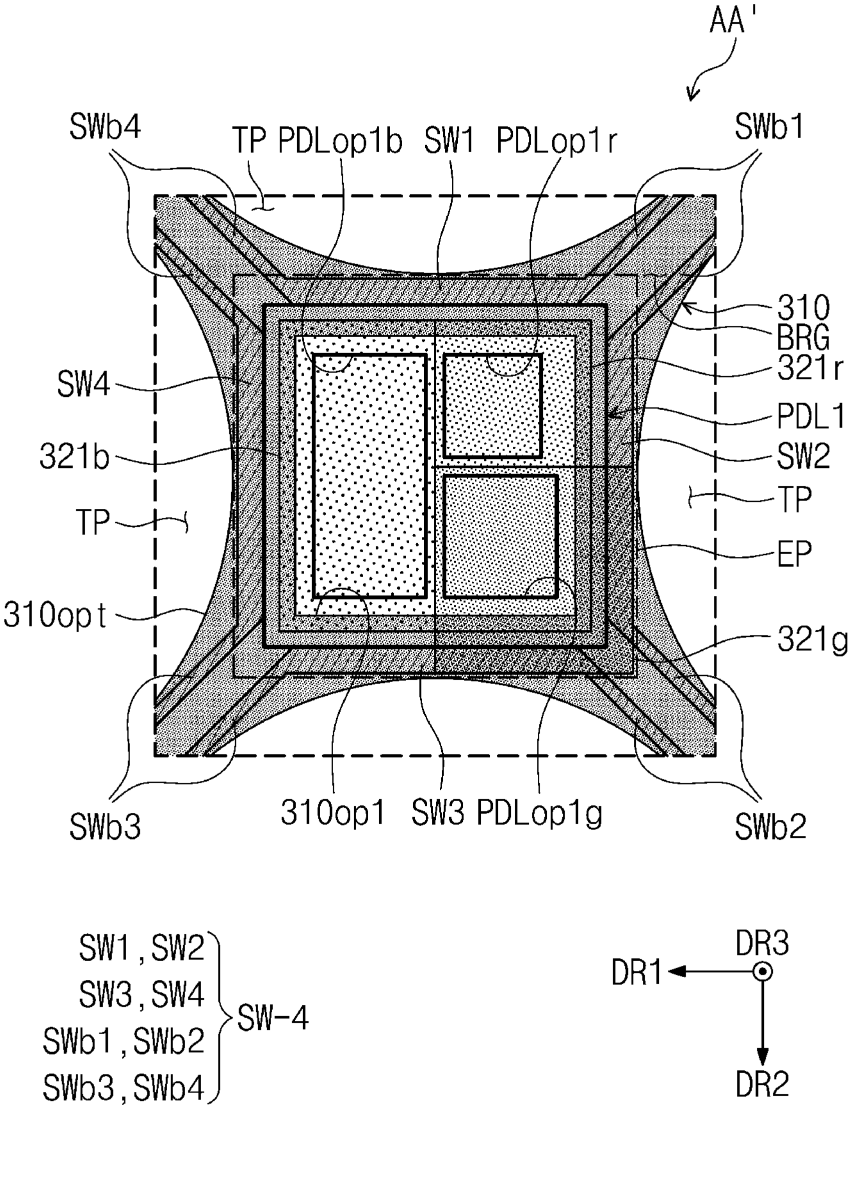
FIG. 18 is an enlarged plan view of a partial region of the display panel according to an embodiment of the disclosure.

FIG. 18 is an enlarged plan view of a partial region of the display panel according to an embodiment of the disclosure. In describing FIG. 18, components identical to the components illustrated in FIG. 14 will be assigned with identical reference numerals, and descriptions thereabout will be omitted.

Referring to FIG. 18, a barrier wall SW-4 may include first to fourth barrier wall portions SW1, SW2, SW3, and SW4, first bridge barrier wall portions SWb1, second bridge barrier wall portions SWb2, third bridge barrier wall portions SWb3, and fourth bridge barrier wall portions SWb4.

The first bridge barrier wall portions SWb1 may extend from the first barrier wall portion SW1 and the second barrier wall portion SW2 in a direction away from the element region EP. The second bridge barrier wall portions SWb2 may extend from the second barrier wall portion SW2 and the third barrier wall portion SW3 in a direction away from the element region EP. The third bridge barrier wall portions SWb3 may extend from the third barrier wall portion SW3 and the fourth barrier wall portion SW4 in a direction away from the element region EP. The fourth bridge barrier wall portions SWb4 may extend from the fourth barrier wall portion SW4 and the first barrier wall portion SW1 in a direction away from the element region EP.

For example, the first region A1 of the display panel DP may further include bridge regions BRG extending from the element region EP. Each of the bridge regions BRG may be defined between the transmissive regions TP. The first to fourth bridge barrier wall portions SWb1, SWb2, SWb3, and SWb4 may be disposed in the bridge regions BRG.

The first to fourth bridge barrier wall portions SWb1, SWb2, SWb3, and SWb4 may serve to prevent the seventh insulating layer 70 (refer to FIG. 7A) and the eighth insulating layer 80 (refer to FIG. 7A) disposed in the bridge regions BRG from flowing toward the transmissive region TP.

The embodiment illustrated in FIG. 18 may be identically applied to the above-described embodiments of FIGS. 14, 15, 16, and 17. For example, each of the barrier walls SW, SW-1, SW-2, and SW-3 described with reference to FIGS. 14 to 17 may further include the first to fourth bridge barrier wall portions SWb1, SWb2, SWb3, and SWb4.

As described above, the pixel defining pattern disposed on the organic layers may be in direct contact with the barrier wall. For example, the side surface of the pixel defining pattern may be in direct contact with the side surface of the barrier wall. Accordingly, the pixel defining pattern may be stably fixed to the organic layers, and separation of the pixel defining pattern from the organic layers may be reduced or eliminated.

The barrier wall may be disposed on the first organic layer, and the side surface of the second organic layer disposed on the first organic layer may be in direct contact with the side surface of the barrier wall. Accordingly, the degree to which a material for forming the second organic layer adjacent to the transmissive region flows down may be reduced. Thus, the flatness of the upper surface of the second organic layer may be improved, and the flatness of the third organic layer disposed on the second organic layer and the flatness of the pixel defining pattern disposed on the third organic layer and the second organic layer may be improved. As a result, separation of the pixel defining pattern caused by a decrease in flatness may be reduced or eliminated.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An electronic device comprising:
- a display panel including a first region and a second region, the second region spaced apart from the first region, the first region including a transmissive region and an element region, wherein
- the display panel includes,
  - a base layer;
  - a circuit layer on the base layer, the circuit layer including a pixel circuit and a barrier wall in the element region;
  - an element layer on the circuit layer, the element layer including a plurality of light emitting elements and a pixel defining film; and
  - an encapsulation layer on the element layer, and
- the pixel defining film includes,
  - a pixel defining pattern in the element region; and
  - a pixel defining layer in the second region, and
  - a side surface of the pixel defining pattern is in contact with a side surface of the barrier wall.

2. The electronic device of claim 1, wherein
- the circuit layer further includes a plurality of organic layers,
- the plurality of organic layers includes a first organic layer in the transmissive region and the element region, and
- the barrier wall is on the first organic layer.

3. The electronic device of claim 2, wherein the plurality of organic layers further includes:
- a second organic layer on the first organic layer; and
- a third organic layer on the second organic layer, and
- the barrier wall is in contact with the second organic layer and is spaced apart from the third organic layer.

4. The electronic device of claim 3, wherein the pixel defining pattern is on the third organic layer and extends toward the barrier wall.

5. The electronic device of claim 3, wherein the pixel defining pattern is in contact with an upper surface of the third organic layer, a side surface of the third organic layer, an upper surface of the second organic layer, and the side surface of the barrier wall.

6. The electronic device of claim 3, wherein a height of the barrier wall is greater than a thickness of the second organic layer.

7. The electronic device of claim 3, wherein a height of the barrier wall is greater than a sum of a thickness of the second organic layer and a thickness of the third organic layer.

8. The electronic device of claim 1, wherein the barrier wall completely surrounds the pixel defining pattern in a plan view.

9. The electronic device of claim 1, wherein in a plan view:
- the barrier wall includes a plurality of barrier wall portions spaced apart from each other, and the plurality of barrier wall portions is arranged adjacent to the pixel defining pattern.

10. The electronic device of claim 9, wherein the plurality of barrier wall portions includes a first barrier wall portion, a second barrier wall portion, a third barrier wall portion, and a fourth barrier wall portion, the first barrier wall portion and the third barrier wall portion face each other with the pixel defining pattern between the first barrier wall portion and the third barrier wall portion, and the second barrier wall portion and the fourth barrier wall portion face each other with the pixel defining pattern between the second barrier wall portion and the fourth barrier wall portion.

11. The electronic device of claim 10, wherein the plurality of barrier wall portions further includes first bridge barrier wall portions, second bridge barrier wall portions, third bridge barrier wall portions, and fourth bridge barrier wall portions, the first bridge barrier wall portions extend from the first barrier wall portion and the second barrier wall portion in a direction away from the element region, the second bridge barrier wall portions extend from the second barrier wall portion and the third barrier wall portion in the direction away from the element region, the third bridge barrier wall portions extend from the third barrier wall portion and the fourth barrier wall portion in the direction away from the element region, and the fourth bridge barrier wall portions extend from the fourth barrier wall portion and the first barrier wall portion in the direction away from the element region.

12. The electronic device of claim 9, wherein the plurality of barrier wall portions includes a first barrier wall portion, a second barrier wall portion, a third barrier wall portion, a fourth barrier wall portion, a fifth barrier wall portion, a sixth barrier wall portion, and a seventh barrier wall portion, the first and second barrier wall portions and the fifth and sixth barrier wall portions face each other with the pixel defining pattern between the first and second barrier wall portions and the fifth and sixth barrier wall portions, and the third and fourth barrier wall portions and the seventh barrier wall portion face each other with the pixel defining pattern between the third and fourth barrier wall portions and the seventh barrier wall portion.

13. The electronic device of claim 12, wherein a length of the seventh barrier wall portion is longer than each of lengths of the first to sixth barrier wall portions.

14. The electronic device of claim 12, wherein a first opening, a second opening, and a third opening are defined in the pixel defining pattern, the first opening is adjacent to the second barrier wall portion and the third barrier wall portion, the second opening is adjacent to the fourth barrier wall portion and the fifth barrier wall portion, and the third opening faces the first barrier wall portion, the sixth barrier wall portion, and the seventh barrier wall portion, and a width of the third opening parallel to an extension direction of the seventh barrier wall portion is greater than a width of the first opening parallel to the extension direction and a width of the second opening parallel to the extension direction.

15. The electronic device of claim 12, wherein the plurality of barrier wall portions further includes an eighth barrier wall portion, and the third and fourth barrier wall portions and the seventh and eighth barrier wall portions face each other with the pixel defining pattern between the third and fourth barrier wall portions and the seventh and eighth barrier wall portions.

16. An electronic device comprising:

a base layer;

a first organic layer on the base layer;

a barrier wall on the first organic layer;

a second organic layer on the first organic layer;

a third organic layer on the second organic layer; and a pixel defining pattern on the third organic layer, the pixel defining pattern extending toward the barrier wall and making contact with the barrier wall, wherein the pixel defining pattern is in contact with an upper surface of the third organic layer, a side surface of the third organic layer, an upper surface of the second organic layer, and a side surface of the barrier wall, and the side surface of the third organic layer is spaced apart from the barrier wall.

17. The electronic device of claim 16, wherein a height of the barrier wall is greater than a thickness of the second organic layer.

18. The electronic device of claim 16, wherein the barrier wall completely surrounds the pixel defining pattern in a plan view.

19. The electronic device of claim 16, wherein in a plan view:

the barrier wall includes a plurality of barrier wall portions spaced apart from each other, and the plurality of barrier wall portions is arranged adjacent to the pixel defining pattern.

20. The electronic device of claim 16, wherein the barrier wall is in contact with the second organic layer.

* * * * *